(12) United States Patent
Nakano et al.

(10) Patent No.: US 11,548,984 B2
(45) Date of Patent: Jan. 10, 2023

(54) LIGHT- OR HEAT-CURING METHOD AND CURABLE RESIN COMPOSITION

(71) Applicant: FUJIFILM Wako Pure Chemical Corporation, Osaka (JP)

(72) Inventors: Tadashi Nakano, Tokyo (JP); Nobuhiko Sakai, Saitama (JP); Kosuke Yanaba, Saitama (JP); Shigeaki Imazeki, Saitama (JP)

(73) Assignee: FUJIFILM Wako Pure Chemical Corporation, Osaka (JP)

( * ) Notice: Subject to any disclaimer, the term of this patent is extended or adjusted under 35 U.S.C. 154(b) by 629 days.

(21) Appl. No.: 16/622,132

(22) PCT Filed: Jun. 12, 2018

(86) PCT No.: PCT/JP2018/022484
§ 371 (c)(1),
(2) Date: Dec. 12, 2019

(87) PCT Pub. No.: WO2018/230580
PCT Pub. Date: Dec. 20, 2018

(65) Prior Publication Data
US 2020/0123324 A1 Apr. 23, 2020

(30) Foreign Application Priority Data
Jun. 12, 2017 (JP) .............................. JP2017-115314

(51) Int. Cl.
| | | |
|---|---|---|
| *C08G 75/045* | (2016.01) | |
| *C08G 79/10* | (2006.01) | |
| *C08L 85/00* | (2006.01) | |
| *C09D 181/02* | (2006.01) | |
| *C09D 185/00* | (2006.01) | |
| *C09K 5/14* | (2006.01) | |
| *G03F 7/004* | (2006.01) | |
| *H05K 1/05* | (2006.01) | |
| *H05K 3/44* | (2006.01) | |

(52) U.S. Cl.
CPC ........... *C08G 75/045* (2013.01); *C08G 79/10* (2013.01); *C08L 85/00* (2013.01); *C09D 181/02* (2013.01); *C09D 185/00* (2013.01); *C09K 5/14* (2013.01); *G03F 7/004* (2013.01); *H05K 1/05* (2013.01); *H05K 3/44* (2013.01)

(58) Field of Classification Search
None
See application file for complete search history.

(56) References Cited

U.S. PATENT DOCUMENTS

| | | | | |
|---|---|---|---|---|
| 2011/0135896 | A1* | 6/2011 | Oh | ................... B32B 17/10917 156/107 |
| 2012/0309885 | A1 | 12/2012 | Hirano | |
| 2015/0355378 | A1 | 12/2015 | Wolter et al. | |
| 2015/0355379 | A1 | 12/2015 | Wolter et al. | |
| 2016/0122292 | A1 | 5/2016 | Sakai et al. | |
| 2016/0342084 | A1 | 11/2016 | Sakai et al. | |
| 2019/0055210 | A1 | 2/2019 | Sakai et al. | |

FOREIGN PATENT DOCUMENTS

| | | |
|---|---|---|
| EP | 3 098 226 | 11/2016 |
| JP | 2000-044640 | 2/2000 |
| JP | 2012-149191 | 8/2012 |
| JP | 2012-251100 | 12/2012 |
| JP | 2013-127022 | 6/2013 |
| JP | 2016-503829 | 2/2016 |
| JP | 2016-511706 | 4/2016 |
| JP | 2016-155896 | 9/2016 |
| WO | 2014/208632 | 12/2014 |
| WO | 2015/076395 | 5/2015 |
| WO | 2015/111640 | 7/2015 |
| WO | 2017/131047 | 8/2017 |

OTHER PUBLICATIONS

International Search Report issued in International Application No. PCT/JP2018/022484, dated Sep. 18, 2019, 10 pages.
Translation of the Written Opinion of the ISA issued in International Application No. PCT/JP2018/022484, dated Sep. 18, 2018, 12 pages.

* cited by examiner

*Primary Examiner* — Christopher M Rodd
(74) *Attorney, Agent, or Firm* — Hamre, Schumann, Mueller & Larson, P.C.

(57) ABSTRACT

An object of the present invention is to provide a light- or heat-curing method by which a cured product (crosslinked product or resin) can be prepared in a simple method even in a case where filler is contained in a large amount; a curable resin composition which is used in the curing method; and the like.

The present invention provides a light- or heat-curing method containing a step 1 of obtaining (E) a condensate having constitutional units of Si—O—Al and/or Si—O—Si, obtained from aluminum derived from an aluminum alkoxide and a silane derived from a silane coupling agent having a mercapto group, from (A) a compound that is formed of a salt of a carboxylic acid and an amine and has a carbonyl group generating a radical and a carboxylate group generating a base through decarboxylation by irradiation with light or heating, the (B) aluminum alkoxide, the (C) silane coupling agent having a mercapto group, and (D) water, and a step 2 of performing a reaction among the (E) condensate, (H) a compound having two or more polymerizable unsaturated groups, and (I) filler under the conditions of irradiation with light or heating in the presence of the (A) compound; a curable resin composition which is used in the curing method; and the like.

20 Claims, No Drawings

LIGHT- OR HEAT-CURING METHOD AND CURABLE RESIN COMPOSITION

TECHNICAL FIELD

The present invention relates to a light- or heat-curing method for obtaining a cured product (crosslinked product or resin) containing filler, a curable resin composition used for the curing method, and the like.

BACKGROUND ART

High-power LED devices which are increasingly demanded in lighting applications, electronic devices typified by PCs and tablet terminals that handle high-speed and high-capacity information, power semiconductors that control electric motors of electric vehicles or hybrid vehicles, and the like have problems with heat generated from elements accompanying by miniaturization, higher performance, and higher density of devices. The heat generated has problems such as a significant impact on performance or lifespan of products. It has become an object to find a method to efficiently radiate heat generated while not sacrificing product performance such as miniaturization, weight reduction, thickness reduction, and the like.

Generally, examples of materials having high thermal conductivity include metals and ceramics. Since a number of metals exhibit conductivity, it is difficult to use them as they are in electronic circuits requiring insulation properties. On the other hand, since the ceramics have high electrical insulation properties and a wide variety of types, various types of performance can be expected to be imparted, but the workability is poor, high-temperature heating is required in a molding treatment, and the productivity is low.

In addition, from the viewpoint that a resin has good workability, it is considered that the resin is used as a heat-radiating material of an electronic circuit, but the resin has lower thermal conductivity and hardly radiates generated heat, as compared with metals or ceramics, and thus, it cannot be used as it is as a heat-radiating material. Therefore, attempts to prepare a thermally conductive resin composition in which thermally conductive filler having high thermal conductivity such as ceramics is filled into a resin have been made.

For example, a resin composition containing 70% or more of filler with respect to a total resin composition so as to improve thermal conductivity has been studied (for example, Patent Literatures 1, 2, 3, and the like). However, since the resin composition has a complicated molecular structure, there is a problem in that multiple synthesis steps are required, long-term and high-temperature heating is required during the curing of the resin composition, and the productivity is low.

Therefore, a curing method for curing a resin composition with light (active energy rays), not by heating, has been studied. The light curing is a method in which various active species such as radicals, acids, and bases are generated from a photoinitiator by irradiating a resin composition with light (active energy rays) while making the photoinitiator coexist in the resin composition, and reactive monomers are quickly cured using the active species.

As a resin composition that generates a radical by irradiation with light in the light-curing resin composition, for example, a resin composition in which thermally conductive filler such as alumina is filled in a (meth)acrylic acid-based polymer is known (for example, Patent Literature 4). However, since most of polymer components of a resin obtained from such a resin composition are (meth)acrylic acid-based polymers, and thus, they have a large curing shrinkage and an insufficient anchoring effect of a hydroxyl group, the adhesiveness to a base material is poor and peeling occurs easily. In particular, in a case where filler that scatters light is present in a large amount in the resin composition, light hardly reaches the deep portion, and therefore, the curing performance is lost, the curing becomes insufficient, and a film is apt to become a brittle film. Accordingly, it is hard to mention that a resin obtained from such a resin composition satisfies the performance as thermally conductive film on a metal substrate.

Among the light-curing resin compositions, a resin composition that generates a strong acid by irradiation with light can realize the curing of a composition having an epoxy-based monomer and the like, which cannot be cured by a radical as a resin raw material. However, since the resin composition generates a strong acid by light irradiation, corrosion easily occurs in a portion in contact with a metal, and thus, it is difficult to apply the resin composition to a thermally conductive resin composition that is considered to be applied to a copper plate or the like.

Among the light-curing resin compositions, as a resin composition that generates a base by irradiation with light, various resin compositions are known, but a method for preparing a silicone-containing resin (crosslinked product) by generating a base and a radical simultaneously by irradiation with light to performing solation-gelation and a thiol-ene reaction simultaneously has been proposed (for example, Patent Literature 5). The present method can make it possible to prepare a composition from low molecular monomers in a build-up method, and thus, it is possible to prepare the composition while adding an additive such as filler before increasing the molecular weight of silicon alkoxide through polycondensation, and it is also possible to enhance adhesiveness to a base material, and the like. However, since the present method requires addition of a certain amount of an organic resin raw material, the upper limit of a filling rate of filler with respect to a total composition is limited, and a thermal conductivity of a resin (crosslinked product) obtained cannot be said to be sufficient in some cases.

Under these circumstances, there is a demand for development of a curing method which is capable of rapidly and efficiently preparing a cured product (crosslinked product or resin) having desired performance even in a system that contains a large amount of filler while neither preparing a polymer with a complicated structure in advance nor performing a complicated operation.

CITATION LIST

Patent Literature

Patent Literature 1: JP2012-149191 A
Patent Literature 2: JP2013-127022 A
Patent Literature 3: JP2012-251100 A
Patent Literature 4: JP2000-044640 A
Patent Literature 5: WO2017/131047 A

SUMMARY OF INVENTION

Technical Problem

The present invention has been made in consideration of the circumstances, and is thus intended to provide a light- or heat-curing method by which a cured product (crosslinked product or resin) having excellent alkali developability, adhesiveness to a base material, organic solvent resistance, and the like, and high strength can be prepared; and a resin composition which is used in the curing method.

In particular, the present invention provides a light- or heat-curing method by which a cured product (crosslinked product or resin) capable of accomplishing a thermal conductivity of 1.0 W/m·K or more, and preferably 3.0 W/m·K or more can be prepared by using thermally conductive (heat-radiating) filler as filler, a resin composition which is used in the curing method; a thermally conductive substrate for forming an electronic circuit, containing a cured product obtained from the resin composition; and the like.

The present inventors have repeatedly conducted extensive studies, and as a result, they have found that various physical properties such as a hardness, adhesiveness to a base material, and a thermal conductivity of a cured product (crosslinked product or resin) obtained, by combining an aluminum alkoxide and a silane coupling agent having a mercapto group as a binder component, are improved. In addition, in general, the aluminum alkoxide is easily subjected to hydrolysis and is readily whitened in air. Therefore, the aluminum alkoxide is rapidly gelated, and thus, uniform mixing with filler becomes difficult, leading to unstable quality. However, a compound that is formed of a salt of a carboxylic acid and an amine and has a carbonyl group generating a radical and having a carboxylate group generating a base through decarboxylation (base-and-radical generator) by irradiation with light or heating has high compatibility with the aluminum alkoxide or the silane coupling agent, and makes it possible for the aluminum alkoxide or the silane coupling agent to be dissolved without a solvent. Therefore, the present inventors have found that the compound makes it possible to mix the filler uniformly therewith and has a chelating ability, and thus, it has a function to suppress the rapid gelation. A significant number of base generators in the related art are oil-soluble, have low affinity with aluminum alkoxide, water, an alcohol, or the like, and do not substantially have a chelating ability. Accordingly, the present inventors have found that it is possible to efficiently perform solation-gelation and a thiol-ene reaction or solation-gelation and a thiol-yne reaction, and prepare a cured product (crosslinked product or resin) having desired performance by combining a base-and-radical generator, an aluminum alkoxide, a silane coupling agent having a mercapto group, and a compound having two or more polymerizable unsaturated groups in a curing system containing filler, thereby leading to completion of the present invention.

In addition, the light- or heat-curing method of an embodiment of the present invention is a light- or heat-curing method in which the compound (base-and-radical generator) has three functions as a base generator, a radical generator, and a catalyst (a promoter for a reaction between an aluminum alkoxide and a silane coupling agent), and therefore, it is possible to increase a relative amount of filler with respect to an organic substance, and it is also possible to obtain a cured product (crosslinked product or resin) having various characteristics, such as a thermally conductive resin and an electrically conductive resin.

Solution to Problem

The present invention is made with following configurations.

(1) A light- or heat-curing method comprising:
a step 1 of obtaining (E) a condensate having constitutional units of Si—O—Al and/or Si—O—Si, obtained from aluminum derived from an aluminum alkoxide and a silane derived from a silane coupling agent having a mercapto group, from (A) a compound that is formed of a salt of a carboxylic acid and an amine and has a carbonyl group generating a radical and a carboxylate group generating a base through decarboxylation by irradiation with light or heating, the (B) aluminum alkoxide, the (C) silane coupling agent having a mercapto group, and (D) water; and
a step 2 of performing a reaction among the (E) condensate, (H) a compound having two or more polymerizable unsaturated groups, and (I) filler under the conditions of irradiation with light or heating in the presence of the (A) compound.

(2) A light- or heat-curing method comprising:
a step 1 of obtaining (E) a sol by performing a reaction among (A) a compound that is formed of a salt of a carboxylic acid and an amine and has a carbonyl group generating a radical and a carboxylate group generating a base through decarboxylation by irradiation with light or heating, (B) an aluminum alkoxide, (C) a silane coupling agent having a mercapto group, and (D) water, and
a step 2 of obtaining a cured product from the (E) sol, (H) a compound having two or more polymerizable unsaturated groups, and (I) filler by irradiation with light or heating in the presence of the (A) compound.

(3) The curing method as described in (1), wherein the step 1 is a step of obtaining (E) a condensate having constitutional units of Si—O—Al and/or Si—O—Si, obtained from aluminum derived from an aluminum alkoxide and a silane derived from a silane coupling agent having a mercapto group, from the (A) compound, the (B) aluminum alkoxide, the (C) silane coupling agent, (D) water, and (F) a chelating agent.

(4) The curing method as described in (2), wherein the step 1 is a step of obtaining (E) a sol by performing a reaction among the (A) compound, the (B) aluminum alkoxide, the (C) silane coupling agent, (D) water, and (F) a chelating agent.

(5) The curing method as described in (1) or (3), wherein the step 2 is a step of performing a reaction among the (E) condensate, the (H) compound having two or more polymerizable unsaturated groups, (I) filler, and (J) a compound having two or more epoxy groups under the conditions of irradiation with light or heating in the presence of the (A) compound.

(6) The curing method as described in (2) or (4), wherein the step 2 is a step of obtaining a cured product from the (E) sol, the (H) compound having two or more polymerizable unsaturated groups, (I) filler, and (J) a compound having two or more epoxy groups by irradiation with light or heating in the presence of the (A) compound.

(7) The curing method as described in any one of (1) to (6), wherein the (A) compound is represented by the general formula [1],

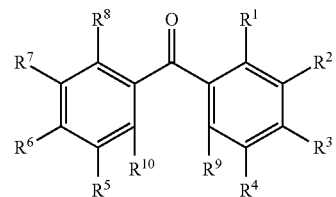

[1]

in the formula [1], $R^1$ to $R^8$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, a nitro group, or a group represented by the general formula [2], $R^9$ and $R^{10}$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, or a nitro group, or $R^9$ and $R^{10}$ are bonded to each other through an oxygen atom, a sulfur atom, or a carbonyl group, provided that at least one of groups represented by $R^1$ to $R^6$ represents a group represented by the general formula [2], general formula [2]:

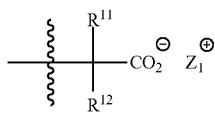
[2]

in the formula [2], $R^{11}$ and $R^{12}$ each independently represent a hydrogen atom, an alkyl group having 1 to 6 carbon atoms, or a hydroxyalkyl group having 1 to 6 carbon atoms and $Z_1^+$ represents an amidinium cation, a guanidinium cation, or a biguanidinium cation.

(8) The curing method as described in any one of (1) to (7), wherein the (B) aluminum alkoxide is represented by the general formula [6],

[6]

in the formula [6], three $R^{32}$'s each independently represent a hydrogen atom or an alkyl group having 1 to 4 carbon atoms, provided that at least one of groups represented by $R^{32}$ represents an alkyl group having 1 to 4 carbon atoms.

(9) The curing method as described in any one of (1) to (7), wherein the (B) aluminum alkoxide is aluminum tri-sec-butoxide.

(10) The curing method as described in any one of (1) to (9), wherein the (C) silane coupling agent is represented by the general formula [7],

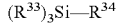
[7]

in the formula [7], three $R^{33}$'s each independently represent an alkyl group having 1 to 4 carbon atoms or an alkoxy group having 1 to 4 carbon atoms, $R^3$ represents an alkyl group having 1 to 8 carbon atoms, which has at least one mercapto group, provided that at least one of groups represented by $R^{33}$ represents an alkoxy group having 1 to 4 carbon atoms.

(11) The curing method as described in any one of (1) to (9), wherein the (C) silane coupling agent is selected from (3-mercaptopropyl)trimethoxysilane, (3-mercaptopropyl)triethoxysilane, and 3-mercaptopropyl(dimethoxy)methylsilane.

(12) The curing method as described in any one of (1) to (11), wherein a ratio of the molar ratios of the (B) aluminum alkoxide and the (C) silane coupling agent is 1:10 to 9:1.

(13) The curing method as described in any one of (3) to (12), wherein the (F) chelating agent is selected from methyl acetoacetate, ethyl acetoacetate, dimethyl malonate, diethyl malonate, 2-(2-thioxanthenyl)diethyl malonic acid, acetylacetone, diacetone alcohol, and ethyl lactate.

(14) The curing method as described in any one of (1) to (13), wherein (I) filler is thermally conductive filler.

(15) The curing method as described in (14), wherein the thermally conductive filler is aluminum nitride.

(16) A curable resin composition (which may be simply described as a first resin composition of an embodiment of the present invention in some cases) comprising:

(A) a compound that is formed of a salt of a carboxylic acid and an amine and has a carbonyl group generating a radical and a carboxylate group generating a base through decarboxylation by irradiation with light or heating;

(B) an aluminum alkoxide;

(C) a silane coupling agent having a mercapto group;

(H) a compound having two or more polymerizable unsaturated groups; and (I) filler.

(17) A curable resin composition (which may be simply described as a second resin composition of an embodiment of the present invention in some cases) comprising:

(A) a compound that is formed of a salt of a carboxylic acid and an amine and has a carbonyl group generating a radical and a carboxylate group generating a base through decarboxylation by irradiation with light or heating;

(E) a condensate having constitutional units of Si—O—Al and/or Si—O—Si, obtained from aluminum derived from an aluminum alkoxide and a silane derived from a silane coupling agent having a mercapto group;

(H) a compound having two or more polymerizable unsaturated groups; and (I) filler.

(18) The resin composition as described in (16) or (17), further comprising: (J) a compound having two or more epoxy groups.

(19) A thermally conductive substrate for forming an electronic circuit, comprising:

a cured product obtained from the curable resin composition as described in any one of (16) to (18).

(20) A method for preparing a thermally conductive substrate for forming an electronic circuit, comprising:

applying the curable resin composition as described in any one of (16) to (18) onto a metal substrate to obtain a coating film, and then subjecting the coating film to irradiation with light or heating to cure the coating film, thereby forming a thermally conductive insulating film on the surface of the metal substrate.

Advantageous Effects of Invention

The light- or heat-curing method of the embodiment of the present invention is a method in which partial condensation (solation) between the (B) aluminum alkoxide and the (C) silane coupling agent or between the (C) silane coupling agents is performed by the addition of water, then both of a base and a radical are generated from the (A) compound by irradiation with light (active energy rays) or heating, and thus, polycondensation (gelation) between the (E) condensates having constitutional units of Si—O—Al and/or Si—O—Si obtained by the solation and a thiol-ene reaction or a thiol-yne reaction between the mercapto group of the (E) condensate and the polymerizable unsaturated group in the (H) compound are performed in the same system, and is also a light- or heat-curing method by which it is possible not only to efficiently perform the solation-gelation and the thiol-ene reaction or the solation-gelation and the thiol-yne reaction, but also to obtain a cured product (crosslinked product or resin) in a simple method even in a case where filler is contained in a large amount.

In addition, the light- or heat-curing method of the embodiment of the present invention is a light- or heat-curing method in which the (A) compound has three functions as a base generator, a radical generator, and a catalyst (a promoter for a reaction between the (B) aluminum alkoxide and the (C) silane coupling agent), and therefore, it is possible to increase a relative amount of filler with respect to an organic substance, and it is also possible to obtain a cured product (crosslinked product or resin) having various characteristics, such as a thermally conductive resin and an electrically conductive resin.

The first resin composition of the embodiment of the present invention is a resin composition which has high storage stability, is not only capable of efficiently performing polycondensation (gelation) between the (B) aluminum alkoxide and the (C) silane coupling agent or between the (C) silane coupling agents, and a thiol-ene reaction or a thiol-yne reaction in the same method by adding water to the composition and performing irradiation with light (active energy rays) or heating; and is but also capable of obtaining a cured product (crosslinked product or resin) having excellent alkali developability, adhesiveness to a base material, organic solvent resistance, and the like.

The second resin composition of the embodiment of the present invention is a resin composition obtained after being subjected to the step 1 in the light- or heat-curing method of the embodiment of the present invention, that is, a resin composition before being applied to the step 2; and is capable of efficiently obtaining a cured product (crosslinked product or resin) since both of a base and a radical are generated in the composition by subjecting the composition to irradiation with light (active energy rays) or heating.

The thermally conductive substrate for forming an electronic circuit of the present invention is a substrate which has a cured product (crosslinked product or resin) obtained from the first or second resin composition of the embodiment of the present invention, and can serve as a substrate having excellent thermal conductivity by using thermally conductive filler as (I) filler.

The method for preparing the thermally conductive substrate for forming an electronic circuit of the present invention is a method which uses the first or the second resin composition of the embodiment of the present invention, and is also a useful method by which a substrate having a cured product (crosslinked product or resin) having not only excellent thermal conductivity but also excellent alkali developability, adhesiveness to a base material, organic solvent resistance, and the like can be obtained by using thermally conductive filler as (I) filler.

DESCRIPTION OF EMBODIMENTS

In the present invention, light (active energy rays) encompasses not only electromagnetic waves at wavelengths in visible regions (visible rays) but also electromagnetic waves at wavelengths in ultraviolet regions (ultraviolet rays), and electromagnetic waves at wavelengths in infrared regions (infrared rays), and electromagnetic waves at wavelengths in non-visible regions such as X-rays unless the wavelengths are specified. In the present invention, a base generator that exhibits sensitivity to light (active energy rays) (a base generator that generates a base by irradiation with active energy rays) may be described as a photobase generator and a radical generator that exhibits sensitivity to light (active energy rays) (a radical generator that generates a radical by irradiation with active energy rays) may be described as a photoradical generator in some cases. In addition, lights (active energy rays) at wavelengths of 365 nm, 405 nm, and 436 nm may be described as i lines, h lines, and g lines, respectively.

Light- or Heat-Curing Method of Present Invention

The light- or heat-curing method of the embodiment of the present invention a method containing:

a step 1 of obtaining (E) a condensate having constitutional units of Si—O—Al and/or Si—O—Si, obtained from aluminum derived from an aluminum alkoxide and a silane derived from a silane coupling agent having a mercapto group, from (A) a compound that is formed of a salt of a carboxylic acid and an amine and has a carbonyl group generating a radical and a carboxylate group generating a base through decarboxylation by irradiation with light or heating, the (B) aluminum alkoxide, the (C) silane coupling agent having a mercapto group, and (D) water, and a step 2 of performing a reaction among the (E) condensate, (H) a compound having two or more polymerizable unsaturated groups, and (I) filler under the conditions of irradiation with light or heating in the presence of the (A) compound.

That is, the step 1 in the light- or heat-curing method of the embodiment of the present invention is a step of obtaining the (E) condensate having Si—O—Al and/or Si—O—Si constitutional units by performing a reaction among the (B) aluminum alkoxide, the (C) silane coupling agent, and (D) water under the action of the (A) compound formed of a salt of a carboxylic acid and an amine as a catalyst (a promoter for a reaction).

The step 2 in the light- or heat-curing method of the embodiment of the present invention is a step of generating both of a base and a radical from the (A) compound by irradiating the (A) compound with light (active energy rays) or heating the (A) compound to performing a reaction among the (E) condensate having Si—O—Al and/or Si—O—Si constitutional units obtained in the step 1, the (H) compound, and the (I) filler. That is, the step 2 is a step of obtaining a cured product (crosslinked product or resin) by performing a reaction (thiol-ene reaction or thiol-yne reaction) between the mercapto group in the (E) condensate and the polymerizable unsaturated group in the (H) compound by a radical generated from the (A) compound while performing a reaction (polycondensation.gelation) between the hydroxyl groups in (E) condensate, or a reaction between the hydroxyl group and the alkoxy group in (E) condensate, and/or between the hydroxyl group in the (E) condensate and the (I) filler by a base generated from the (A) compound. It should be noted that the cured product (crosslinked product or resin) as mentioned herein is not limited to a cured product (crosslinked product or resin) obtained by reacting only the three components, that is, the (E) condensate, the (H) compound, and the (I) filler, and does not exclude a case where constitutional units other than the (E) condensate, the (H) compound, and the (I) filler are contained in the cured product (crosslinked product or resin).

In other words, the light- or heat-curing method of the embodiment of the present invention is a method containing:

a step 1 of obtaining (E) a sol by performing a reaction among (A) a compound that is formed of a salt of a carboxylic acid and an amine and has a carbonyl group generating a radical and a carboxylate group generating a base through decarboxylation by irradiation with light or heating, (B) an aluminum alkoxide, (C) a silane coupling agent having a mercapto group, and (D) water, and a step 2 of obtaining a cured product from the (E) sol, (H) a compound having two or more polymerizable unsaturated groups, and (I) filler by irradiation with light or heating in the presence of the (A) compound.

That is, the step 1 is a step of obtaining the (E) sol by performing a reaction among the (B) aluminum alkoxide, the (C) silane coupling agent, and (D) water under the action of the (A) compound formed of a salt of a carboxylic acid and an amine as a catalyst (a promoter for a reaction). In other words, the step 1 is a step of obtaining the (E) sol formed of reaction products of at least (B) to (D) by performing a reaction among (A) to (D).

The step 2 is a step of performing a reaction among the (E) sol obtained in the step 1, the (H) compound, and the (I) filler by subjecting the (A) compound to irradiation with light (active energy rays) or heating the (A) compound to generate both of a base and a radical from the (A) compound. In other words, the step 2 is a step of obtaining a cured product (crosslinked product or resin) by subjecting the mercapto group in the (E) sol and the polymerizable unsaturated group in the (H) compound to a reaction (thiol-ene reaction or thiol-yne reaction) by a radical generated from the (A) compound while performing a reaction between the hydroxyl groups in the (E) sol or a reaction (polycondensation.gelation) between the hydroxyl group and the alkoxy group in the (E) sol and/or between the hydroxyl group in the (E) sol and the (I) filler by a base generated from the (A) compound. It should be noted that the cured product (crosslinked product or resin) as mentioned herein is not limited to a cured product (crosslinked product or resin) obtained by reacting only the three components, that is, the (E) sol, the (H) compound, and the (I) filler, and does not exclude a case where constitutional units other than the (E) sol, the (H) compound, and the (I) filler are contained in the cured product (crosslinked product or resin).

In the reaction system of the step 1, at least the (A) compound, the (B) aluminum alkoxide, the (C) silane coupling agent, and (D) water are contained, but in the reaction system of the step 1, the (H) compound and the (I) filler may further be contained. Since a base and a radical are latent in the (A) compound as long as irradiation with light (active energy rays) or heating is not performed, and therefore, the (A) compound does not substantially give an adverse effect on the step 1. In addition, in a case where the (H) compound or the (I) filler is contained in advance, there is no need to contain a step of adding the (H) compound and the (I) filler between the step 1 and the step 2, and thus, the workability is improved.

In the reaction system of the step 2, the (E) condensate obtained in the step 1, the (A) compound, the (H) compound, and the (I) filler are contained, and the mixture may be referred to as a curable resin composition in some cases.

In the reaction system of the step 1, components other than (A) to (D), and as desired, the (H) compound and the (I) filler may be contained, and examples of such components include various other additives such as an organic solvent and (F) a chelating agent. In addition, in the reaction system of the step 2 (in the curable resin composition), components other than the (E) condensate, the (A) compound, the (H) compound, and the (I) filler may be contained, and examples of such components include various other additives such as (J) a compound having two or more epoxy groups and an organic solvent. The organic solvent can improve compatibility of (A) to (F) and (H) to (I) or can increase applicability onto a solid surface (base material) such as a metal substrate, can thus, improve workability. It should be noted that in the step 2, it is certain that (D) water or the unreacted (B) an aluminum alkoxide and/or (C) a silane coupling agent, used in the step 1, may be contained.

The pH in the reaction system of the step 1 is preferably in the range of 4 to 8, and more preferably in the range of 6 to 7 in order to make the reaction (solation) of (A) to (D) proceed smoothly. In a case where the step 1 is carried out at such a preferred pH, it is desirable that a compound exhibiting strong acidity or strong basicity is not used.

The step 2 is a step of allowing polycondensation (gelation) and a thiol-ene reaction or polycondensation (gelation) and a thiol-yne reaction to proceed in parallel, in which the polycondensation (gelation) is performed under an alkali condition. The pH is nearly neutral before irradiation with light (active energy rays) or heating in the step 2, but the pH in the reaction system is shifted to alkalinity by the generation of a base through decarboxylation of a carboxylate group of the (A) compound by irradiation with light (active energy ray) or heating, thereby creating an alkaline condition. The alkalinity usually refers to a pH that is more than 7 and 14 or less, but among those, a pH in the range of pH 8 to 14 is preferable, and a pH in the range of 10 to 14 is more preferable. In a case where the step 2 is carried out at such a preferred pH, the (A) compound capable of generating a base having a pH of 10 to 14 may be used, and polycondensation (gelation) in the step 2 smoothly proceeds, whereby it is likely to obtain a cured product (crosslinked product or resin) having desired crosslinking density, hardness, adhesiveness to a base material, organic solvent resistance, and the like.

In the step 1, the reaction is desirably terminated such that the hydroxyl groups or the alkoxy groups remain in the (E) condensate having Si—O—Al and/or Si—O—Si constitutional units that are reaction products. The (E) condensate is obtained by the reaction (polycondensation) of the hydroxyl groups in (B) or (C) produced by the hydrolysis of the (B) aluminum alkoxide or the (C) silane coupling agent, but there is a concern of gelation in a case where the hydroxyl groups in (B) or (C) are excessively subjected to reaction (polycondensation). That is, since the step 1 is a step of obtaining a sol by the reaction (hydrolysis and condensation) of (A) to (D), it is preferable that the hydroxyl groups or alkoxy groups in the (E) condensate are allowed to remain to some extents and are not gelated. It should be noted that the solation in the step 1 can be controlled by the number of equivalents of water with respect to the (B) aluminum alkoxide and the (C) silane coupling agent, the reaction time, and the like. It should be noted that an expression that "the hydroxyl groups or alkoxy groups in the (E) condensate are allowed to remain to some extents" means that the hydroxyl groups or the alkoxy groups in the (E) condensate corresponding to all the alkoxy groups in the (B) aluminum alkoxide and all the alkoxy groups in the (C) silane coupling agent usually remain at a ratio of 10% to 90%, and preferably remain at a ratio of 30% to 70%.

The (A) compound in the light- or heat-curing method of the embodiment of the present invention is a compound that exhibits sensitivity to light (active energy rays) or heat. More specifically, the (A) compound absorbs light (active energy rays), usually at a wavelength of 100 to 780 nm, preferably at a wavelength of 200 to 450 nm, and more preferably at a wavelength of 250 to 450 nm and decomposes, or absorbs heat energy, usually at 80° C. to 250° C., preferably at 100° C. to 200° C., and more preferably at 120° C. to 180° C. and decomposes to generate a radical from the carbonyl group in the (A) compound and generate a base through decarboxylation of a carboxylate group. It is not necessary that the generation of a radical from the carbonyl group and the decarboxylation of the carboxylate group in the (A) compound are caused by the light (active energy rays) in the same wavelength range or the heat energy at the same temperature. However, since the step 2 is a step of allowing the polycondensation (gelation) and the thiol-ene reaction or the polycondensation (gelation) and the thiol-yne reaction to proceed in parallel, it is preferable that the generation of a radical from the carbonyl group and the decarboxylation of the carboxylate group in the (A) compound are caused by the light (active energy rays) in the same wavelength range or the heat energy at the same temperature. In other words, it is also preferable that the (A) compound has a photosensitive group or a thermally decomposable group that allows the generation of a radical from the carbonyl group and the decarboxylation of the carboxylate group to proceed by the light (active energy rays) in the same wavelength range or the heat energy at the same temperature. It should be noted that from the viewpoint of versatility, it is preferable that the (A) compound exhibits absorption of at least one or more kinds of light (active energy rays) among the i line, the h line, and the g line in the wavelength range.

The content of the (A) compound in the step 1 may be determined based on a total amount of the molar amount of the (B) aluminum alkoxide and the molar amount of the (C) silane coupling agent (a total molar amount of (B) and (C)), and is usually 0.001 to 1 equivalent, preferably 0.005 to 0.5 equivalents, and more preferably 0.005 to 0.1 equivalents, with respect to the total molar amount of the (B) aluminum alkoxide and the (C) silane coupling agent. In the step 1, since the (A) compound acts as a catalyst (a promoter for a reaction) with respect to the (B) aluminum alkoxide, it may be contained in a catalytic amount (0.001 equivalents) or more, but in the step 2, the (A) compound is preferably contained in the amount of 0.005 equivalents or more since the step 2 is a step in which a base and a radical is generated from the (A) compound to cause polycondensation (gelation) and a thiol-ene reaction or polycondensation (gelation) and a thiol-yne reaction. It is not necessary to add the (A) compound from the step 1 to the step 2 by incorporating the (A) compound in the amount of 0.005 equivalents or more, and thus, the workability is improved and the step 1 can also proceed more smoothly.

The content of the (A) compound in the step 2 may be determined based on a total amount of the molar amount of the (B) aluminum alkoxide and the molar amount of the (C) silane coupling agent (a total molar amount of (B) and (C)), and is usually 0.001 to 1 equivalent, preferably 0.005 to 0.5 equivalents, and more preferably 0.005 to 0.1 equivalents, with respect to the total molar amount of the (B) aluminum alkoxide and the (C) silane coupling agent. The step 2 can proceed more smoothly by incorporating the (A) compound in the amount of 0.005 equivalents or more.

The content of the (B) aluminum alkoxide in the step 1 may be determined based on the molar amount of the (C) silane coupling agent, and is usually 0.1 to 9 equivalents, preferably 0.2 to 4 equivalents, and more preferably 0.4 to 2 equivalents, with respect to the molar amount of the (C) silane coupling agent. The dispersion stability of (I) filler which will be described later is increased by using the (B) aluminum alkoxide with a number of equivalents in a preferred range, or a number of equivalents in a more preferred range, and thus, various physical properties such as a hardness and a thermal conductivity of the cured product (crosslinked product or resin) can further be improved.

That is, the content of the (B) aluminum alkoxide in the step 1 is preferably set such that the ratio of the molar ratios of the (B) aluminum alkoxide and the (C) silane coupling agent is usually 1:10 to 9:1, preferably 1:5 to 4:1, and more preferably 1:2.5 to 2:1.

The content of (D) water in the step 1 may be determined based on a total amount of the molar amount of the (B) aluminum alkoxide and the molar amount of (C) silane coupling agent (a total molar amount of (B) and (C)), and is usually 0.01 to 3 equivalents, preferably 0.1 to 2 equivalents, and more preferably 0.3 to 2 equivalents, with respect to the total molar amount of the (B) aluminum alkoxide and the (C) silane coupling agent. Gelation due to the polycondensation of the hydroxyl groups in (B) or (C) can be suppressed and it becomes easier to terminate the reaction in the solated state by using (D) water with a number of equivalents in a preferred range, or a number of equivalents in a more preferred range.

The content of the (E) condensate in the step 1 depends on the amount of the (B) aluminum alkoxide and the (C) silane coupling agent to be used. That is, in a case where the total amount of the (C) silane coupling agent used is reacted with the (B) aluminum alkoxide or (D) water in the step 1, the same molar amount of a silyl group as the molar amount of the (C) silane coupling agent is present in the (E) condensate. On the other hand, all of the (C) silane coupling agent used does not undergo a reaction, and thus, in a case where the (C) silane coupling agent remains in the reaction system after termination of the step 1, or the like, a smaller molar amount of the silyl group than the molar amount of the (C) silane coupling agent used is present in the (E) condensate.

The content of the (H) compound in the step 2 may be determined such that the number of equivalents of the polymerizable unsaturated group in the (H) compound with respect to the molar amount of the mercapto group in the (C) silane coupling agent is in the following range. That is, the content of the (H) compound may be determined such that the number of equivalents of the polymerizable unsaturated group in the (H) compound with respect to the molar amount of the mercapto group in the (C) silane coupling agent is usually 0.1 to 2 equivalents, preferably 0.2 to 1.5 equivalents, and more preferably 0.4 to 1.2 equivalents. Various physical properties such as a hardness, adhesiveness to a base material, and organic solvent resistance of a cured product (crosslinked product or resin) obtained can further be improved by using the (H) compound at a content calculated from a number of equivalents in a preferred range, or a number of equivalents in a more preferred range.

The content of the (I) filler in the step 2 may be determined based on a total amount of the mass of the (B) aluminum alkoxide and the mass of the (C) silane coupling agent (the total mass of (B) and (C)), and is usually 1- to 20-times amount, preferably 3- to 17-times amount, and more preferably 5- to 15-times amount, with respect to the total amount of the mass of the (B) aluminum alkoxide and the mass of the (C) silane coupling agent. Various physical properties such as a hardness and a thermal conductivity of a cured product (crosslinked product or resin) obtained can further be improved by using the (I) filler in the amount in a preferred range, or the amount in a more preferred range.

In a case where (F) a chelating agent used in the step 1 is used, the content of the (F) chelating agent may be determined based on the molar amount of the (B) aluminum alkoxide, and is usually 0.01 to 20 equivalents, preferably 0.05 to 10 equivalents, and more preferably 0.1 to 8 equivalents, with respect to the molar amount of the (B) aluminum alkoxide. Gelation in the step 1 can be suppressed by using the (F) chelating agent with a number of equivalents in a preferred range, or a number of equivalents in a more preferred range, and thus, it is possible to expect an improvement of operability and more efficient promotion of solation.

In a case where (J) a compound having two or more epoxy groups is used in the step 2, the content of the (J) compound may be determined such that the number of equivalents of the epoxy group in the (J) compound is in the following range based on the molar ratio of the mercapto group in the (C) silane coupling agent and the molar ratio of the polymerizable unsaturated group in the (H) compound. That is, the content of the (J) compound may be determined such that the number of equivalents of the epoxy group in the (J) compound is usually 0.2 to 2 equivalents, preferably 0.5 to 1.5 equivalents, and more preferably 0.8 to 1.2 equivalents, with respect to a molar amount obtained by subtracting the molar amount of the polymerizable unsaturated group in the (H) compound from the molar amount of the mercapto group in the (C) silane coupling agent (the molar amount of the mercapto group in the (C) silane coupling agent—the molar amount of the polymerizable unsaturated group in the (H) compound). Various physical properties such as a hardness and adhesiveness to a base material of the cured product (crosslinked product or resin) obtained can further be improved by using the (J) compound at a content calculated from a number of equivalents in a preferred range, or a number of equivalents in a more preferred range.

The light (active energy rays) for the step 2 is not particularly limited as long as it is light (active energy rays) at a wavelength to which the (A) compound is photosensitive, thereby generating both of a base and a radical, but among those, the light is preferably light (active energy rays) in which the main wavelength of the light (active energy rays) is in the range of 100 to 780 nm, more preferably light (active energy rays) in which the main wavelength of the light (active energy rays) is in the range of 200 to 450 nm, and still more preferably light (active energy rays) in which the main wavelength of the light (active energy rays) is in the range of 250 to 450 nm.

In addition, the irradiation amount (cumulative exposure amount) of the light (active energy rays) is not particularly limited as long as the polycondensation (gelation) and the thiol-ene reaction or the polycondensation (gelation) and the thiol-yne reaction proceed in the reaction of the step 2 and a cured product (crosslinked product or resin) is obtained, but the irradiation amount (cumulative exposure amount) of the light (active energy rays) is preferably 0.1 J or more, more preferably 0.5 J or more, and still more preferably 1 J or more. In a case where the irradiation amount (cumulative exposure amount) of the light (active energy rays) is 1 J or more, a cured product (crosslinked product or resin) having a high crosslinking density tends to be obtained, and as a result, a cured product (crosslinked product or resin) having excellent solvent resistance and a high hardness tends to be obtained.

The irradiation with light (active energy rays) for the step 2 may be performed by appropriately selecting light (active energy rays) having a main wavelength in the range, for a time by which the irradiation amount (cumulative exposure amount) of the light (active energy rays) becomes the irradiation amount (cumulative exposure amount) or more. It should be noted that the irradiation with light (active energy rays) may be performed using a general exposure device which can radiate light (active energy rays) at the wavelength.

The heat for the step 2 is not particularly limited as long as it is heat energy capable of generating both of a base and a radical by thermally decomposing the (A) compound, and is, for example, usually 80° C. to 250° C., preferably 100° C. to 200° C., and more preferably 120° C. to 180° C., as the heat energy is converted to a temperature.

In addition, with regard to the heating time in the reaction of the step 2, the heating time is not particularly limited as long as it allows the polycondensation (gelation) and the thiol-ene reaction or the polycondensation (gelation) and the thiol-yne reaction to proceed and a cured product (crosslinked product or resin) is obtained, but the heating time is usually 0.1 to 180 minutes, preferably 0.5 to 120 minutes, and more preferably 1 to 90 minutes. As the heating time is longer, a cured product (crosslinked product or resin) having a higher crosslinking density tends to be obtained and a cured product (crosslinked product or resin) having excellent solvent resistance and a high hardness tends to be obtained, but since the productivity tends to be lowered, it is preferable that the heating is performed for a heating time within the range.

Application of heat energy (heating) for the step 2 may be performed by appropriately selecting a temperature in the range for a heating time in the range. In addition, in a case where the step 2 is performed only by application of heat energy (heating), it is preferable that the step 2 is performed under light shielding conditions. It should be noted that application of heat energy may be performed by using a heating device used in this field.

The step 1 may be carried out at a temperature in the range of usually −20° C. to 60° C., preferably 0° C. to 50° C., and more preferably 10° C. to 40° C. Thus, since the step 1 can be carried out under mild conditions, it is an excellent light- or heat-curing method.

The step 1 and the step 2 may be carried out at a pressure in a range in which a series of steps can be smoothly carried out and are not particularly limited, but may be generally performed at normal pressure.

In the step 1 and the step 2, a reaction time (a time for which the step 1 and the step 2 are carried out) may be set such that a cured product (crosslinked product or resin) having desired crosslinking density, hardness, adhesiveness to a base material, organic solvent resistance, and the like is obtained. In the step 1, the reaction time varies depending on the contents of the (A) compound, the (B) aluminum alkoxide, and (D) water, the presence or absence of the (F) chelating agent, the reaction temperature, the pressure, and the like, and in the step 2, the reaction time varies depending on the wavelength of light (active energy rays) and/or the irradiation amount (cumulative exposure amount), the contents of the (A) compound, the (H) compound, and the (I) filler, the heating temperature, the pressure, and the like. Therefore, the reaction time cannot be mentioned as fixed numbers, but for example, the reaction time of the step 1 (the time for which the step 1 is carried out) is usually 1 minute to 24 hours, preferably 1 minute to 12 hours, and more preferably 1 minute to 6 hours, and for example, the reaction time of the step 2 (a time for which the step 2 is carried out) is usually 0.1 to 180 minutes, preferably 0.5 to 120 minutes, and more preferably 0.5 to 90 minutes.

A specific procedure of a method for obtaining a cured product (crosslinked product or resin) using the light- or heat-curing method of the embodiment of the present invention will be described below. First, (A) a compound that is formed of a salt of a carboxylic acid and an amine and has a carbonyl group generating a radical and a carboxylate group generating a base through decarboxylation by irradiation with light or heating, (B) an aluminum alkoxide, (C) a silane coupling agent having a mercapto group, and (D) water, and as desired, (F) a chelating agent and/or an organic solvent are added to a reaction container to perform a reaction among the (B) aluminum alkoxide, the (C) silane coupling agent, and (D) water for a predetermined time, thereby obtaining (E) a condensate ((E) a sol) having constitutional units of Si—O—Al and/or Si—O—Si, obtained from aluminum derived from an aluminum alkoxide and a silane derived from a silane coupling agent having a mercapto group (step 1). Preferably, (D) water is added to a reaction container containing the (A) compound, the (B) aluminum alkoxide, and the (C) silane coupling agent, and as desired, the (F) chelating agent and/or the organic solvent to perform a reaction among the (B) aluminum alkoxide, the (C) silane coupling agent, and (D) water for a predetermined time, thereby obtaining the (E) condensate (the (E) sol) (step 1). Next, (H) a compound having two or more polymerizable unsaturated groups and (I) filler are added to a composition containing the (E) condensate (the (E) sol) obtained in the step 1 and the (A) compound; as desired, (J) a compound having two or more epoxy groups is added thereto; and then the composition (curable resin composition) is irradiated with light (active energy rays) at a predetermined wavelength for a time corresponding to a predetermined irradiation amount (cumulative exposure amount) or more, or heated at a predetermined temperature for a predetermined time to generate both of a base and a radical from the (A) compound. A cured product (crosslinked product or resin) can be obtained by generating the base and the radical to perform a gel reaction of the (E) condensate (the (E) sol) and a thiol-ene reaction or a gel reaction of the (E) condensate (the (E) sol) and a thiol-yne reaction (step 2). It should be noted that the composition (curable resin composition) may be molded into various shapes, and for example, the composition (curable resin composition) is applied onto a suitable solid surface (base material) such as a metal substrate, and as desired, a coating film may be formed by performing a drying operation such as baking. In addition, the coating film may be irradiated with light (active energy rays) at a predetermined wavelength for a predetermined irradiation amount (cumulative exposure amount) or more, or may be heated at a predetermined temperature for a predetermined time to obtain a cured product (crosslinked product or resin). It should be noted that in a case where a pattern is formed using the light- or heat-curing method of the embodiment of the present invention, it is possible to obtain a cured product (crosslinked product or resin) having a suitable pattern by performing the irradiation with light (active energy rays) in the step 2 through a suitable pattern mask and then performing a development treatment by using a suitable developer. It should be noted that the (H) compound having two or more polymerizable unsaturated groups and the (I) filler may also be added in the process of the step 1. As described above, the step 1 and the step 2 in the light- or heat-curing method of the embodiment of the present invention do not need to be consecutively performed, and for example, the coating step, the baking step, the drying step, and the like as described above may be performed between the step 1 and the step 2, or the step 1 and the step 2 may also be consecutively performed.

As a coating method in the coating step, a baking method in the baking step, a drying method in the drying step, a development treatment method in the developing step, and the like, known methods may be appropriately adopted. For example, in a baking step that is a drying step for an organic solvent and the like and is different from heating (heat curing) in the step 2, the baking temperature is usually 50° C. to 250° C., preferably 70° C. to 200° C., and more preferably 80° C. to 160° C., and the baking time is usually 0.1 to 60 minutes, preferably 0.5 to 30 minutes, and more preferably 1 to 10 minutes; and for example, in a case where the baking step also contains heating (heat curing) in the step 2, the baking temperature is usually 80° C. to 250° C., preferably 100° C. to 200° C., and more preferably 120° C. to 180° C., and the baking time is usually 0.1 to 180 minutes, preferably 0.5 to 120 minutes, and more preferably 1 to 90 minutes. For example, examples of the development treatment method in the developing step include a method in which the cured product (crosslinked product or resin) obtained using the light- or heat-curing method of the embodiment of the present invention is immersed in an organic solvent such as acetone and methyl ethyl ketone for 10 seconds to 5 minutes, a method in which the crosslinked product (resin) is immersed in an aqueous alkaline solution containing potassium hydroxide, tetramethylammoniumhydroxide (TMAH), and the like for 10 seconds to 5 minutes, and the like.

The (A) compound that is formed of a salt of a carboxylic acid and an amine and has a carbonyl group generating a radical and a carboxylate group generating a base through decarboxylation by irradiation with light or heating with regard to the light- or heat-curing method of the embodiment of the present invention is a compound that exhibits sensitivity to light (active energy rays) or heat. More specifically, the (A) compound has a group (photosensitive group) that exhibits sensitivity to light (active energy rays) or a group (thermally decomposable group) that exhibits sensitivity to heat energy, in which the photosensitive group or the thermally decomposable group has a carbonyl group capable of generating a radical and a carboxylate group capable of generating a base, through decarboxylation, by absorbing light or heat, respectively. Specific examples of such the (A) compound include a compound represented by the general formula [1].

General formula [1]:

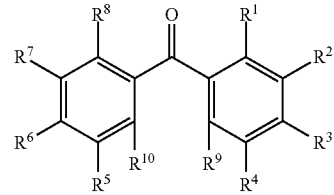

[1]

In the formula [1], $R^1$ to $R^8$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, a nitro group, or a group represented by the general formula [2], $R^9$ and $R^{10}$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, or a nitro group, or $R^9$ and $R^{10}$ are bonded to each other through an oxygen atom, a sulfur atom, or a carbonyl group, provided that at least one of groups represented by $R^1$ to $R^6$ represents a group represented by the general formula [2].

General formula [2]:

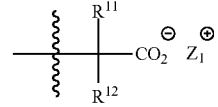

[2]

In the formula [2], $R^{11}$ and $R^{12}$ each independently represent a hydrogen atom, an alkyl group having 1 to 6 carbon atoms or a hydroxyalkyl group having 1 to 6 carbon atoms, and $Z_1^+$ represents an amidinium cation, a guanidinium cation or biguanidinium cation.

As the alkyl group having 1 to 12 carbon atoms represented by $R^1$ to $R^{10}$ in the general formula [1], alkyl groups having 1 to 6 carbon atoms are preferable; among these, alkyl groups having 1 to 4 carbon atoms are more preferable; and among these, an alkyl group having 1 carbon atom is still more preferable. In addition, the alkyl group may be any of linear, branched, and cyclic groups. Specific examples of such an alkyl group include a methyl group, an ethyl group, an n-propyl group, an isopropyl group, a cyclopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, a cyclohexyl group, an n-heptyl group, an isoheptyl group, a sec-heptyl group, a tert-heptyl group, a neoheptyl group, a cycloheptyl group, an n-octyl group, an isooctyl group, a sec-octyl group, a tert-octyl group, a neooctyl group, a 2-ethylhexyl group, a cyclooctyl group, an n-nonyl group, an isononyl group, a sec-nonyl group, a tert-nonyl group, a neononyl group, a cyclononyl group, an n-decyl group, an isodecyl group, a sec-decyl group, a tert-decyl group, a neodecyl group, a cyclodecyl group, an n-undecyl group, a cycloundecyl group, an n-dodecyl group, a cyclododecyl group, a norbornyl group (norbornan-χ-yl group), a bornyl group (bornan-χ-yl group), a menthyl group (menth-χ-yl group), an adamantyl group, and a decahydronaphthyl group. Among these alkyl groups, linear, branched or cyclic alkyl groups having 1 to 6 carbon atoms are preferable; among these, linear, branched, or cyclic alkyl groups having 1 to 4 carbon atoms are more preferable; and among these, a methyl group is particularly preferable.

The aryl group having 6 to 14 carbon atoms represented by $R^1$ to $R^{10}$ in the general formula [1] may be any of monocyclic or fused polycyclic groups, and among these, an aryl group having 6 carbon atoms is preferable. Specific examples of such an aryl group include a phenyl group, a naphthyl group, and an anthracenyl group. Among these aryl groups, the phenyl group is preferable.

The arylalkyl group having 7 to 15 carbon atoms represented by $R^1$ to $R^{10}$ in the general formula [1] may be any of monocyclic or fused polycyclic groups, and among these, an arylalkyl group having 7 carbon atoms is preferable. Specific examples of such an arylalkyl group include a benzyl group, a phenethyl group, an methylbenzyl group, a phenylpropyl group, a 1-methylphenylethyl group, a phenylbutyl group, a 2-methylphenylpropyl group, a tetrahydronaphthyl group, a naphthylmethyl group, a naphthylethyl group, an indenyl group, a fluorenyl group, an anthracenylmethyl group (anthrylmethyl group), and a phenanthrenylmethyl group (phenanthrylmethyl group). Among these arylalkyl groups, the benzyl group is preferable.

As the alkoxy group having 1 to 12 carbon atoms represented by $R^1$ to $R^{10}$ in the general formula [1], alkoxy groups having 1 to 6 carbon atoms are preferable; among these, alkoxy groups having 1 to 4 carbon atoms are more preferable; and among these, an alkoxy group having 1 carbon atom is still more preferable. In addition, the alkoxy group may be any of linear, branched, and cyclic groups. Specific examples of such an alkoxy group include a methoxy group, an ethoxy group, an n-propoxy group, an isopropoxy group, a cyclopropoxy group, an n-butoxy group, an isobutoxy group, a sec-butoxy group, a tert-butoxy group, a cyclobutoxy group, an n-pentyloxy group, an isopentyloxy group, a sec-pentyloxy group, a tert-pentyloxy group, a neopentyloxy group, a 2-methylbutoxy group, a 1,2-dimethylpropoxy group, a 1-ethylpropoxy group, a cyclopentyloxy group, an n-hexyloxy group, an isohexyloxy group, a sec-hexyloxy group, a tert-hexyloxy group, a neohexyloxy group, a 2-methylpentyloxy group, a 1,2-dimethylbutoxy group, a 2,3-dimethylbutoxy group, a 1-ethylbutoxy group, a cyclohexyloxy group, an n-heptyloxy group, an isoheptyloxy group, a sec-heptyloxy group, a tert-heptyloxy group, a neoheptyloxy group, a cycloheptyloxy group, an n-octyloxy group, an isooctyloxy group, a sec-octyloxy group, a tert-octyloxy group, a neooctyloxy group, a 2-ethylhexyloxy group, a cyclooctyloxy group, an n-nonyloxy group, an isononyloxy group, a sec-nonyloxy group, a tert-nonyloxy group, a neononyloxy group, a cyclononyloxy group, an n-decyloxy group, an isodecyloxy group, a sec-decyloxy group, a tert-decyloxy group, a neodecyloxy group, a cyclodecyloxy group, an n-undecyloxy group, a cycloundecyloxy group, an n-dodecyloxy group, a cyclododecyloxy group, a norbornyloxy group (norbornan-χ-yloxy group), a bornyloxy group (bornan-χ-yloxy group), a menthyloxy group (menth-χ-yloxy group), an adamantyloxy group, and a decahydronaphthyloxy group. Among these alkoxy groups, linear, branched, or cyclic alkoxy groups having 1 to 6 carbon atoms are preferable; among these, linear, branched, or cyclic alkoxy groups having 1 to 4 carbon atoms are more preferable; and among these, a methoxy group is particularly preferable.

Examples of the halogen atom represented by $R^1$ to $R^{10}$ in the general formula [1] include a fluorine atom, a chlorine atom, a bromine atom, and an iodine atom, and among these, the fluorine atom and the chlorine atom are preferable.

As the alkyl group having 1 to 6 carbon atoms represented by $R^{11}$ and $R^{12}$ in the general formula [2], alkyl groups having 1 to 3 carbon atoms are preferable; and among these, an alkyl group having 1 carbon atom is more preferable. In addition, the alkyl group may be any of linear, branched, and cyclic alkyl groups. Specific examples of such an alkyl group include a methyl group, an ethyl group, an n-propyl group, an isopropyl group, a cyclopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, and a cyclohexyl group. Among these alkyl groups, linear, branched, or cyclic alkyl groups having 1 to 3 carbon atoms are preferable; and among these, a methyl group is more preferable.

As the hydroxyalkyl group having 1 to 6 carbon atoms represented by $R^{11}$ and $R^{12}$ in the general formula [2], hydroxyalkyl groups having 1 to 3 carbon atoms are preferable; and among these, a hydroxyalkyl group having 1 carbon atom is more preferable. In addition, the hydroxyalkyl group may be any of linear, branched, and cyclic groups, and the number of hydroxyl groups bonded to the alkyl group is not limited to 1 and may be plural such as 2 to 4. Specific examples of such a hydroxyalkyl group include a hydroxymethyl group, a 1-hydroxyethyl group, a 2-hydroxyethyl group, a 1,2-dihydroxyethyl group, a 1-hydroxy-n-propyl group, a 2-hydroxy-n-propyl group, a 3-hydroxy-n-propyl group, a 1-hydroxy-1-methylethyl group, a 1-hydroxymethylethyl group, a 4-hydroxy-n-butyl group, a 5-hydroxy-n-pentyl group, and a 6-hydroxy-n-hexyl group. Among these hydroxyalkyl groups, linear, branched, or cyclic hydroxyalkyl groups having 1 to 3 carbon atoms are preferable; and among these, a hydroxymethyl group is more preferable.

An expression, "$R^9$ and $R^{10}$ in the general formula [1] are bonded to each other through an oxygen atom, a sulfur atom, or a carbonyl group", means that $R^9$ and $R^{10}$ form a group represented by —O—, —S—, or —C(=O)—.

In a case where $R^9$ and $R^{10}$ in the general formula [1] each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, or a nitro group, or in a case where $R^9$ and $R^{10}$ are bonded to each other through an oxygen atom or a sulfur atom, it is preferable that the group represented by the general formula [2] is bonded to any one of $R^2$, $R^4$, $R^5$, or $R^7$. That is, in a case where $R^9$ and $R^{10}$ are bonded to each other through a carbonyl group, the group represented by the general formula [2] may be bonded to any one of $R^1$ to $R^8$, but in a case where $R^9$ and $R^{10}$ are groups other than the above, it is preferable that the group represented by the general formula [2] is bonded to any one of $R^2$, $R^4$, $R^5$ or $R^7$.

As $R^1$, $R^2$, $R^4$, $R^5$ and $R^8$ in the general formula [1], a hydrogen atom and the group represented by the general formula [2] are preferable.

As $R^3$ and $R^6$ in the general formula [1], a hydrogen atom is preferable.

As $R^7$ in the general formula [1], a hydrogen atom and the group represented by the general formula [2] are preferable; and among these, the hydrogen atom is preferable.

As $R^9$ and $R^{10}$ in the general formula [1], a hydrogen atom is preferable and it is preferable that $R^9$ and $R^{10}$ are bonded to each other through an oxygen atom or a sulfur atom; and among these, the hydrogen atom is preferable and it is preferable that $R^9$ and $R^{10}$ are bonded to each other through a sulfur atom.

As $R^{11}$ in the general formula [2], a hydrogen atom and an alkyl group having 1 to 6 carbon atoms are preferable; and among these, the alkyl group having 1 to 6 carbon atoms is more preferable.

As $R^{12}$ in the general formula [2], a hydrogen atom and an alkyl group having 1 to 6 carbon atoms are preferable; and among these, the hydrogen atom is more preferable.

Specific preferred examples of the (A) compound represented by the general formula [1] include compounds represented by the general formulae [1-A] to [1-C].

General formula [1-A]:

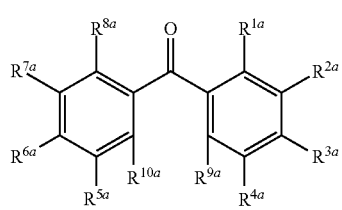
[1-A]

In the formula [1-A], $R^{2a}$, $R^{4a}$, $R^{5a}$, and $R^{7a}$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, a nitro group or the group represented by the general formula [2], and $R^{1a}$, $R^{3a}$, $R^{6a}$, $R^{8a}$, $R^{9a}$, and $R^{10a}$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, or a nitro group, provided that at least one of the groups represented by $R^{2a}$, $R^{4a}$, $R^{5a}$, and $R^{7a}$ is the group represented by the general formula [2].

General formula [1-B]:

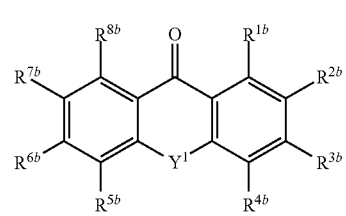
[1-B]

In the formula [1-B], $R^{2b}$, $R^{4b}$, $R^{5b}$, and $R^{7b}$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, a nitro group or the group represented by the general formula [2], $R^{1b}$, $R^{3b}$, $R^{6b}$, and $R^{8b}$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, or a nitro group, and $Y_1$ represents an oxygen atom or a sulfur atom, provided that at least one of the groups represented by $R^{2b}$, $R^{4b}$, $R^{5b}$, and $R^{7b}$ is the group represented by the general formula [2].

General formula [1-C]:

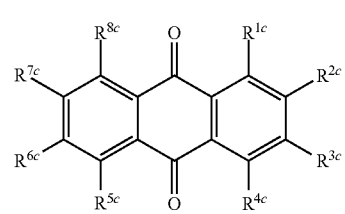
[1-C]

In the formula [1-C], $R^{1c}$ to $R^{8c}$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, a nitro group or the group represented by the general formula [2], provided that at least one of the groups represented by $R^{1c}$ to $R^{8c}$ is the group represented by the general formula [2].

Specific examples of the alkyl group having 1 to 12 carbon atoms represented by $R^{1a}$ to $R^{10a}$ in the general formula [1-A], $R^{1b}$ to $R^{8b}$ in the general formula [1-B], and $R^{1c}$ to $R^{8c}$ in the general formula [1-C] are the same one as the specific examples of the alkyl group having 1 to 12 carbon atoms represented by $R^1$ to $R^{10}$ in the general formula [1], and specific preferred examples are also the same.

Specific examples of the aryl group having 6 to 14 carbon atoms represented by $R^{1a}$ to $R^{10a}$ in the general formula [1-A], $R^{1b}$ to $R^{8b}$ in the general formula [1-B], and $R^{1c}$ to $R^{8c}$ in the general formula [1-C] include the same ones as the specific examples of the aryl group having 6 to 14 carbon atoms represented by $R^1$ to $R^{10}$ in the general formula [1], and specific preferred examples are also the same.

Specific examples of the arylalkyl group having 7 to 15 carbon atoms represented by $R^{1a}$ to $R^{10a}$ in the general formula [1-A], $R^{1b}$ to $R^{8b}$ in the general formula [1-B], and $R^{1c}$ to $R^{8c}$ in the general formula [1-C] include the same ones as the specific examples of the arylalkyl group having 7 to 15 carbon atoms represented by $R^1$ to $R^{10}$ in the general formula [1], and specific preferred examples are also the same.

Specific examples of the alkoxy group having 1 to 12 carbon atoms represented by $R^{1a}$ to $R^{10a}$ in the general formula [1-A], $R^{1b}$ to $R^{8b}$ in the general formula [1-B], and $R^{1c}$ to $R^{8c}$ in the general formula [1-C] include the same ones as the specific examples of the alkoxy group having 1 to 12 carbon atoms represented by $R^1$ to $R^{10}$ in the general formula [1], and specific preferred examples are also the same.

Specific examples of the halogen atom represented by $R^{1a}$ to $R^{10a}$ in the general formula [1-A], $R^{1b}$ to $R^{8b}$ in the general formula [1-B], and $R^{1c}$ to $R^{8c}$ in the general formula [1-C] include the same ones as the specific examples of the halogen atom represented by $R^1$ to $R^{10}$ in the general formula [1], and specific preferred examples are also the same.

As $R^{1a}$, $R^{3a}$, $R^{6a}$, $R^{8a}$, $R^{9a}$, and $R^{10a}$ in the general formula [1-A], a hydrogen atom is preferable.

As $R^{2a}$ in the general formula [1-A], the group represented by the general formula [2] is preferable.

As $R^{4a}$ in the general formula [1-A], a hydrogen atom and the group represented by the general formula [2] are preferable.

As $R^{5a}$ and $R^{7a}$ in the general formula [1-A], a hydrogen atom and the group represented by the general formula [2] are preferable; and among these, the hydrogen atom is more preferable.

Examples of a preferred combination of $R^{1a}$ to $R^{10a}$ in the general formula [1-A] include combinations represented by <1> to <5> in Table 1.

TABLE 1

| Combination | $R^{1a}$ | $R^{2a}$ | $R^{3a}$ | $R^{4a}$ | $R^{5a}$ | $R^{6a}$ | $R^{7a}$ | $R^{8a}$ | $R^{9a}$ | |
|---|---|---|---|---|---|---|---|---|---|---|
| <1> | Hydrogen atom | General formula [2] | Hydrogen atom | Hydrogen atom | Hydrogen atom | Hydrogen atom | Hydrogen atom | Hydrogen atom | Hydrogen atom | Hydrogen atom |
| <2> | Hydrogen atom | General formula [2] | Hydrogen atom | Hydrogen atom | Hydrogen atom | Hydrogen atom | General formula [2] | Hydrogen atom | Hydrogen atom | Hydrogen atom |
| <3> | Hydrogen atom | General formula [2] | Hydrogen atom | General formula [2] | Hydrogen atom | Hydrogen atom | Hydrogen atom | Hydrogen atom | Hydrogen atom | Hydrogen atom |
| <4> | Hydrogen atom | General formula [2] | Hydrogen atom | General formula [2] | Hydrogen atom | Hydrogen atom | General formula [2] | Hydrogen atom | Hydrogen atom | Hydrogen atom |
| <5> | Hydrogen atom | General formula [2] | Hydrogen atom | General formula [2] | General formula [2] | Hydrogen atom | General formula [2] | Hydrogen atom | Hydrogen atom | Hydrogen atom |

As $R^{1b}$, $R^{3b}$, $R^{6b}$, and $R^{8b}$ in the general formula [1-B], a hydrogen atom is preferable.

As $R^{2b}$ in the general formula [1-B], the group represented by the general formula [2] is preferable.

As $R^{4b}$ in the general formula [1-B], a hydrogen atom and the group represented by the general formula [2] are preferable.

As $R^{5b}$ and $R^{7b}$ in the general formula [1-B], a hydrogen atom and the group represented by the general formula [2] are preferable; and among these, the hydrogen atom is more preferable.

As $Y_1$ in the general formula [1-B], a sulfur atom is preferable.

Examples of a preferred combination of $Y_1$ and $R^{1b}$ to $R^{8b}$ in the general formula [1-B] include combinations represented by <1> to <10> in Table 2.

TABLE 2

| Combination | $Y_1$ | $R^{1b}$ | $R^{2b}$ | $R^{3b}$ | $R^{4b}$ | $R^{5b}$ | $R^{6b}$ | $R^{7b}$ | $R^{8b}$ |
|---|---|---|---|---|---|---|---|---|---|
| <1> | Oxygen atom | Hydrogen atom | General formula [2] | Hydrogen atom | Hydrogen atom | Hydrogen atom | Hydrogen atom | Hydrogen atom | Hydrogen atom |
| <2> | Oxygen atom | Hydrogen atom | General formula [2] | Hydrogen atom | Hydrogen atom | Hydrogen atom | Hydrogen atom | General formula [2] | Hydrogen atom |
| <3> | Oxygen atom | Hydrogen atom | General formula [2] | Hydrogen atom | General formula [2] | Hydrogen atom | Hydrogen atom | Hydrogen atom | Hydrogen atom |
| <4> | Oxygen atom | Hydrogen atom | General formula [2] | Hydrogen atom | General formula [2] | Hydrogen atom | Hydrogen atom | General formula [2] | Hydrogen atom |
| <5> | Oxygen atom | Hydrogen atom | General formula [2] | Hydrogen atom | General formula [2] | General formula [2] | Hydrogen atom | General formula [2] | Hydrogen atom |

TABLE 2-continued

| Combination | $Y_1$ | $R^{1b}$ | $R^{2b}$ | $R^{3b}$ | $R^{4b}$ | $R^{5b}$ | $R^{6b}$ | $R^{7b}$ | $R^{8b}$ |
|---|---|---|---|---|---|---|---|---|---|
| <6> | Sulfur atom | Hydrogen atom | General formula [2] | Hydrogen atom | Hydrogen atom | Hydrogen atom | Hydrogen atom | Hydrogen atom | Hydrogen atom |
| <7> | Sulfur atom | Hydrogen atom | General formula [2] | Hydrogen atom | Hydrogen atom | Hydrogen atom | Hydrogen atom | General formula [2] | Hydrogen atom |
| <8> | Sulfur atom | Hydrogen atom | General formula [2] | Hydrogen atom | General formula[2] | Hydrogen atom | Hydrogen atom | Hydrogen atom | Hydrogen atom |
| <9> | Sulfur atom | Hydrogen atom | General formula [2] | Hydrogen atom | General formula [2] | Hydrogen atom | Hydrogen atom | General formula [2] | Hydrogen atom |
| <10> | Sulfur atom | Hydrogen atom | General formula [2] | Hydrogen atom | General formula [2] | General formula [2] | Hydrogen atom | General formula [2] | Hydrogen atom |

As $R^{1c}$, $R^{2c}$, $R^{4c}$, $R^{5c}$, and $R^{8c}$ in the general formula [1-C], a hydrogen atom and the group represented by the general formula [2] are preferable.

As $R^{3c}$ and $R^{6c}$ in the general formula [1-C], a hydrogen atom is preferable.

As $R^{7c}$ in the general formula [1-C], a hydrogen atom and the group represented by the general formula [2] are preferable; and among these, the hydrogen atom is more preferable.

Examples of a preferred combination of $R^{1c}$ to $R^{8c}$ in the general formula [1-C] include combinations represented by <1> to <11> in Table 3.

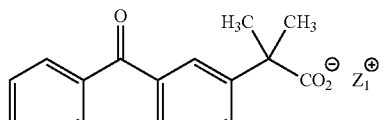

[1-A2]

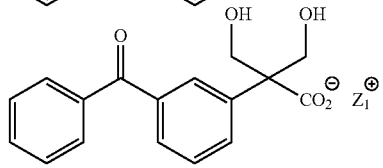

[1-A3]

TABLE 3

| Combination | $R^{1c}$ | $R^{2c}$ | $R^{3c}$ | $R^{4c}$ | $R^{5c}$ | $R^{6c}$ | $R^{7c}$ | $R^{8c}$ |
|---|---|---|---|---|---|---|---|---|
| <1> | Hydogen atom | General formula [2] | Hydogen atom | Hydogen atom | Hydogen atom | Hydogen atom | Hydogen atom | Hydogen atom |
| <2> | Hydogen atom | General formula [2] | Hydogen atom | Hydogen atom | Hydogen atom | Hydogen atom | General formula [2] | Hydogen atom |
| <3> | Hydogen atom | General formula [2] | Hydogen atom | General formula [2] | Hydogen atom | Hydogen atom | Hydogen atom | Hydogen atom |
| <4> | Hydogen atom | General formula [2] | Hydogen atom | General formula [2] | Hydogen atom | Hydogen atom | General formula [2] | Hydogen atom |
| <5> | Hydogen atom | General formula [2] | Hydogen atom | General formula [2] | General formula [2] | Hydogen atom | General formula [2] | Hydogen atom |
| <6> | General formula [2] | Hydogen atom | Hydogen atom | Hydogen atom | Hydogen atom | Hydogen atom | Hydogen atom | Hydogen atom |
| <7> | General formula [2] | Hydogen atom | Hydogen atom | General formula [2] | Hydogen atom | Hydogen atom | Hydogen atom | Hydogen atom |
| <8> | General formula [2] | Hydogen atom | Hydogen atom | Hydogen atom | General formula [2] | Hydogen atom | Hydogen atom | Hydogen atom |
| <9> | General formula [2] | Hydogen atom | Hydogen atom | Hydogen atom | Hydogen atom | Hydogen atom | Hydogen atom | General formula [2] |
| <10> | General formula [2] | Hydogen atom | Hydogen atom | General formula [2] | General formula [2] | Hydogen atom | Hydogen atom | General formula [2] |
| <11> | General formula [2] | General formula [2] | General formula [2] | General formula [2] | General formula [2] | General formula [2] | General formula [2] | General formula [2] |

Specific examples of (A) compound represented by the general formula [1-A] include compounds represented by the formulae [1-A1] to [1-A10].

Formulae [1-A1] to [1-A10]:

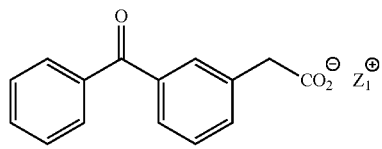

[1-A1]

-continued

[1-A4]

[1-A5]

-continued
[1-A6]
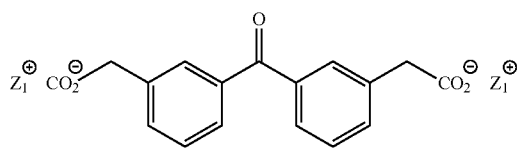
[1-A7]
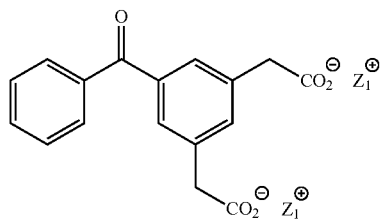
[1-A8]
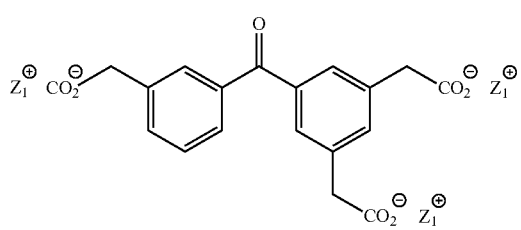
[1-A9]
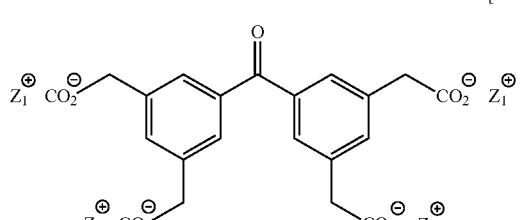
[1-A10]
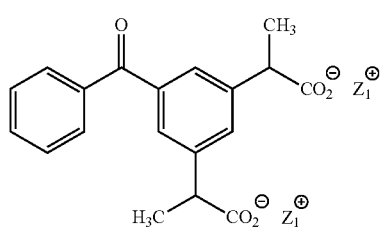
Specific examples of (A) compound represented by the general formula [1-B] include compounds represented by the formulae [1-B1] to [1-B12].
Formulae [1-B1] to [1-B12]:
[1-B1]
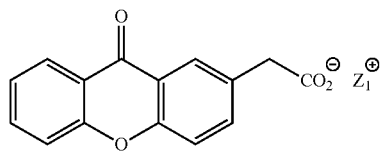
[1-B2]
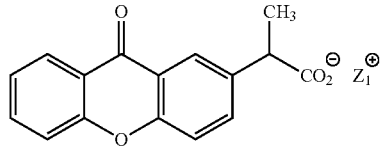
-continued
[1-B3]
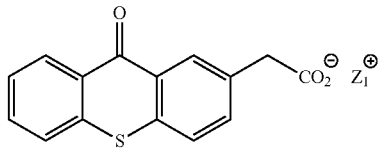
[1-B4]
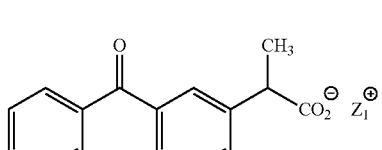
[1-B5]
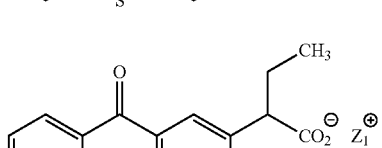
[1-B6]
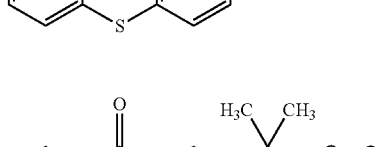
[1-B7]
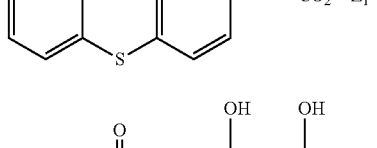
[1-B8]
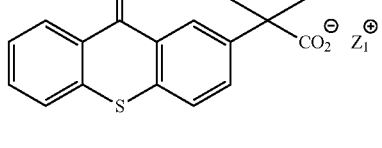
[1-B9]
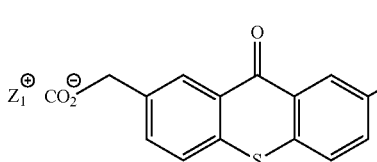
[1-B10]
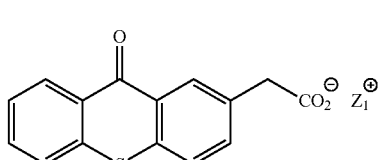

[1-B11]
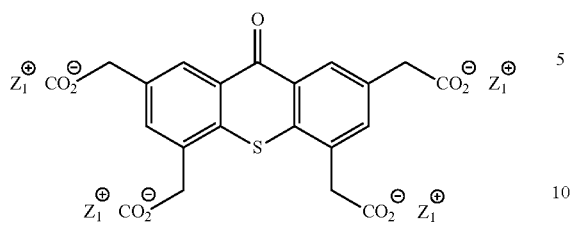
[1-B12]
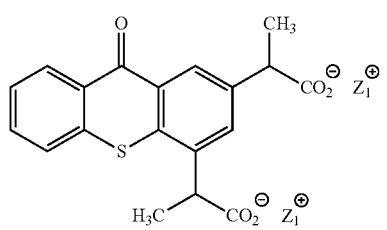
Specific examples of (A) compound represented by the general formula [1-C] include compounds represented by the formulae [1-C1] to [1-C14].
Formulae [1-C1] to [1-C14]:
[1-C1]
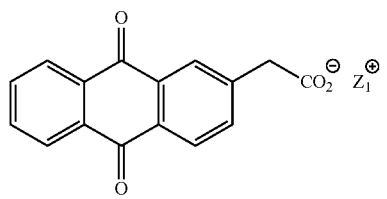
[1-C2]
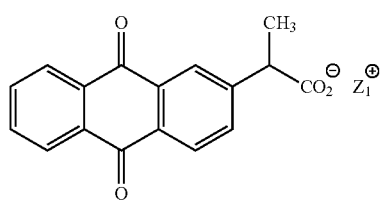
[1-C3]
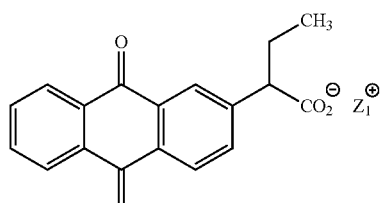
[1-C4]
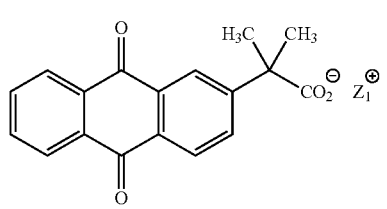
[1-C5]
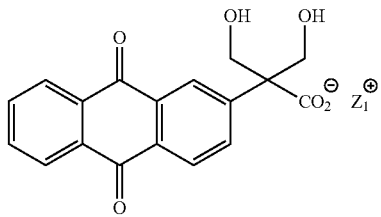
[1-C6]
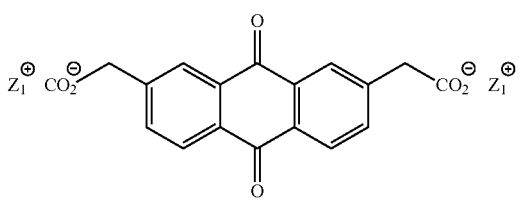
[1-C7]
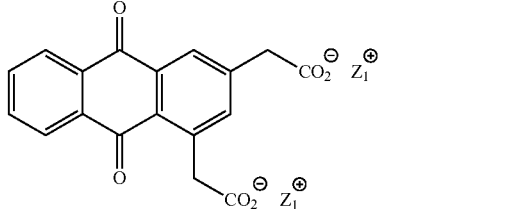
[1-C8]
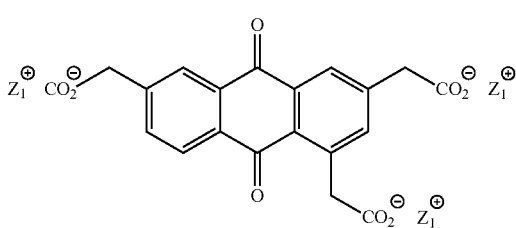
[1-C9]
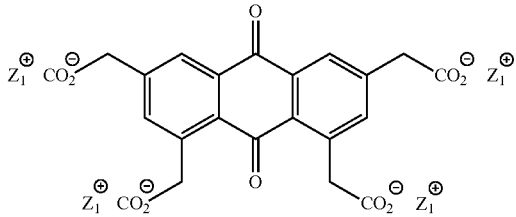
[1-C10]
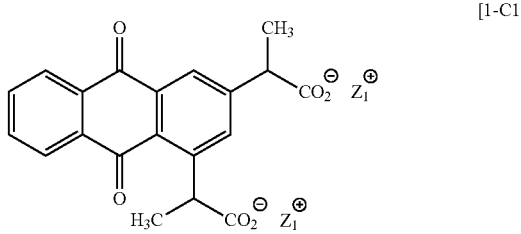
[1-C11]
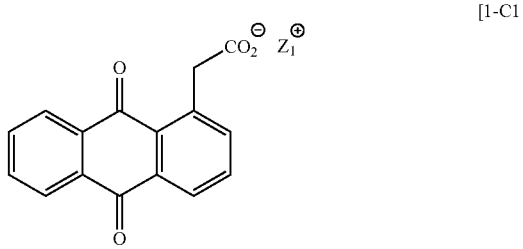

-continued

[1-C12]

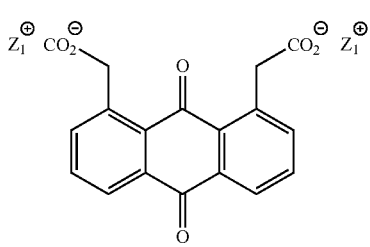

[1-C13]

[1-C14]

From the viewpoint of ease of availability of raw materials in production of the (A) compound and economic efficiency, the compound represented by the general formula [1-A] and the compound represented by the general formula [1-B] are preferable as the (A) compound. In addition, in a case where a weather resistance aid is used in the light- or heat-curing method of the embodiment of the present invention, the compound represented by the general formula [1-B] in which $Y_1$ is a sulfur atom is preferable among (A) compounds. Such a compound exhibits sensitivity to light (active energy rays) having a main wavelength at 350 to 450 nm, and therefore, it is possible to allow polycondensation (gelation) and a thiol-ene reaction or polycondensation (gelation) and a thiol-yne reaction to smoothly proceed while not hindering the absorption of the light (active energy rays) by the weather resistance aid.

The cation represented by $Z_1^+$ in the general formula [2] of the general formula [1] represents any one of cations containing "an amidinium cation, a guanidinium cation, or a biguanidinium cation", and among these, a cation having an active proton is preferable. Specific examples of such a cation include an "amidinium cation" represented by the general formula [3], a "guanidinium cation" represented by the general formula [4], and a "biguanidinium cation" represented by the general formula [5].

General formula [3]:

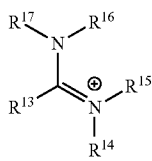

[3]

In the formula [3], $R^{13}$ to $R^{17}$ each independently represent a hydrogen atom or an alkyl group having 1 to 12 carbon atoms; or represent a state where $R^{13}$ and $R^{17}$ and/or $R^{15}$ and $R^{16}$ are bonded to each other through an alkylene group having 2 to 8 carbon atoms, provided that at least one of the groups represented by $R^{13}$ to $R^{17}$ represents a hydrogen atom.

General formula [4]:

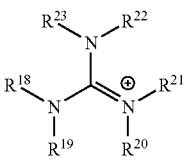

[4]

In the formula [4], $R^{18}$ to $R^{23}$ each independently represent a hydrogen atom or an alkyl group having 1 to 12 carbon atoms; or represent a state where $R^{18}$ and $R^{23}$ and/or $R^{19}$ and $R^{20}$ are bonded to each other through an alkylene group having 2 to 4 carbon atoms, provided that at least one of the groups represented by $R^{18}$ to $R^{23}$ represents a hydrogen atom.

General formula [5]:

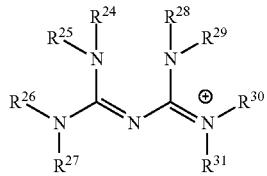

[5]

In the formula [5], $R^{24}$ to $R^{28}$ and $R^{31}$ each independently represent a hydrogen atom or an alkyl group having 1 to 12 carbon atoms, and $R^{29}$ and $R^{30}$ each independently represent a hydrogen atom; an alkyl group having 1 to 12 carbon atoms; or an aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group; or represent a state where $R^{29}$ and $R^{30}$ are bonded to each other through an alkylene group having 2 to 4 carbon atoms, provided that at least one of the groups represented by $R^{24}$ to $R^{31}$ represents a hydrogen atom.

Specific examples of the alkyl group having 1 to 12 carbon atoms represented by $R^{13}$ to $R^{17}$ in the general formula [3] include the same ones as the specific examples of the alkyl group having 1 to 12 carbon atoms represented by $R^1$ to $R^{10}$ in the general formula [1], and specific preferred examples are also the same.

As the alkylene group having 2 to 8 carbon atoms in a case where "$R^{13}$ and $R^{17}$ and/or $R^{15}$ and $R^{16}$ are bonded to each other through an alkylene group having 2 to 8 carbon atoms" in the general formula [3], an alkylene group having 3 to 5 carbon atoms is preferable. In addition, such an alkylene group may be either linear or branched groups, and among these, it is preferably the linear group. Specific examples of such the alkylene group include a dimethylene group (ethylene group), a trimethylene group, a propylene group, a tetramethylene group, a 1-methyltrimethylene group, a 2-methyltrimethylene group, a 1,2-dimethyldimethylene group (1,2-dimethylethylene group), a 1,1-dimethyldimethylene group (1,1-dimethylethylene group), an ethyldimethylene group (ethylethylene group), a pentamethylene group, a hexamethylene group, a heptamethylene group, and an octamethylene group. Among these alkylene groups, the trimethylene group, the tetramethylene group, and the pentamethylene group, each of which is a linear alkylene group having 3 to 5 carbon atoms, are preferable.

In a case where "$R^{13}$ and $R^{17}$ are bonded to each other through an alkylene group having 2 to 8 carbon atoms" in the general formula [3], the alkylene group and a —C—N— group bonded to the alkylene group to form a 4- to 10-membered cyclic structure.

Specific examples of the cyclic structure include a pyrrolidine ring (tetramethylene imine ring), a 2-methylpyrrolidine ring, a 3-methylpyrrolidine ring, a piperidine ring (pentamethylene imine ring), a 2-methylpiperidine ring, a 3-methylpiperidine ring, a 4-methylpiperidine ring, a hexamethylene imine ring, a heptamethylene imine ring, an octamethylene imine ring, a nonamethylene imine ring, and a decamethylene imine ring. Among these cyclic structures, the pyrrolidine ring (tetramethylene imine ring) and the hexamethylene imine ring are preferable.

In a case where "$R^{15}$ and $R^{16}$ are bonded to each other to represent an alkylene group having 2 to 8 carbon atoms" in the general formula [3], the alkylene group and a —N=C—N— group bonding to the alkylene group to form a 5- to 11-membered cyclic structure.

Specific examples of the cyclic structure include an imidazoline ring, a 1,4,5,6-tetrahydropyrimidine ring, a 4-methylimidazoline ring, a 5-methylimidazoline ring, a 1,3-diaza-2-cycloheptene ring, a 1,4,5,6-tetrahydro-4-methylpyrimidine ring, a 1,4,5,6-tetrahydro-5-methylpyrimidine ring, a 1,4,5,6-tetrahydro-6-methylpyrimidine ring, a 4-ethylimidazoline ring, a 5-ethylimidazoline ring, a 4,4-dimethylimidazoline ring, a 4,5-dimethylimidazoline ring, and a 5,5-dimethylimidazoline ring. Among these cyclic structures, the imidazoline ring is preferable.

As $R^{13}$ and $R^{17}$ in the general formula [3], an alkyl group having 1 to 12 carbon atoms is preferable or it is preferable that $R^{13}$ and $R^{17}$ are bonded to each other through an alkylene group having 2 to 8 carbon atoms, and among these, it is more preferable that $R^{13}$ and $R^{17}$ are bonded to each other through an alkylene group having 2 to 8 carbon atoms.

As $R^{14}$ in the general formula [3], a hydrogen atom and an alkyl group having 1 to 12 carbon atoms are preferable; and among these, the hydrogen atom is more preferable.

As $R^{15}$ and $R^{16}$ in the general formula [3], an alkyl group having 1 to 12 carbon atoms is preferable or it is preferable that $R^{15}$ and $R^{16}$ are bonded to each other through an alkylene group having 2 to 8 carbon atoms, and among these, it is more preferable that $R^{15}$ and $R^{16}$ are bonded to each other through an alkylene group having 2 to 8 carbon atoms.

In the general formula [3], it is preferable that both of $R^{13}$ and $R^{17}$, and $R^{15}$ and $R^{16}$ are bonded to each other through an alkylene group having 2 to 8 carbon atoms. That is, as the amidinium cation represented by the general formula [3], a cation forming a fused ring is preferable.

Specific examples of the alkyl group having 1 to 12 carbon atoms represented by $R^{18}$ to $R^{23}$ in the general formula [4] include the same ones as the specific examples of the alkyl group having 1 to 12 carbon atoms represented by $R^1$ to $R^{10}$ in the general formula [1], and specific preferred examples are also the same.

As the alkylene group having 2 to 4 carbon atoms in a case where "$R^{18}$ and $R^{23}$ and/or $R^{19}$ and $R^{20}$ are bonded to each other through an alkylene group having 2 to 4 carbon atoms" in the general formula [4], an alkylene group having 3 carbon atoms is preferable. In addition, the alkylene group may be either linear or branched groups, and among these, the linear groups are preferable. Specific examples of the alkylene groups include a dimethylene group (ethylene group), a trimethylene group, a propylene group, a tetramethylene group, a 1-methyltrimethylene group, a 2-methyltrimethylene group, a 1,2-dimethyldimethylene group (1,2-dimethylethylene group), 1,1-dimethyldimethylene group (1,1-dimethylethylene group), and an ethyldimethylene group (ethylethylene group). Among these alkylene groups, the trimethylene group is preferable.

In a case where "$R^{18}$ and $R^{23}$ are bonded to each other through an alkylene group having 2 to 4 carbon atoms" in the general formula [4], the alkylene group and a —N—C—N— group bonded to the alkylene group to form a 5- to 7-membered cyclic structure.

Specific examples of the cyclic structure include an imidazolidine ring, a hexahydropyrimidine ring, a 4-methylimidazolidine ring, a 1,3-diazacycloheptane ring, a hexahydro-4-methylpyrimidine ring, a hexahydro-5-methylpyrimidine ring, a 4-ethylimidazolidine ring, a 4,4-dimethylimidazolidine ring, and a 4,5-dimethylimidazolidine ring. Among these cyclic structures, the hexahydropyrimidine ring is preferable.

In a case where "$R^{19}$ and $R^{20}$ are bonded to each other to represent an alkylene group having 2 to 4 carbon atoms" in the general formula [4], the alkylene group and a —N—C=N— group bonding to the alkylene group to form a 5- to 7-membered cyclic structure.

Specific examples of the cyclic structure include an imidazoline ring, a 1,4,5,6-tetrahydropyrimidine ring, a 4-methylimidazoline ring, a 5-methylimidazoline ring, a 1,3-diaza-2-cycloheptene ring, a 1,4,5,6-tetrahydro-4-methylpyrimidine ring, a 1,4,5,6-tetrahydro-5-methylpyrimidine ring, a 1,4,5,6-tetrahydro-6-methylpyrimidine ring, a 4-ethylimidazoline ring, a 5-ethylimidazoline ring, a 4,4-dimethylimidazoline ring, a 4,5-dimethylimidazoline ring, and a 5,5-dimethylimidazoline ring. Among these cyclic structures, the 1,4,5,6-tetrahydropyrimidine ring is preferable.

As $R^{18}$ and $R^{23}$ in the general formula [4], an alkyl group having 1 to 12 carbon atoms is preferable, or it is preferable that $R^{18}$ and $R^{23}$ are bonded to each other through an alkylene group having 2 to 4 carbon atoms.

As $R^{19}$ and $R^{20}$ in the general formula [4], an alkyl group having 1 to 12 carbon atoms is preferable, or it is preferable that $R^{19}$ and $R^{20}$ are bonded to each other through an alkylene group having 2 to 4 carbon atoms.

In a case where $R^{18}$ and $R^{23}$ in the general formula [4] are bonded to each other through an alkylene group having 2 to 4 carbon atoms, it is preferable that $R^{19}$ and $R^{20}$ are bonded to each other through an alkylene group having 2 to 4 carbon atoms. That is, in a case where $R^{18}$ and $R^{23}$ are bonded to each other to form a cyclic structure, it is preferable that $R^{19}$ and $R^{20}$ are bonded to each other to form a cyclic structure such that the guanidinium cation represented by the general formula [4] becomes a cation forming a fused ring.

As $R^{21}$ in the general formula [4], a hydrogen atom and an alkyl group having 1 to 12 carbon atoms are preferable; and among these, the hydrogen atom is more preferable.

As $R^2$ in the general formula [4], a hydrogen atom and an alkyl group having 1 to 12 carbon atoms are preferable.

Specific examples of the alkyl group having 1 to 12 carbon atoms represented by $R^{24}$ to $R^{31}$ in the general formula [5] include the same ones as the specific examples of the alkyl group having 1 to 12 carbon atoms represented by $R^1$ to $R^{10}$ in the general formula [1].

Among these alkyl groups, as the alkyl group represented by $R^{24}$ to $R^{28}$ and $R^{31}$, a linear, branched, or cyclic alkyl group having 1 to 6 carbon atoms is preferable; among these, a linear, branched, or cyclic alkyl group having 1 to 4 carbon atoms is preferable; and among these, a methyl group is particularly preferable. Specific preferred examples thereof also include the same ones as the specific examples of the preferred alkyl group represented by $R^1$ to $R^{10}$ in the general formula [1].

In addition, as the alkyl group represented by $R^{29}$ and $R^{30}$, a linear, branched, or cyclic alkyl group having 2 to 8 carbon atoms is preferable; among these, a linear, branched, or cyclic alkyl group having 3 to 6 carbon atoms is preferable; and among these, the branched or cyclic alkyl groups having 3 to 6 carbon atoms are particularly preferable.

As $R^{24}$ to $R^{27}$ in the general formula [5], an alkyl group having 1 to 12 carbon atoms is preferable, and in particular, it is more preferable that all of $R^{24}$ to $R^{27}$ are alkyl groups having 1 to 12 carbon atoms.

As $R^{28}$ and $R^{31}$ in the general formula [5], a hydrogen atom is preferable, and in particular, it is more preferable that both of $R^{28}$ and $R^{31}$ are hydrogen atoms.

"The alkyl group having 6 to 14 carbon atoms, which may have a substituent" in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5] means that the aryl group encompasses both of an aryl group having 6 to 14 carbon atoms which does not have a substituent and an aryl group having 6 to 14 carbon atoms which has a substituent.

The aryl group having 6 to 14 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5] may be either a monocyclic or a fused polycyclic group, and among these, an aryl group having 6 carbon atoms is preferable. Specific examples of such an aryl group include a phenyl group, a naphthyl group, and an anthracenyl group. Among these aryl groups, the phenyl group is preferable. It should be noted that the number of carbon atoms in the aryl group shown herein means the number of carbon atoms constituting the aryl group, and the number of carbon atoms constituting a substituent is not contained in the number of carbon atoms represented by "6 to 14 carbon atoms" in "the aryl group having 6 to 14 carbon atoms".

As the alkyl group having 1 to 6 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5], an alkyl group having 1 to 3 carbon atoms is preferable. In addition, the alkyl group may be any of linear, branched, and cyclic groups. Specific examples of such the alkyl group include a methyl group, an ethyl group, an n-propyl group, an isopropyl group, a cyclopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, and a cyclohexyl group. Among these alkyl groups, linear, branched, or cyclic alkyl groups having 1 to 3 carbon atoms are preferable.

As the alkoxy group having 1 to 6 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5], an alkoxy group having 1 to 3 carbon atoms is preferable. In addition, the alkoxy group may be any of linear, branched, and cyclic groups. Specific examples of such an alkoxy group include a methoxy group, an ethoxy group, an n-propoxy group, an isopropoxy group, a cyclopropoxy group, an n-butoxy group, an isobutoxy group, a sec-butoxy group, a tert-butoxy group, a cyclobutoxy group, an n-pentyloxy group, an isopentyloxy group, a sec-pentyloxy group, a tert-pentyloxy group, a neopentyloxy group, a 2-methylbutoxy group, a 1,2-dimethylpropoxy group, a 1-ethylpropoxy group, a cyclopentyloxy group, an n-hexyloxy group, an isohexyloxy group, a sec-hexyloxy group, a tert-hexyloxy group, a neohexyloxy group, a 2-methylpentyloxy group, a 1,2-dimethylbutoxy group, a 2,3-dimethylbutoxy group, a 1-ethylbutoxy group, and a cyclohexyloxy group. Among these alkoxy groups, the linear, branched, or cyclic alkoxy groups having 1 to 3 carbon atoms are preferable.

As the alkylthio group having 1 to 6 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5], an alkylthio group having 1 to 3 carbon atoms is preferable. In addition, the alkylthio group may be any of linear, branched, and cyclic groups. Specific examples of such an alkylthio group include a methylthio group, an ethylthio group, an n-propylthio group, an isopropylthio group, a cyclopropylthio group, an n-butylthio group, an isobutylthio group, a sec-butylthio group, a tert-butylthio group, a cyclobutylthio group, an n-pentylthio group, an isopentylthio group, a sec-pentylthio group, a tert-pentylthio group, a neopentylthio group, a 2-methylbutylthio group, a 1,2-dimethylpropylthio group, a 1-ethylpropylthio group, a cyclopentylthio group, an n-hexylthio group, an isohexylthio group, a sec-hexylthio group, a tert-hexylthio group, a neohexylthio group, a 2-methylpentylthio group, a 1,2-dimethylbutylthio group, a 2,3-dimethylbutylthio group, a 1-ethylbutylthio group, and a cyclohexylthio group. Among these alkylthio groups, the linear, branched, or cyclic alkylthio groups having 1 to 3 carbon atoms are preferable.

As the dialkylamino group having 2 to 12 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5], a dialkylamino group having 2 to 6 carbon atoms is preferable. In addition, the dialkylamino group may be any of linear, branched, and cyclic groups. Specific examples of such a dialkylamino group include an N,N-dimethylamino group, an N,N-diethylamino group, an N,N-di-n-propylamino group, an N,N-diisopropylamino group, an N,N-dicyclopropylamino group, an N,N-di-n-butylamino group, an N,N-diisobutylamino group, an N,N-di-sec-butylamino group, an N,N-di-tert-butylamino group, an N,N-dicyclobutylamino group, an N,N-di-n-pentylamino group, an N,N-diisopentylamino group, an N,N-di-sec-pentylamino group, an N,N-di-tert-pentylamino group, an N,N-dineopentylamino group, an N,N-di(2-methylbutyl)amino group, an N,N-bis(1,2-dimethylpropyl)amino group, an N,N-di(1-ethylpropyl)amino group, an N,N-dicyclopentylamino group, an N,N-di-n-hexylamino group, an N,N-diisohexylamino group, an N,N-di-sec-hexylamino group, an N,N-di-tert-hexylamino group, an N,N-dineohexylamino group, an N,N-di(2-methylpentyl)amino group, an N,N-bis(1,2-dimethylbutyl)amino group, an N,N-bis(2,3-dimethylbutyl)amino group, an N,N-di(1-ethylbutyl)amino group, an N,N-dicyclohexylamino group, an N,N-ethylmethylamino group, an N,N-methyl-n-propylamino group, an N,N-methylisopropylamino group, an N,N-methylcyclopropylamino group, an N,N-n-butylmethylamino group, an N,N-isobutylmethylamino group, an N,N-sec-butylmethylamino group, an N,N-tert-butylmethylamino group, an N,N-cyclobutylmethylamino group, an N,N-methyl-n-pentylamino group, an N,N-n-hexylmethylamino group, an N,N-n-heptylmethylamino group, an N,N-methyl-n-octylamino group, an N,N-methyl-n-nonylamino group, an N,N-n-decylmethylamino group, an N,N-methyl-n-undecylamino group, an N,N-ethyl-n-propylamino group, an N,N-ethylisopropylamino group, an N,N-ethylcyclopropylamino group, an N,N-n-butylethylamino group, an N,N-isobutylethylamino group, an N,N-sec-butylethylamino group, an N,N-tert-butylethylamino group, an N,N-cyclobutylethylamino group, an N,N-ethyl-n-pentylamino group, an N,N-ethyl-n-hexylamino group, an N,N-ethyl-n-heptylamino group, an N,N-ethyl-n-octylamino group, an N,N-ethyl-n-nonylamino group, an N,N-ethyl-n-decylamino group, an N,N-n-propylisopropylamino group, an N,N-n-propylcyclopropylamino group, an N,N-n-butyl-n-propylamino group, an N,N-isobutyl-n-propylamino group, an N,N-sec-butyl-n-propylamino group, an N,N-tert-butyl-n-propylamino group, an N,N-cyclobutyl-n-propylamino group, an N,N-n-pentyl-n-propylamino group, an N,N-n-hexyl-n-propylamino group, an N,N-n-heptyl-n-propylamino group, an N,N-n-octyl-n-propylamino group, an N,N-n-nonyl-n-propylamino group, an N,N-isopropylcyclopropylamino group, an N,N-n-butylisopropylamino group, an N,N-isobutylisopropylamino group, an N,N-sec-butylisopropylamino group, an N,N-tert-butylisopropylamino group, an N,N-cyclobutylisopropylamino group, an N,N-n-pentylisopropylamino group, an N,N-n-hexylisopropylamino group, an N,N-n-heptylisopropylamino group, an N,N-n-octylisopropylamino group, an N,N-n-nonylisopropylamino group, an N,N-n-butylcyclopropylamino group, an N,N-isobutylcyclopropylamino group, an N,N-sec-butylcyclopropylamino group, an N,N-tert-butylcyclopropylamino group, an N,N-cyclobutylcyclopropylamino group, an N,N-n-pentylcyclopropylamino group, an N,N-n-hexylcyclopropylamino group, an N,N-n-heptylcyclopropylamino group, an N,N-n-octylcyclopropylamino group, an N,N-n-nonylcyclopropylamino group, an N,N-n-butylisobutylamino group, an N,N-n-butyl-sec-butylamino group, an N,N-n-butyl-tert-butylamino group, an N,N-n-butylcyclobutylamino group, an N,N-n-butyl-n-pentylamino group, an N,N-n-butyl-n-hexylamino group, an N,N-n-butyl-n-heptylamino group, an N,N-n-butyl-n-octylamino group, an N,N-isobutyl-sec-butylamino group, an N,N-isobutyl-tert-butylamino group, an N,N-isobutylcyclobutylamino group, an N,N-isobutyl-n-pentylamino group, an N,N-isobutyl-n-hexylamino group, an N,N-isobutyl-n-heptylamino group, an N,N-isobutyl-n-octylamino group, an N,N-sec-butyl-tert-butylamino group, an N,N-sec-butylcyclobutylamino group, an N,N-sec-butyl-n-pentylamino group, an N,N-sec-butyl-n-hexylamino group, an N,N-sec-butyl-n-heptylamino group, an N,N-sec-butyl-n-octylamino group, an N,N-tert-butylcyclobutylamino group, an N,N-tert-butyl-n-pentylamino group, an N,N-tert-butyl-n-hexylamino group, an N,N-tert-butyl-n-heptylamino group, an N,N-tert-butyl-n-octylamino group, an N,N-cyclobutyl-n-pentylamino group, an N,N-cyclobutyl-n-hexylamino group, an N,N-cyclobutyl-n-heptylamino group, an N,N-cyclobutyl-n-octylamino group, an N,N-n-hexyl-n-pentylamino group, and an N,N-n-heptyl-n-pentylamino group. Among these dialkylamino groups, the linear, branched, or cyclic dialkylamino groups having 2 to 6 carbon atoms are preferable.

Examples of the halogen atom in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5] include a fluorine atom, a chlorine atom, a bromine atom, and an iodine atom; and among these, the fluorine atom and the chlorine atom are preferable.

As "the substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5], the alkyl group having 1 to 6 carbon atoms, the alkoxy group having 1 to 6 carbon atoms, the halogen atom, and the nitro group are preferable; the alkyl group having 1 to 6 carbon atoms and the alkoxy group having 1 to 6 carbon atoms are more preferable; and the alkyl group having 1 to 6 carbon atoms are still more preferable.

Examples of the number of substituents on the aryl group having 6 to 14 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5] include integers of 0 (unsubstituted) to 9; among these, the integers of 0 (unsubstituted) to 5 are preferable; and among these, the integers of 0 (unsubstituted) to 2 are more preferable.

In a case where the aryl group having 6 to 14 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5] is a phenyl group, the position of a substituent on the phenyl group may be any one of the position 2 to the position 6; among these, the position 2, the position 4, or the position 6 is preferable; and among these, the position 2 or the position 6 is more preferable.

In a case where the aryl group having 6 to 14 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5] is a naphthyl group, the binding position of a nitrogen atom, which is bonded to $R^{29}$ or $R^{30}$, on the naphthyl group may be either the position 1 or the position 2.

For the naphthyl group, the binding position on the naphthyl group may be any one of the position 1 to the position 8, and among these, the position 1 to the position 4 are preferable. It should be noted that the position of a substituent does not overlap with the position of a nitrogen atom bonded to $R^{29}$ or $R^{30}$.

In a case where the aryl group having 6 to 14 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5] is an anthracenyl group, the binding position of a nitrogen atom, which is bonded to $R^{29}$ or $R^{30}$, on the anthracenyl group may be either the position 1, the position 2, or the position 9, and is preferably the position 9.

For the anthracenyl group, in a case where the binding position on the anthracenyl group of the nitrogen atom bonded to $R^{29}$ or $R^{30}$ may be either the position 1 or the position 2, the position of a substituent on the anthracenyl group is preferably any one of the position 1 to the position 10; and among these, the position 1 to the position 4 are preferable, provided that the position of a substituent does not overlap with the position of a nitrogen atom bonded to $R^{29}$ or $R^{30}$.

For the anthracenyl group, in a case where the binding position of a nitrogen atom, which is bonded to $R^{29}$ or $R^{30}$, on the anthracenyl group may be either the position 9, the position of a substituent on the anthracenyl group may be any one of the position 1, the position 8, or the position 10, and among these, the position 10 is preferable.

Specific examples of "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5] include aryl groups having 6 to 14 carbon atoms, which do not have a substituent (unsubstituted aryl groups), such as a phenyl group, a naphthyl group, and an anthracenyl group; aryl groups having 6 to 14 carbon atoms, which are substituted with an alkyl group having 1 to 6 carbon atoms (which have alkyl groups having 1 to 6 carbon atoms), such as a 2-methylphenyl group, a 3-methylphenyl group, a 4-methylphenyl group, a 2,4-dimethylphenyl group, a 2,6-dimethylphenyl group, a 2,4,6-trimethylphenyl group, a 2,6-diethylphenyl group, a 2,6-di-n-propylphenyl group, a 2,6-diisopropylphenyl group, a 1-(2-methyl)naphthyl group, a 2-(1-methyl)naphthyl group, and a 9-(10-methyl)anthracenyl group; aryl groups having 6 to 14 carbon atoms, which are substituted with an alkoxy group having 1 to 6 carbon atoms (which have an alkoxy group having 1 to 6 carbon atoms), such as a 2-methoxyphenyl group, a 3-methoxyphenyl group, a 4-methoxyphenyl group, a 2,4-dimethoxyphenyl group, a 2,6-dimethoxyphenyl group, a 2,4,6-trimethoxyphenyl group, a 2,6-diethoxyphenyl group, a 2,6-di-n-propoxyphenyl group, a 2,6-diisopropoxyphenyl group, a 1-(2-methoxy)naphthyl group, a 2-(1-methoxy)naphthyl group, and a 9-(10-methoxy)anthracenyl group; aryl groups having 6 to 14 carbon atoms, which are substituted with an alkylthio group having 1 to 6 carbon atoms (which have an alkylthio group having 1 to 6 carbon atoms), such as a 2-methylthiophenyl group, a 3-methylthiophenyl group, a 4-methylthiophenyl group, a 2,4-dimethylthiophenyl group, a 2,6-dimethylthiophenyl group, a 2,4,6-trimethylthiophenyl group, a 2,6-diethylthiophenyl group, a 2,6-di-n-propylthiophenyl group, a 2,6-diisopropylthiophenyl group, a 1-(2-methylthio)naphthyl group, a 2-(1-methylthio)naphthyl group, and a 9-(10-methylthio)anthracenyl group; aryl groups having 6 to 14 carbon atoms, which are substituted with a dialkylamino group having 2 to 12 carbon atoms (which have a dialkylamino group having 2 to 12 carbon atoms), such as a 2-(N,N-dimethylamino)phenyl group, a 3-(N,N-dimethylamino)phenyl group, a 4-(N,N-dimethylamino)phenyl group, a 2,4-bis(N,N-dimethylamino)phenyl group, a 2,6-bis(N,N-dimethylamino)phenyl group, a 2,4,6-tris(N,N-dimethylamino)phenyl group, a 2,6-bis(N,N-diethylamino)phenyl group, a 2,6-bis(N,N-di-n-propylamino)phenyl group, a 2,6-bis(N,N-diisopropylamino)phenyl group, a 1-[2-(N,N-dimethylamino)]naphthyl group, a 2-[1-(N,N-dimethylamino)]naphthyl group, and a 9-[10-(N,N-dimethylamino)]anthracenyl group; aryl groups having 6 to 14 carbon atoms, which are substituted with a halogen atom (which have a halogen atom), such as a 2-fluorophenyl group, a 3-fluorophenyl group, a 4-fluorophenyl group, a 2,4-difluorophenyl group, a 2,6-difluorophenyl group, a 2,4,6-trifluorophenyl group, a 2,6-dichlorophenyl group, a 2,6-dibromophenyl group, a 2,6-diiodophenyl group, a 1-(2-fluoro)naphthyl group, a 2-(1-fluoro)naphthyl group, and a 9-(10-fluoro)anthracenyl group; and aryl groups having 6 to 14 carbon atoms, which are substituted with a nitro group (which have a nitro group), such as a 2-nitrophenyl group, a 3-nitrophenyl group, a 4-nitrophenyl group, a 2,4-dinitrophenyl group, a 2,6-dinitrophenyl group, a 2,4,6-trinitrophenyl group, a 1-(2-nitro)naphthyl group, a 2-(1-nitro)naphthyl group, and a 9-(10-nitro)anthracenyl group. Among these aryl groups having 6 to 14 carbon atoms, the aryl groups having 6 to 14 carbon atoms, which do not have a substituent (unsubstituted aryl groups); the aryl groups having 6 to 14 carbon atoms, which are substituted with an alkyl group having 1 to 6 carbon atoms (which have an alkyl group having 1 to 6 carbon atoms); the aryl groups having 6 to 14 carbon atoms, which are substituted with an alkoxy group having 1 to 6 carbon atoms (which have an alkoxy group having 1 to 6 carbon atoms); the aryl groups having 6 to 14 carbon atoms, which are substituted with a halogen atom (which have a halogen atom); and the aryl groups having 6 to 14 carbon atoms, which are substituted with a nitro group (which have a nitro group) are preferable; among these, the aryl groups having 6 to 14 carbon atoms, which do not have a substituent (unsubstituted aryl groups); the aryl groups having 6 to 14 carbon atoms, which are substituted with an alkyl group having 1 to 6 carbon atoms (which have an alkyl group having 1 to 6 carbon atoms); and the aryl groups having 6 to 14 carbon atoms, which are substituted with an alkoxy group having 1 to 6 carbon atoms (which have an alkoxy group having 1 to 6 carbon atoms) are more preferable, and among these, the aryl groups having 6 to 14 carbon atoms, which do not have a substituent (unsubstituted aryl groups); and the aryl groups having 6 to 14 carbon atoms, which are substituted with an alkyl group having 1 to 6 carbon atoms (which have an alkyl group having 1 to 6 carbon atoms) are still more preferable. It should be noted that in the specific examples, the alkyl group, the alkoxy group, the alkylthio group, and the dialkylamino group, which are substituted with an aryl group having 6 to 14 carbon atoms, in "the alkyl groups having 1 to 6 carbon atoms, the alkoxy groups having 1 to 6 carbon atoms, the alkylthio groups having 1 to 6 carbon atoms, and the dialkylamino groups having 2 to 12 carbon atoms" are not limited to normal-forms, and branched forms such as a sec-form, a tert-form, an iso-form, and a neo-form, or cyclic forms such as a cyclo-form are also contained in the specific examples. In addition, the number of carbon atoms constituting the substituents means the number of carbon atoms contained in each of the substituents and does not mean the total number of carbon atoms counted in a case where there is a plurality of substituents.

As the alkylene group having 2 to 4 carbon atoms in a case where "$R^{29}$ and $R^{30}$ are bonded to each other through an alkylene group having 2 to 4 carbon atoms" in the general formula [5], an alkylene group having 2 carbon atoms is preferable. In addition, the alkylene group may be either linear or branched alkylene groups. Specific examples of such an alkylene group include a dimethylene group (ethylene group), a trimethylene group, a propylene group, a tetramethylene group, a 1-methyltrimethylene group, a 2-methyltrimethylene group, a 1,2-dimethyldimethylene group (1,2-dimethylethylene group), a 1,1-dimethyldimethylene group (1,1-dimethylethylene group), and an ethyldimethylene group (ethylethylene group). Among these alkylene groups, the dimethylene group (ethylene group) is preferable.

In a case where "$R^{29}$ and $R^{30}$ are bonded to each other through an alkylene group having 2 to 4 carbon atoms" in the general formula [5], the alkylene group and a —N—C=N— group bonded to the alkylene group to form a 5- to 7-membered cyclic structure.

Specific examples of the cyclic structure include an imidazoline ring, a 1,4,5,6-tetrahydropyrimidine ring, a 4-methylimidazoline ring, a 5-methylimidazoline ring, a 1,3-diaza-2-cycloheptene ring, a 1,4,5,6-tetrahydro-4-methylpyrimidine ring, a 1,4,5,6-tetrahydro-5-methylpyrimidine ring, a 1,4,5,6-tetrahydro-6-methylpyrimidine ring, a 4-ethylimidazoline ring, a 5-ethylimidazoline ring, a 4,4-dimethylimidazoline ring, a 4,5-dimethylimidazoline ring, and a 5,5-dimethylimidazoline ring. Among these cyclic structures, the imidazoline ring is preferable.

Specific examples of the amidinium cation represented by the general formula [3] include cations represented by the formulae [3-1] to [3-2].

Formulae [3-1] to [3-2]:

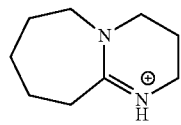

[3-1]

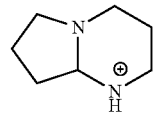

[3-2]

Specific examples of the guanidinium cation represented by the general formula [4] include cations represented by the formulae [4-1] to [4-3].

Formulae [4-1] to [4-3]:

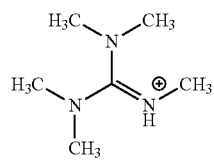

[4-1]

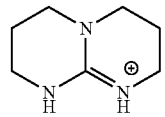

[4-2]

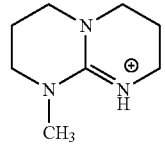

[4-3]

Specific examples of the biguanidinium cation represented by the general formula [5] include cations represented by the formulae [5-1] to [5-7].

Formulae [5-1] to [5-7]:

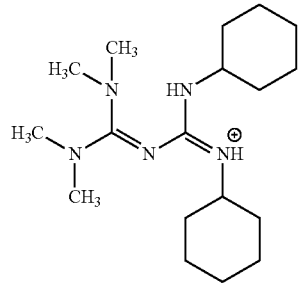

[5-1]

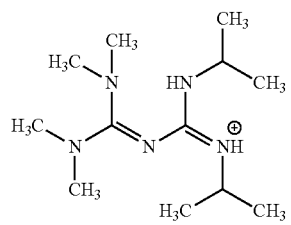

[5-2]

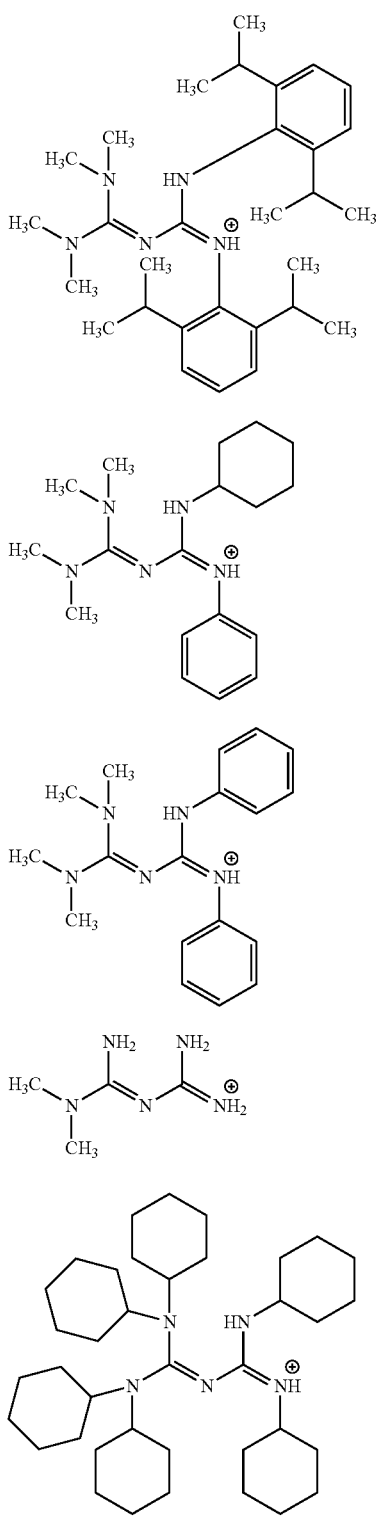

Among the cations represented by $Z_1^+$, a biguanidinium cation capable of generating a strong base is preferable. (A) Compound having such a biguanidinium cation can generate biguanide which is a strong base, and therefore, makes it possible to easily obtain a cured product (crosslinked product or resin) having desired crosslinking density, hardness, adhesiveness to a base material, organic solvent resistance, and the like in the light- or heat-curing method of the embodiment of the present invention.

Among the biguanidinium cations represented by the general formula [5], a biguanidinium cation represented by the general formula [5'] is preferable.

General formula [5']:

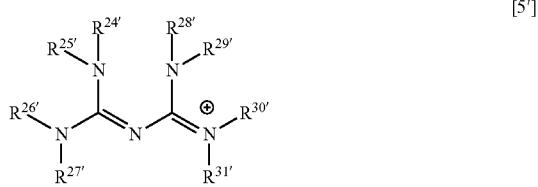

In the formula [5'], $R^{24'}$ to $R^{28'}$ and $R^{31'}$ each independently represent a hydrogen atom or an alkyl group having 1 to 6 carbon atoms, $R^{29'}$ and $R^{30'}$ each independently represent an alkyl group having 2 to 8 carbon atoms; or a phenyl group which may have a substituent selected from the group consisting of an alkyl group having 1 to 3 carbon atoms, an alkoxy group having 1 to 3 carbon atoms, a halogen atom, and a nitro group, provided that at least one of the groups represented by $R^{24'}$ to $R^{28'}$ and $R^{31'}$ represents a hydrogen atom.

Specific examples of the alkyl group having 1 to 6 carbon atoms represented by $R^{24'}$ to $R^{28'}$ and $R^{31'}$ in the general formula [5'] include the same ones as the specific examples of the alkyl group having 1 to 6 carbon atoms represented by $R^{24}$ to $R^{28}$ and $R^{31}$ in the general formula [5], and specific preferred examples are also the same.

As $R^{24'}$ to $R^{27'}$ in the general formula [5'], an alkyl group having 1 to 6 carbon atoms is preferable.

As $R^{28'}$ to $R^{31'}$ in the general formula [5'], a hydrogen atom is preferable, and in particular, it is more preferable that both of $R^{28'}$ and $R^{31'}$ are hydrogen atoms.

Specific examples of the alkyl group having 2 to 8 carbon atoms represented by $R^{29'}$ and $R^{30'}$ in the general formula [5'] include the same ones as the specific examples of the alkyl group having 2 to 8 carbon atoms represented by $R^{29}$ and $R^{30}$ in the general formula [5], and specific preferred examples are also the same.

In "the phenyl group which may have a substituent selected from the group consisting of an alkyl group having 1 to 3 carbon atoms, an alkoxy group having 1 to 3 carbon atoms, a halogen atom, and a nitro group" represented by $R^{29'}$ and $R^{30'}$ in the general formula [5'], the "phenyl group which may have a substituent" means that the phenyl group encompasses both of a phenyl group which does not have a substituent and a phenyl group which has a substituent.

Specific examples of the alkyl group having 1 to 3 carbon atoms in "the phenyl group which may have a substituent selected from the group consisting of an alkyl group having 1 to 3 carbon atoms, an alkoxy group having 1 to 3 carbon atoms, a halogen atom, and a nitro group" represented by represented by $R^{29'}$ and $R^{30'}$ in the general formula [5'] include the same ones as the specific preferred examples of the alkyl group having 1 to 3 carbon atoms that is a preferred example of the alkyl group having 1 to 6 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29'}$ and $R^{30'}$ in the general formula [5].

Specific examples of the alkoxy group having 1 to 3 carbon atoms in "the phenyl group which may have a substituent selected from the group consisting of an alkyl group having 1 to 3 carbon atoms, an alkoxy group having 1 to 3 carbon atoms, a halogen atom, and a nitro group" represented by $R^{29'}$ and $R^{30'}$ in the general formula [5'] include the same ones as the specific preferred examples of the alkoxy group having 1 to 3 carbon atoms that is a specific preferred example of the alkoxy group having 1 to 6 carbon atoms in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5].

Specific examples of the halogen atom in "the phenyl group which may have a substituent selected from the group consisting of an alkyl group having 1 to 3 carbon atoms, an alkoxy group having 1 to 3 carbon atoms, a halogen atom, and a nitro group" represented by $R^{29'}$ and $R^{30'}$ in the general formula [5'] include the same ones as the specific examples of the halogen atom in "the aryl group having 6 to 14 carbon atoms, which may have a substituent selected from the group consisting of an alkyl group having 1 to 6 carbon atoms, an alkoxy group having 1 to 6 carbon atoms, an alkylthio group having 1 to 6 carbon atoms, a dialkylamino group having 2 to 12 carbon atoms, a halogen atom, and a nitro group" represented by $R^{29}$ and $R^{30}$ in the general formula [5], and specific preferred examples are also the same.

As "the substituent selected from the group consisting of an alkyl group having 1 to 3 carbon atoms, an alkoxy group having 1 to 3 carbon atoms, a halogen atom, and a nitro group" represented by $R^{29'}$ and $R^{30'}$ in the general formula [5'], an alkyl group having 1 to 3 carbon atoms, and an alkoxy group having 1 to 3 carbon atoms are preferable; and among these, the alkyl group having 1 to 3 carbon atoms is more preferable.

In "the phenyl group which may have a substituent selected from the group consisting of an alkyl group having 1 to 3 carbon atoms, an alkoxy group having 1 to 3 carbon atoms, a halogen atom, and a nitro group" represented by $R^{29'}$ and $R^{30'}$ in the general formula [5'], the number of substituents on the phenyl group is, for example, an integer of 0 (unsubstituted) to 5, and among these, an integer of 0 (unsubstituted) to 2 is preferable.

In "the phenyl group which may have a substituent selected from the group consisting of an alkyl group having 1 to 3 carbon atoms, an alkoxy group having 1 to 3 carbon atoms, a halogen atom, and a nitro group" represented by $R^{29'}$ and $R^{30'}$ in the general formula [5'], the position of a substituent of the substituent on the phenyl group is the same as the position of a substituent of the substituent on the phenyl group in a case where the aryl group having 6 to 14 carbon atoms in "the aryl group having 6 to 14 carbon atoms, which may have a substituent selected from the group consisting of an alkyl group having 1 to 6 carbon atoms, an alkoxy group having 1 to 6 carbon atoms an alkylthio group having 1 to 6 carbon atoms, a dialkylamino group having 2 to 12 carbon atoms, a halogen atom, and a nitro group" represented by $R^{29}$ and $R^{30}$ in the general formula [5] is a phenyl group. The preferred position of a substituent and the more preferred position of a substituent are also the same.

Specific examples of "the phenyl group which may have a substituent selected from the group consisting of an alkyl group having 1 to 3 carbon atoms, an alkoxy group having 1 to 3 carbon atoms, a halogen atom, and a nitro group" represented by $R^{29'}$ and $R^{30'}$ in the general formula [5'] include a (unsubstituted) phenyl group which does not have a substituent such as a phenyl group; a phenyl group substituted with an alkyl group having 1 to 3 carbon atoms (having an alkyl group having 1 to 3 carbon atoms), such as a 2-methylphenyl group, a 3-methylphenyl group, a 4-methylphenyl group, a 2,4-dimethylphenyl group, a 2,6-dimethylphenyl group, a 2,4,6-trimethylphenyl group, a 2,6-diethylphenyl group, a 2,6-di-n-propylphenyl group, and a 2,6-diisopropylphenyl group; a phenyl group substituted with an alkoxy group having 1 to 3 carbon atoms (having an alkoxy group having 1 to 3 carbon atoms), such as a 2-methoxyphenyl group, a 3-methoxyphenyl group, a 4-methoxyphenyl group, a 2,4-dimethoxyphenyl group, a 2,6-dimethoxyphenyl group, a 2,4,6-trimethoxyphenyl group, a 2,6-diethoxyphenyl group, a 2,6-di-n-propoxyphenyl group, and a 2,6-diisopropoxyphenyl group; a phenyl group substituted with a halogen atom (having a halogen atom), such as a 2-fluorophenyl group, a 3-fluorophenyl group, a 4-fluorophenyl group, a 2,4-difluorophenyl group, a 2,6-difluorophenyl group, a 2,4,6-trifluorophenyl group, a 2,6-dichlorophenyl group, a 2,6-dibromophenyl group, and a 2,6-iodophenyl group; and a phenyl group substituted with a nitro group (having a nitro group), such as a 2-nitrophenyl group, a 3-nitrophenyl group, a 4-nitrophenyl group, a 2,4-dinitrophenyl group, a 2,6-dinitrophenyl group, and a 2,4,6-trinitrophenyl group. Among these phenyl groups, the (unsubstituted) phenyl group which does not have a substituent; the phenyl group substituted with an alkyl group having 1 to 3 carbon atoms (having an alkyl group having 1 to 3 carbon atoms); and the phenyl group substituted with an alkoxy group having 1 to 3 carbon atoms (having an alkoxy group having 1 to 3 carbon atoms) are preferable; and among these, the (unsubstituted) phenyl group which does not have a substituent; and the phenyl group substituted with an alkyl group having 1 to 3 carbon atoms (having an alkyl group having 1 to 3 carbon atoms) are more preferable. It should be noted that the number of carbon atoms constituting the substituents means the number of carbon atoms contained in each of the substituents and does not mean the total number of carbon atoms counted in a case where there is a plurality of substituents. For example, in the case of the 2,6-diisopropylphenyl group and the 2,6-diisopropoxyphenyl group, these are phenyl groups substituted with an alkyl or alkoxy group having 3 carbon atoms (having an alkyl or alkoxy group having 3 carbon atoms) and have two isopropyl groups or two isopropoxy groups, and therefore, the total number of carbon atoms in the substituent is 6.

As $R^{29'}$ and $R^{30'}$ in the general formula [5'], an alkyl group having 1 to 6 carbon atoms is preferable.

Specific examples of the biguanidinium cation represented by the general formula [5'] include cations represented by the formulae [5-1] to [5-5] and the formula [5-7].

(A) Compound having the biguanidinium cation represented by the general formula [5'] among the biguanidinium cations can further increase the contrast between an exposed portion (a portion irradiated with light) and an unexposed portion (a portion not being irradiated with light) by irradiation with light (active energy rays) in the light- or heat-curing method of the embodiment of the present invention.

Specific examples of the (A) compound having the biguanidinium cation represented by the general formula [5'] include compounds represented by the formulae [1-1] to [1-7].

Formulae [1-1] to [1-7]:
[1-1]
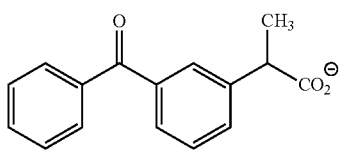
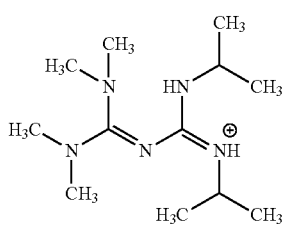
[1-2]
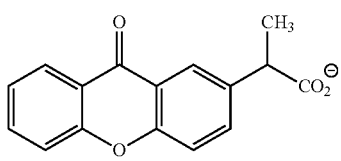
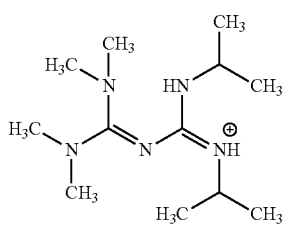
[1-3]
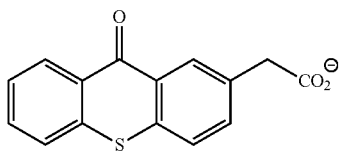
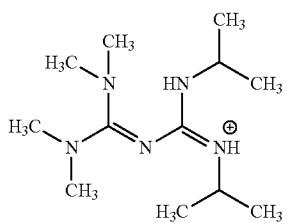
[1-4]
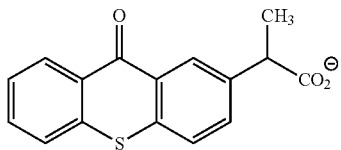
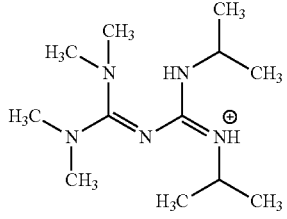
[1-5]
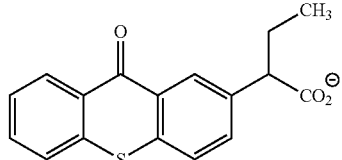
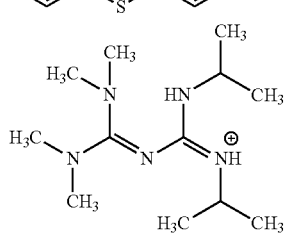
[1-6]
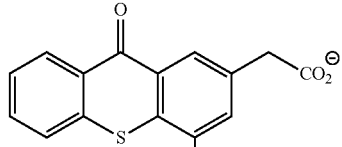
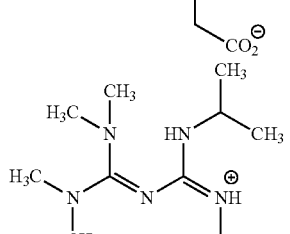
[1-7]
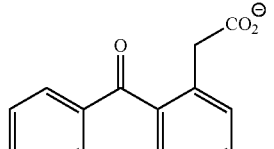
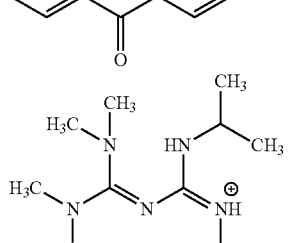
As the (A) compound according to the light- or heat-curing method of the embodiment of the present invention, commercial products or compounds appropriately synthesized by the known methods described in WO2014/208632, Macromolecules 2012, 45, 2219-2224, J. Am. Chem. Soc., 2001, 123, 7996-8002, J. Org. Chem., 2002, 67, 2, 541-555, and the like may be used. Specific examples of a method for producing these (A) compounds include a method in which a thiosalicylic acid derivative and a m-phenylenediacetic acid derivative are reacted with each other in sulfuric acid to cause sulfidation, and then the reactants are reacted under heating conditions to cause a Friedel-crafts acylation type dehydration ring-closing reaction, thereby synthesizing the compound having two acetic acid units on a thioxanthone ring. In addition, as another method, a malonic acid ester, a palladium catalyst, a phosphine ligand, and a base (for example, tripotassium phosphate) are added to a compound, which has one or plural halides on carbon atoms constituting an aromatic ring on a benzophenone ring, a xanthone ring, a thioxanthone ring, or an anthraquinone ring, and the reactants are reacted in toluene under heating conditions, thereby synthesizing a compound in which a malonic acid unit is selectively introduced into the position of the halide of the aromatic ring. Then, as desired, various bases and electrophiles (for example, an alkyl halide and an aldehyde) are reacted with the obtained malonic acid ester derivative such that a carbon chain is introduced into the derivative, and then the malonic acid ester is hydrolyzed. Furthermore, the (A) compound can be synthesized by reacting a base selected from amidine, guanidine, biguanide, and phosphazene that is a source of $Z_{1+}$ in the general formula [2] with the obtained (A) compound to form a salt.

The (A) compound according to the light- or heat-curing method of the embodiment of the present invention acts as not only a base generator but also a radical generator, and also acts as a catalyst (a promoter for a reaction between the (B) aluminum alkoxide and the (C) silane coupling agent) in the step 1. In the step 1, an example of the estimated structure of an activator in a case where the (A) compound acts as a catalyst is shown below.

General formulae [G-1] to [G-2]:

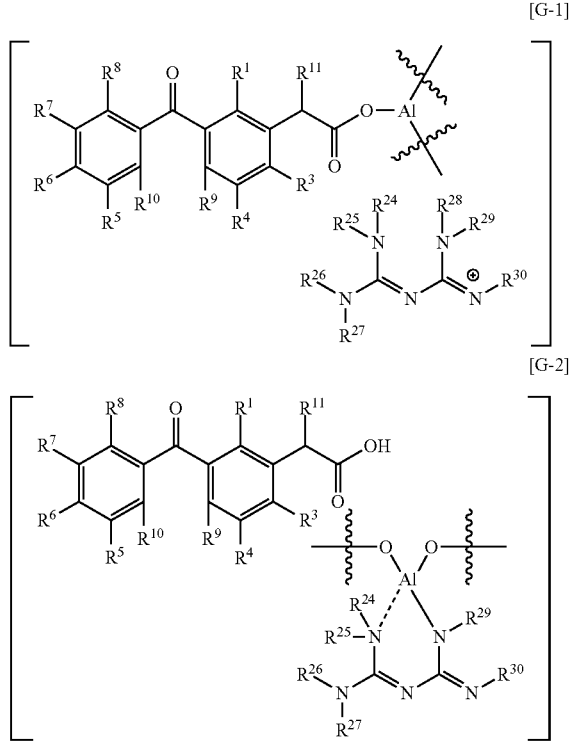

In the formulae [G-1] to [G-2], $R^1$, $R^3$ to $R^{10}$ and $R^{24}$ to $R^{30}$ are the same as described above.

The (B) aluminum alkoxide according to the light- or heat-curing method of the embodiment of the present invention is an aluminum compound which serves as a raw material of (E) a condensate having constitutional units of Si—O—Al and/or Si—O—Si, obtained from aluminum derived from an aluminum alkoxide and a silane derived from a silane coupling agent having a mercapto group ((E) a sol), in the light- or heat-curing method of the embodiment of the present invention, and has at least one alkoxy group causing a condensation reaction (solation) with (C) a silane coupling agent in the presence of (D) water.

Specific examples of such the (B) aluminum alkoxide include an aluminum alkoxide represented by the general formula [6].

General formula [6]:

$$Al(OR^{32})_3 \quad [6]$$

In the formula [6], three $R^{32}$'s each independently represent a hydrogen atom or an alkyl group having 1 to 4 carbon atoms, provided that at least one of the groups represented by $R^{32}$ represents an alkyl group having 1 to 4 carbon atoms.

As the alkyl group having 1 to 4 carbon atoms represented by $R^{32}$ in the general formula [6], alkyl groups having 2 to 4 carbon atoms are preferable; among these, alkyl groups having 3 or 4 carbon atoms are more preferable; and among these, an alkyl group having 4 carbon atoms is particularly preferable. In addition, the alkyl group may be any of linear, branched, and cyclic groups, and among these, the branched group is preferable. Specific examples of such an alkyl group include a methyl group, an ethyl group, an n-propyl group, an isopropyl group, a cyclopropyl group, an n-butyl group, an isobutyl group, a sec-butyl group, a tert-butyl group, and a cyclobutyl group. Among these alkyl groups, linear, branched, or cyclic alkyl groups having 2 to 4 carbon atoms are preferable; and among these, branched alkyl groups having 3 or 4 carbon atoms are more preferable, and a sec-butyl group is particularly preferable.

$R^{32}$'s in the general formula [6], it is preferable that at least two $R^{32}$'s among the three $R^{32}$'s are alkyl groups having 1 to 4 carbon atoms; and in particular, it is more preferable that all of the three $R^{32}$'s are the alkyl groups having 1 to 4 carbon atoms.

Specific examples of (B) aluminum alkoxide represented by the general formula [6] include aluminum trimethoxide, aluminum triethoxide, aluminum tri-n-propoxide, aluminum triisopropoxide, aluminum tricyclopropoxide, aluminum tri-n-butoxide, aluminum triisobutoxide, aluminum tri-sec-butoxide, aluminum tri-tert-butoxide, and aluminum tricyclobutoxide. Among these aluminum alkoxides, the aluminum tri-sec-butoxide is preferable from the viewpoint that is easily subjected to hydrolysis in the atmosphere and is easily handled in the state of a liquid. It should be noted that as these (B) aluminum alkoxides, one kind of aluminum alkoxide can be used alone or two or more kinds of aluminum alkoxides may be used in combination.

The (C) silane coupling agent according to the light- or heat-curing method of the embodiment of the present invention is a silane coupling agent which serves as a raw material of (E) a condensate having constitutional units of Si—O—Al and/or Si—O—Si, obtained from aluminum derived from an aluminum alkoxide and a silane derived from a silane coupling agent having a mercapto group ((E) a sol) in the light- or heat-curing method of the embodiment of the present invention, and has at least one alkoxysilyl group causing a condensation reaction (solation) with the (C) silane coupling agent in the presence of (D) water and at least one mercapto group causing a thiol-ene reaction or a thiol-yne reaction.

Specific examples of such the (C) silane coupling agent include a silane coupling agent represented by the general formula [7].

General formula [7]:

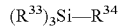  [7]

In the formula [7], three $R^{33}$'s each independently represent an alkyl group having 1 to 4 carbon atoms or an alkoxy group having 1 to 4 carbon atoms, $R^{34}$ represents an alkyl group having 1 to 8 carbon atoms, which has at least one mercapto group, provided that at least one of groups represented by $R^{33}$ represents an alkoxy group having 1 to 4 carbon atoms.

As the alkyl group having 1 to 4 carbon atoms represented by $R^{33}$ in the general formula [7], an alkyl group having 1 carbon atom is preferable. In addition, the alkyl group may be any of linear, branched, and cyclic groups. Specific examples of such an alkyl group include a methyl group, an ethyl group, an n-propyl group, an isopropyl group, a cyclopropyl group, an n-butyl group, an isobutyl group, a sec-butyl group, a tert-butyl group, and a cyclobutyl group. Among these alkyl groups, the methyl group is preferable.

As the alkoxy group having 1 to 4 carbon atoms represented by $R^{33}$ in the general formula [7], an alkoxy group having 1 or 2 carbon atoms is preferable. In addition, the alkoxy group may be any of linear, branched, and cyclic groups. Specific examples of such an alkoxy group include a methoxy group, an ethoxy group, an n-propoxy group, an isopropoxy group, a cyclopropoxy group, an n-butoxy group, an isobutoxy group, a sec-butoxy group, a tert-butoxy group, and a cyclobutoxy group. Among these alkoxy groups, the methoxy group and the ethoxy group are preferable.

As $R^{33}$'s in the general formula [7], it is preferable that at least two $R^{33}$'s among the three $R^{33}$'s are alkoxy groups having 1 to 4 carbon atoms; and in particular, it is more preferable that all of the three $R^{33}$'s are the alkoxy groups having 1 to 4 carbon atoms.

As the alkyl group having 1 to 8 carbon atoms in "the alkyl group having 1 to 8 carbon atoms, which has at least one mercapto group", represented by $R^{34}$ in the general formula [7], alkyl groups having 1 to 6 carbon atoms are preferable; and among these, alkyl groups having 1 to 4 carbon atoms are more preferable. In addition, the alkyl group may be any of linear, branched, and cyclic groups. Specific examples of such an alkyl group include a methyl group, an ethyl group, an n-propyl group, an isopropyl group, a cyclopropyl group, an n-butyl group, an isobutyl group, a sec-butyl group, a tert-butyl group, a cyclobutyl group, an n-pentyl group, an isopentyl group, a sec-pentyl group, a tert-pentyl group, a neopentyl group, a 2-methylbutyl group, a 1,2-dimethylpropyl group, a 1-ethylpropyl group, a cyclopentyl group, an n-hexyl group, an isohexyl group, a sec-hexyl group, a tert-hexyl group, a neohexyl group, a 2-methylpentyl group, a 1,2-dimethylbutyl group, a 2,3-dimethylbutyl group, a 1-ethylbutyl group, a cyclohexyl group, an n-heptyl group, an isoheptyl group, a sec-heptyl group, a tert-heptyl group, a neoheptyl group, a cycloheptyl group, an n-octyl group, an isooctyl group, a sec-octyl group, a tert-octyl group, a neooctyl group, a 2-ethylhexyl group, a cyclooctyl group, and a norbornyl group (norbornan-x-yl group). Among these alkyl groups, linear, branched, or cyclic alkyl groups having 1 to 6 carbon atoms are preferable; and among these, linear, branched, or cyclic alkyl groups having 1 to 4 carbon atoms are more preferable.

The mercapto group (thiol group) in "the alkyl group having 1 to 8 carbon atoms, which has at least one mercapto group", represented by $R^{34}$ in the general formula [7], is bonded to the middle of a chain and/or the terminal of the alkyl group, and the binding position is not limited. In addition, at least one mercapto group (thiol group) may be bonded to the alkyl group, for example, a plurality of mercapto groups (thiol groups) such as 2 to 4 mercapto groups may be bonded to the alkyl group.

Specific examples of (C) silane coupling agent represented by the general formula [7] include 3-mercaptopropyl) trimethoxysilane, (3-mercaptopropyl)triethoxysilane, (3-mercaptopropyl)tripropoxysilane, (3-mercaptopropyl) tributoxysilane, 1,4-dimercapto-2-(trimethoxysilyl)butane, 1,4-dimercapto-2-(triethoxysilyl)butane, 1,4-dimercapto-2-(tripropoxysilyl)butane, 1,4-dimercapto-2-(tributoxysilyl) butane, 2-mercaptomethyl-3-mercaptopropyltrimethoxysilane, 2-mercaptomethyl-3-mercaptopropyltriethoxysilane, 2-mercaptomethyl-3-mercaptopropyltripropoxysilane, 2-mercaptomethyl-3-mercaptopropyltributoxysilane, 1,2-dimercaptoethyltrimethoxysilane, 1,2-dimercaptoethyltriethoxysilane, 1,2-dimercaptoethyltripropoxysilane, 1,2-dimercaptoethyltributoxysilane, and 3-mercaptopropyl (dimethoxy)methylsilane. Among these silane coupling agents, the (3-mercaptopropyl)trimethoxysilane, the (3-mercaptopropyl)triethoxysilane, and the 3-mercaptopropyl(dimethoxy)methylsilane are preferable from the viewpoint that they exhibit excellent reactivity in hydrolysis and polycondensation. It should be noted that as these (C) silane coupling agents, one kind of silane coupling agents may be used alone, or two or more kinds of silane coupling agents may be used in combination.

(D) Water according to the light- or heat-curing method of the embodiment of the present invention is used for the purposes of hydrolysis of the (B) aluminum alkoxide in the step 1, hydrolysis of the alkoxysilyl group in the (C) silane coupling agent, and the like. Such (D) water is not particularly limited as long as it is water usually used in the field of the art, and specifically, examples thereof include purified water such as distilled water and deionized water.

(D) Water may be one which is derived from moisture in the atmosphere or from water contained in (I) filler. In a case where (D) water required to allow the step 1 to proceed can be supplied from moisture in the atmosphere or from water contained in the (I) filler, so-called liquid water is not required to be added in some cases.

The (E) condensate having constitutional units of Si—O—Al and/or Si—O—Si, obtained from aluminum derived from an aluminum alkoxide and a silane derived from a silane coupling agent having a mercapto group according to the light- or heat-curing method of the embodiment of the present invention is a condensate obtained from the (B) aluminum alkoxide and the (C) silane coupling agent by the action of (D) water in the presence of the (A) compound in the step 1, which contains an Si—O—Al constitutional unit and/or an Si—O—Si constitutional unit as a main skeleton in the structure.

In addition, the (E) condensate is in the state of a sol that can be reacted with the (H) compound or the (I) filler in the second step and has fluidity. Accordingly, it is preferable that the hydroxyl groups or the alkoxy groups in the (E) condensate, corresponding to all the alkoxy groups in the (B) aluminum alkoxide and all the alkoxy groups in the (C)

silane coupling agent, remain in the amount of usually 10% to 90%, and preferably 30% to 70%.

It is preferable that the (E) condensate is constituted with the constitutional units derived from the (B) aluminum alkoxide and the constitutional units derived from the (C) silane coupling agent at a ratio of usually 1:10 to 9:1, preferably 1:5 to 4:1, and more preferably 1:2.5 to 2:1 in terms of molar ratios.

The (E) condensate has a mercapto group derived from the (C) silane coupling agent in the structure, and the mercapto group is reacted with the polymerizable unsaturated group in the (H) compound. In addition, the molar amount of the mercapto group in the (E) condensate depends on the number of moles of the mercapto group in the (C) silane coupling agent, and for example, in a case where the (C) silane coupling agent has one mercapto group and the total amount of the (C) silane coupling agent is assumed to be converted into the (E) condensate, the mercapto group in the same number of moles as that of the (C) silane coupling agent used is present in the (E) condensate. In addition, for example, in a case where the (C) silane coupling agent has two mercapto groups and the total amount of the (C) silane coupling agent is converted into the (E) condensate, the mercapto group in the double number of moles with respect to that of the (C) silane coupling agent used is present in the (E) condensate.

The (E) condensate has a hydroxyl group or an alkoxy group derived from the (B) aluminum alkoxide and the (C) silane coupling agent in the structure, and the hydroxyl group or the alkoxy group is reacted with the (I) filler or the hydroxyl group present in a trace amount on a surface of the metal substrate.

The (H) compound having two or more polymerizable unsaturated groups according to the light- or heat-curing method of the embodiment of the present invention is a compound having two or more polymerizable unsaturated groups which serves as a raw material for obtaining a cured product (crosslinked product or resin) by performing a reaction with a mercapto group in the (E) condensate obtained in the step 1, and causes a thiol-ene reaction or a thiol-yne reaction.

Such the (H) compound encompasses compounds that are generally used in the field of the art, and examples thereof include the compounds described in JP2007-291313A, JP2014-028938A, and the like; polyfunctional allyl compounds such as a compound having two allyl groups, such as diallylhexahydrophthalate, diallylchlorendate, and diallyldiphenylsilane, a compound having three allyl groups, such as triallyl(2,4,6-tris(allyloxy)-1,3,5-triazine) cyanurate, triallyl trimellitate, and triallyl isocyanurate, and a compound having four or more allyl groups, such as tetraallyl pyromellitate; polyfunctional (meth)acryl compounds such as a compound having two (meth)acryl groups, such as 1,3-butylene glycol di(meth)acrylate, 1,4-butanediol di(meth)acrylate, 1,6-hexanediol di(meth)acrylate, 1,9-nonanediol di(meth)acrylate, 1,10-decanediol di(meth)acrylate, ethylene glycol di(meth)acrylate, diethylene glycol di(meth)acrylate, triethylene glycol di(meth)acrylate, tetraethylene glycol di(meth)acrylate, polyethylene glycol di(meth)acrylate, dipropylene glycol di(meth)acrylate, tripropylene glycol di(meth)acrylate, tetrapropylene glycol di(meth)acrylate, polypropylene glycol di(meth)acrylate, glycerin di(meth) acrylate, 2-hydroxy-3-acrylpoxypropyl(meth)acrylate, bisphenol AEO-modified di(meth)acrylate, bisphenol FEO-modified di(meth)acrylate, and tricyclodecanedimethanol di(meth)acrylate, and a compound having 3 to 6 (meth)acryl groups, such as trimethylolpropane tri(meth)acrylate, trimethylolpropane EO-modified tri(meth)acrylate, glycerin EO-modified tri(meth)acrylate, isocyanuric acid EO-modified tri(meth)acrylate, ε-caprolactone-modified tris(2-(meth)acryloxyethyl) isocyanurate, pentaerythritol tri(meth)acrylate, ditrimethylolpropane tetra(meth)acrylate, pentaerythritol tetra(meth)acrylate, pentaerythritol EO-modified tetra (meth)acrylate, dipentaerythritol penta(meth)acrylate, and dipentaerythritol hexa(meth)acrylate; polyfunctional olefin compounds other than an allyl compound and a (meth)acryl compound, such as 1,3-butadiene, 1,3-pentadiene, 1,4-pentadiene, isoprene, 1,4-hexadiene, 1,5-hexadiene, 2,4-hexadiene, 2-methyl-1,4-pentadiene, dicyclopentadiene, 2,3-dimethyl-1,3-butadiene, 1,4-heptadiene, 1,5-heptadiene, 1,6-heptadiene, 2-methyl-1,5-hexadiene, 1,7-octadiene, 2,5-dimethyl-1,5-hexadiene, 1,5-cyclooctadiene, 1,8-nonadiene, 1,9-decadiene, 1,10-undecadiene, 1,11-dodecadiene, 1,12-tridecadiene, 1,13-tetradecadiene, tetraallyloxyethane, 1,3-divinylbenzene, 1,4-divinylbenzene, 1,3,5-trivinylbenzene, 1,3-diisopropenylbenzene, 1,4-diisopropenylbenzene, 1,3,5-triisopropenylbenzene, 3,3'-divinylbiphenyl, 3,4'-divinylbiphenyl, 4,4'-divinylbiphenyl, 4,4'-diisopropenylbiphenyl, 2,6-diisopropenylnaphthalene, 1,2-bis(vinylphenyl)ethane, 2,4,6,8-tetramethyl-2,4,6,8-tetravinylcyclotetrasiloxane, 1,6-hexanediol bis(5-norbornane carboxylate), pentaerythritol tetra(5-norbornane carboxylate), 1,3-bis(maleimide)ethane, 1,4-bis(maleimide)butane, 1,6-bis(maleimide)hexane, propylene glycol bismaleimideacetate, bis[N-(2-ethyl)maleimide]hexamethylenecarbamate, polyether-based bismaleimideacetate ester, diethylene glycol divinylether, triethylene glycol divinylether, 1,4-bis(vinyloxymethyl) cyclohexane, 2-vinyloxy-5-(vinyloxymethyl)-7-oxabicyclo[2.2.1]heptane, and 3-vinyloxy-5-(vinyloxymethyl)-7-oxabicyclo[2.2.1]heptane; and polyfunctional alkynyl compounds such as a compound having two alkynyl groups, such as 1,6-heptadiyne, 1,7-octadiyne, 1,8-nonadiyne, 1,9-decadiyne, dipropargylamine, diethylene glycol bis(2-propynyl)ether, ethylene glycol-1,2-bis(2-propynyl)ether, 1,3-diethynylbenzene, 1,4-diethynylbenzene, 1,3-bis(2-propynyloxy)benzene, 3,5-bis(propargyloxy)benzyl alcohol, bisphenol A dipropargyl ether, bisphenol E dipropargyl ether, 4,4'-diethynylbiphenyl, 2,6-diethynylnaphthalene, 9,10-diethynylanthracene, and 3,6-diethynylcarbazole, a compound having three alkynyl groups, such as tripropargylamine, 1,3,5-trialkynylbenzene, and 2,4,6-tris(propynyl-2-oxy)-1,3,5-triazine, and a compound having four or more alkynyl groups, such as tetrakis(4-ethynylphenyl) methane. Among these (H) compounds, trifunctional or higher allyl compounds such as the compound having three allyl groups, such as triallyl(2,4,6-tris(allyloxy)-1,3,5-triazine) cyanurate, triallyl trimellitate, and triallyl isocyanurate, and a compound having four or more allyl groups, such as tetraallyl pyromellitate; and trifunctional or higher (meth) acryl compounds such as the compound having 3 to 6 (meth)acryl groups, such as trimethylolpropane tri(meth) acrylate, trimethylolpropane EO-modified tri(meth)acrylate, glycerin EO-modified tri(meth)acrylate, isocyanuric acid EO-modified tri(meth)acrylate, ε-caprolactone-modified tris (2-(meth)acryloxyethyl) isocyanurate, pentaerythritol tri (meth)acrylate, ditrimethylolpropane tetra(meth)acrylate, pentaerythritol tetra(meth)acrylate, pentaerythritol EO-modified tetra(meth)acrylate, dipentaerythritol penta(meth)acrylate, and dipentaerythritol hexa(meth)acrylate are preferable; and among these, the (meth)acryl compounds having 3 to 6 (meth)acryl groups, such as trimethylolpropane tri(meth)acrylate, trimethylolpropane EO-modified tri (meth)acrylate, glycerin EO-modified tri(meth)acrylate, isocyanuric acid EO-modified tri(meth)acrylate, ε-caprolactone-modified tris(2-(meth)acryloxyethyl) isocyanurate, pentaerythritol tri(meth)acrylate, ditrimethylolpropane tetra(meth)acrylate, pentaerythritol tetra(meth)acrylate, pentaerythritol EO-modified tetra(meth)acrylate, dipentaerythritol penta(meth)acrylate, and dipentaerythritol hexa(meth)acrylate are more preferable, from the viewpoint that these compounds makes it possible to obtain a crosslinked product having high crosslinking density, and the dipentaerythritol hexa(meth)acrylate is particularly preferable. It should be noted that as these (H) compounds, one kind of the (H) compound may be used alone, or two or more kinds of the (H) compounds may be used in combination.

The (I) filler according to the light- or heat-curing method of the embodiment of the present invention serves as a raw material for imparting various characteristics to a cured product (crosslinked product or resin) obtained by the reaction with the hydroxyl groups or the alkoxy groups in the (E) condensate obtained in the step 1.

Specific examples preferred as such the (I) filler include inorganic filler, such as metals such as aluminum, iron, and silver; metal oxides such as magnesium oxide, aluminum oxide (alumina), silicon oxide, beryllium oxide, iron oxide, ferrite, copper oxide, cuprous oxide, and zinc oxide; metal nitrides such as boron nitride, aluminum nitride, and silicon nitride; and metal hydroxides such as magnesium hydroxide, aluminum hydroxide, and boehmite; and organic filler, such as metal carbides such as silicon carbide; metal carbonates such as magnesium carbonate; and insulating carbon materials such as graphite, carbon, carbon black, and diamond. Among these (I) filler, thermally conductive filler of metal oxides such as magnesium oxide and aluminum oxide (alumina), metal nitrides such as boron nitride, aluminum nitride, and silicon nitride, and the like are preferable from the viewpoint that they can make it possible to obtain a cured product (crosslinked product or resin) having high electrical insulating properties and high thermal conduction, and among these, aluminum nitride is more preferable. These (I) filler may be in any shape of a spherical shape, a powdery shape, a glassy shape, a fibrous shape, a flake shape, a foil shape, a balloon shape, a Cladophora shape, and the like. It should be noted that with regard to these (I) filler, one kind of the (I) filler may be used alone or two or more kinds of the (I) filler may be used in combination. The thermally conductive substrate for forming an electronic circuit of the present invention has a cured product (crosslinked product or resin) obtained from the first or second resin composition of the embodiment of the present invention, and can serve as a substrate having excellent thermal conduction by using a thermally conductive filler as the (I) filler.

The particle diameter of the (I) filler can be used without particular limitation as long as it is a particle diameter generally used in this field of the art. Specifically, the average particle diameter (median diameter) of the (I) filler is usually 0.1 to 50 μm, preferably 0.2 to 30 μm, and more preferably 0.5 to 20 μm. It is possible to further improve various physical properties such as a hardness and a thermal conductivity of a cured product (crosslinked product or resin) obtained by using the (I) filler having an average particle diameter in a preferable range or the (I) filler having an average particle diameter in a more preferable range. In addition, in a case where two kinds of the (I) filler having different average particle diameters are used in combination, the thermal conduction of a cured product (crosslinked product or resin) obtained tends to be enhanced. The average particle diameter (median diameter) of one (I-A) filler out of two the (I) filler is usually 5 to 50 μm, preferably 7 to 30 μm, and more preferably 10 to 20 μm, and the average particle diameter (median diameter) of the other (I-B) filler is usually 0.1 to 3 μm, preferably 0.2 to 2 μm, and more preferably 0.5 to 1.8 μm. In a case where a cured product (crosslinked product or resin) having high thermal conduction is required, (I-A) filler and (I-B) filler are used in combination at a ratio of usually 1:10 and to 10:1, preferably 1:5 to 5:1, and more preferably 1:3 to 3:1, on a basis of mass. It should be noted that a surface of (I) filler may be subjected to a surface treatment that suppresses hydrolysis.

The (F) chelating agent used as desired in the light- or heat-curing method of the embodiment of the present invention is a compound that forms a complex with the (B) aluminum alkoxide in the step 1 to promote a reaction between the (C) silane coupling agents or promote a reaction between the (B) aluminum alkoxide (a complex thereof) and the (C) silane coupling agent.

Specific examples of such the (F) chelating agent include methyl acetoacetate, ethyl acetoacetate, dimethyl malonate, diethyl malonate, 2-(2-thioxanthenyl)diethyl malonic acid, acetylacetone, diacetone alcohol, and ethyl lactate. It should be noted that as these (F) chelating agents, one kind of the (F) chelating agent may be used alone, or two or more kinds of the (F) chelating agents may be used in combination.

The (J) compound having two or more epoxy groups used as desired according to the light- or heat-curing method of the embodiment of the present invention is a compound which serves as a raw material for improving a hardness or adhesiveness to a base material of a cured product (crosslinked product or resin) obtained, by the reaction with the mercapto group of the (C) silane coupling agent or by the reaction between (J) compounds (chain polymerization) directly or indirectly through a base generated from the (A) compound in the step 2, and has at least two epoxy groups in the structure.

Specific examples of such the (J) compound include diglycidyl ether, spiroglycol diglycidyl ether, ethylene glycol diglycidyl ether, diethylene glycol diglycidyl ether, 1,3-propylene glycol diglycidyl ether, propylene glycol diglycidyl ether, tri-1,3-propylene glycol diglycidyl ether, tripropylene glycol diglycidyl ether, 1,4-butanediol diglycidyl ether, glycerin diglycidyl ether, glycerol diglycidyl ether, neopentyl glycol diglycidyl ether, 1,6-hexanediol diglycidyl ether, bisphenol A diglycidyl ether, bisphenol F diglycidyl ether, bisphenol AD diglycidyl ether, biphenyl diglycidyl ether, 3,4-epoxycyclohexylmethyl-3',4'-epoxycyclohexane carboxylate, polyethylene glycol diglycidyl ether, poly-1,3-propylene glycol diglycidyl ether, polypropylene glycol diglycidyl ether, glycidyl (meth)acrylate, trimethylolpropane triglycidyl ether, pentaerythritol tetraglycidyl ether, sorbitol polyglycidyl ether, triglycidyl cyanurate (2,4,6-tri(glycidyloxy)-1,3,5-triazine), and triglycidyl isocyanurate. (J) Compounds may be halogenated or hydrogenated. In addition, these (J) compounds also contain derivatives of the specific examples. It should be noted that as these (J) compounds, one kind of the (J) compound may be used alone or two or more kinds of the (J) compounds may be used in combination.

The organic solvent according to the light- or heat-curing method of the embodiment of the present invention is not particularly limited as long as it is an organic solvent generally used in the field of the related art. Examples of the organic solvent used as desired include a saturated or unsaturated aliphatic hydrocarbon-based solvent such as pentane, hexane, heptane, octane, nonane, decane, tetrahydronaphthalene, menthane, or squalane, an aromatic hydrocarbon-based solvent such as benzene, toluene, ethyl benzene, diethyl benzene, trimethyl benzene, styrene, or xylene, a halogen-based solvent such as dichloromethane, trichloromethane (chloroform), or tetrachloromethane (carbon tetrachloride), an ether-based solvent such as diethyl ether, di-n-propyl ether, diisopropyl ether, methyl-tert-butyl ether, di-n-butyl ether, di-tert-butyl ether, cyclopentyl methyl ether, tetrahydrofuran, 2-methyl tetrahydrofuran, or 1,4-dioxane, an alcohol-based solvent such as methanol, ethanol, n-propanol, isopropanol, n-butanol, isobutanol, sec-butanol, tert-butanol, or 2-methoxyethanol, a glycol ether-based solvent such as ethylene glycol monomethyl ether, propylene glycol monomethyl ether (PGME), propylene glycol monoethyl ether, diethylene glycol monomethyl ether, dipropylene glycol monomethyl ether, dipropylene glycol monoethyl ether, ethylene glycol dimethyl ether, propylene glycol dimethyl ether, ethylene glycol diethyl ether, propylene glycol diethyl ether, diethylene glycol dimethyl ether, diethylene glycol diethyl ether, dipropylene glycol dimethyl ether, or dipropylene glycol diethyl ether, a glycol ether acetate-based solvent such as ethylene glycol monoethyl ether acetate, diethylene glycol monoethyl ether acetate (carbitol acetate), diethylene glycol monobutyl ether acetate, propylene glycol monomethyl ether acetate (PGMEA), propylene glycol monoethyl ether acetate, dipropylene glycol monomethyl ether acetate, or dipropylene glycol monoethyl ether acetate, a ketone-based solvent such as 2-propanone (acetone), 2-butanone (ethyl methyl ketone), diethyl ketone, 4-methyl-2-pentanone (methyl isobutyl ketone), cyclopentanone, cyclohexanone, or cycloheptanone, an ester-based solvent such as methyl acetate, ethyl acetate, n-propyl acetate, isopropyl acetate, isobutyl acetate, sec-butyl acetate, tert-butyl acetate, ethyl butyrate, isoamyl butyrate, ethyl lactate (EL), n-propyl lactate, isopropyl lactate, isobutyl lactate, sec-butyl lactate, tert-butyl lactate, isoamyl lactate, γ-butyrolactone, or butyl stearate, an amide-based solvent such as N,N-dimethylformamide, N,N-dimethylacetamide, 1-methyl-2-pyrrolidinone (N-methylpyrrolidone), or 1,3-dimethyl-2-imidazolidinone (dimethylethylene urea), a nitrile-based solvent such as acetonitrile, and the like. It should be noted that one kind of these organic solvents may be used singly, or two or more kinds of these organic solvents may be used in combination.

In a case where an organic solvent is contained in the step 1 and/or the step 2, the content of the organic solvent (amount of the organic solvent used) is not particularly limited and may be appropriately set according to the purpose such as improving the compatibility of (A) to (F), (H) and (I), and improving the applicability of the (E) condensate (the (E) sol), which has been obtained after the step 1, applied to a substrate. For example, the content of the organic solvent (amount of the organic solvent used) is, for example, usually 0.01 to 10 g with respect to 1 g of (I) filler.

Examples of the additives used, as desired, in addition to the (F) chelating agent and the (J) compound, in the light- or heat-curing method of the embodiment of the present invention include a polymerization inhibitor, a sensitizer, a dispersant, a dispersion aid, a silane monomer, a weather resistance aid, a pigment, a dye, a curing accelerator-chain transfer catalyst, an deoxidant.reductant, an antioxidant, a leveling agent, a surface modifier, a foaming agent, an antifoaming agent, a pH adjuster, an antifoggant, a surfactant, a colorant, an antifading agent, a fluorescent whitening agent, an antihalation agent, a bulking agent, a plasticizer, a plasticization accelerator, a flame retardant, an ultraviolet absorber, a fungicide, an antistatic agent, an anti-sagging agent, and a magnetic substance. In addition, these additives can usually be used without particular limitation as long as they are generally used in the field of the related art.

Among these additives, specific examples preferable as the polymerization inhibitor include p-methoxyphenol, hydroquinone, alkyl-substituted hydroquinone, catechol, tert-butyl catechol, phenothiazine, cupferron, ammonium N-nitrosophenylhydroxyalkylamine, triphenyl phosphonate, and pyrogallol.

Specific preferred examples of the sensitizer include benzophenone, p,p'-tetramethyldiaminobenzophenone, p,p'-tetraethyldiaminobenzophenone, 2-chlorothioxanthone, 2-isopropyithioxanthone, 2-trifluoromethylthioxanthone, 2,4-diethylthioxanthone, anthrone, benzanthrone, anthracene, 9-ethoxyanthracene, 9,10-diphenylanthracene, acenaphthene, anthraquinone, benzoquinone, 1-chloroanthraquinone, 2-ethylanthraquinone, and benzoquinone.

Specific preferred examples of the dispersant include a polymeric dispersant such as polyvinyl pyrrolidone, a polycarboxylic acid, sodium polycarboxylate, sodium polysulfonate, polyether such as polyethylene glycol, polyalkylene polyamine, and polyalkylene sulfonic acid.

Specific preferred examples of the silane monomer include methyltrimethoxysilane, ethyltrimethoxysilane, propyltrimethoxysilane, butyltrimethoxysilane, methyltriethoxysilane, ethyltriethoxysilane, propyltriethoxysilane, butyltriethoxysilane, methyltripropoxysilane, ethyltripropoxysilane, propyltripropoxysilane, butyltripropoxysilane, methyltributoxysilane, ethyltributoxysilane, propyitributoxysilane, butyltributoxysilane, tetramethoxysilane, tetraethoxysilane, tetrapropoxysilane, tetrabutoxysilane, vinyltrimethoxysilane, vinyltriethoxysilane, vinyltripropoxysilane, vinyltributoxysilane, allyltrimethoxysilane, allyltriethoxysilane, allyltripropoxysilane, and allyltributoxysilane.

The content of the additives is not particularly limited and may be appropriately set such that an intended cured product (crosslinked product or resin) is obtained. For example, the content of the dispersant (amount of the dispersant used) is, for example, usually 0.001 to 0.1 g, and preferably 0.005 to 0.05 g, with respect to 1 g of a total mass of the mass of the (B) aluminum alkoxide and the mass of the (C) silane coupling agent (the total mass of (B) and (C)). It should be noted that as these additives, one kind of the additive may be used alone, or two or more kinds of the additives may be used in combination.

As the (B) aluminum alkoxide, the (C) silane coupling agent, (D) water, the (H) compound, and the (I) filler, and the (F) chelating agent, the (J) compound, the organic solvent, the additive, and the like, which are optional components, according to the light- or heat-curing method of the embodiment of the present invention, commercial products or those appropriately synthesized by known methods may be used.

Curable Resin Composition of Embodiment of Present Invention (First Resin Composition of Embodiment of Present Invention)

The curable resin composition (first resin composition) of the embodiment of the present invention is a curable resin composition which contains (A) a compound that is formed of a salt of a carboxylic acid and an amine and has a carbonyl group generating a radical and a carboxylate group generating a base through decarboxylation by irradiation with light or heating, (B) an aluminum alkoxide, (C) a silane coupling agent having a mercapto group, (H) a compound having two or more polymerizable unsaturated groups, and (I) filler, and may further contain (J) a compound having two or more epoxy groups.

Curable Resin Composition of Embodiment of Present Invention (Second Resin Composition of Embodiment of Present Invention)

The curable resin composition (second resin composition) of the embodiment of the present invention is a curable resin composition which contains (A) a compound that is formed of a salt of a carboxylic acid and an amine and has a carbonyl group generating a radical and a carboxylate group generating a base through decarboxylation by irradiation with light or heating, (E) a condensate having constitutional units of Si—O—Al and/or Si—O—Si, obtained from aluminum derived from an aluminum alkoxide and a silane derived from a silane coupling agent having a mercapto group, (H) a compound having two or more polymerizable unsaturated groups, and (I) filler. In addition, the curable resin composition is a curable resin composition which may further contain (J) a compound having two or more epoxy groups.

The curable resin composition of the embodiment the present invention (the first and second resin composition of the embodiment the present invention) may contain, for example, (F) a chelating agent, an organic solvent, an additive, or the like, in addition to the components.

Specific examples of each component of the (A) compound, the (B) aluminum alkoxide, the (C) silane coupling agent, the (F) chelating agent, the (H) compound, (I) filler, and the (J) compound, and an organic solvent, the additive, and the like in the curable resin composition of the embodiment the present invention (the first and second resin composition of the embodiment the present invention) are as described above.

The contents of the (A) compound, the (B) aluminum alkoxide, the (C) silane coupling agent, the (F) chelating agent, the (H) compound, the (I) filler, and the (J) compound, and an organic solvent, the additive, and the like in the curable resin composition of the embodiment the present invention (the first and second resin composition of the embodiment the present invention) are as described above.

The first resin composition of the embodiment of the present invention can be prepared by, for example, the following methods. As desired, the (F) chelating agent is added to the (B) aluminum alkoxide, the (A) compound and the (C) silane coupling agent are then added thereto, and the mixture is stirred with a magnetic stirrer or the like. The obtained mixture is added to a mixture containing the (I) filler, and as desired, an organic solvent and an additive, followed by kneading with a rotary revolution mixer or the like. Subsequently, the (H) compound and as desired, the (J) compound can be added to the obtained slurry, and the mixture is kneaded with a rotary revolution mixer or the like to prepare the first resin composition of the embodiment of the present invention. In addition, the first resin composition of the embodiment of the present invention can also be prepared by adding a mixture containing the (A) compound, the (B) aluminum alkoxide, the (C) silane coupling agent, and the (F) chelating agent to a mixture containing the (H) compound, the (I) filler, the (J) compound, the organic solvent, and the additive, followed by kneading with a rotary revolution mixer or the like. It should be noted that the kneading of a mixture containing the (I) filler may be performed using, for example, a ball mill, a roll mill, a Henschel mixer, or the like.

The first resin composition of the embodiment of the present invention is a resin composition containing (A) to (C) and (H) to (I) according to the light- or heat-curing method of the embodiment of the present invention, and is in one form of the composition before being applied to the step 1 according to the light- or heat-curing method of the embodiment of the present invention. The composition has good storage stability and is capable of efficiently performing polycondensation (gelation) between the (B) aluminum alkoxide and the (C) silane coupling agent or between the (C) silane coupling agents, and a thiol-ene reaction or a thiol-yne reaction in the same system by adding water to the composition, and performing irradiation with light (active energy rays) or application of heat energy, whereby a desired cured product (crosslinked product or resin) can be obtained.

The second resin composition of the embodiment of the present invention is a resin composition by adding (D) water to the first resin composition of the embodiment of the present invention to fuse (solate) the (B) aluminum alkoxide and the (C) silane coupling agent. That is, the second resin composition of the embodiment of the present invention is in one form of a composition obtained after adding (D) water to the first resin composition of the embodiment of the present invention and then applying the first resin composition of the embodiment of the present invention to the step 1 according to the light- or heat-curing method of the embodiment of the present invention. In a case where the composition is irradiated with light (active energy rays) or applied with heat energy, a desired cured product (crosslinked product or resin) can be obtained. Accordingly, the first and second resin compositions of the embodiment the present invention are useful compositions from which a cured product (crosslinked product or resin) is obtained by irradiation with light (active energy rays) or heating.

The curable resin composition of the embodiment the present invention can be used as a resin raw material in optical members or electronic members such as a paint, a printing ink, a dental material, a resist, a color filter, a film for a flexible display, an electronic part, an interlayer insulating film, a thermally conductive film, a thermally conductive insulating film, a coating film for wiring, an optical circuit, an optical circuit part, an antireflection film, a hologram, and the like.

Thermally Conductive Substrate for Forming Electronic Circuit of Present Invention The thermally conductive substrate for forming an electronic circuit of the present invention has a substrate having a cured product (crosslinked product or resin) obtained from the curable resin composition of the embodiment the present invention. That is, the thermally conductive substrate for forming an electronic circuit of the present invention is, for example, a substrate having a cured product (crosslinked product or resin) obtained from a curable resin composition of the embodiment the present invention on the upper portion of a metal substrate such as an aluminum plate or the like.

As a metal constituting the metal substrate, aluminum exhibiting having a low weight and a good thermally conduction or copper having high heat capacity is preferably used. In addition, examples of the thickness of the metal substrate include 0.1 to 5 mm.

The cured product (crosslinked product or resin) preferably has a thermal conductivity of usually 0.5 W/m·K or more, preferably 0.8 W/m·K or more, more preferably 1.0 W/m·K or more, still more preferably 2.0 W/m·K or more, particularly preferably 3.0 W/m·K or more, and most preferably 6.0 W/m·K or more.

The cured product (crosslinked product or resin) preferably has electrical insulating properties indicated by an electric resistivity of usually 1 Ω·cm or more, preferably 10 Ω·cm or more, more preferably $10^5$ Ω·cm or more, still more preferably $10^{10}$ Ω·cm or more, and most preferably $10^{13}$ Ω·cm or more.

The thermally conductive substrate for forming an electronic circuit of the present invention may have, for example, a metal foil for forming an electronic circuit, such as a copper foil, on the upper portion of a cured product (crosslinked product or resin) obtained from the curable resin composition of the embodiment the present invention.

Method for Preparing Thermally Conductive Substrate for Forming Electronic Circuit of Present Invention In a method for preparing the thermally conductive substrate for forming an electronic circuit of the present invention, a composition obtained by adding (D) water to the first resin composition of the embodiment of the present invention for solation (a composition after being applied to the step 1 in the light- or heat-curing method of the embodiment of the present invention) or the second resin composition of the embodiment of the present invention is applied to a metal substrate such as an aluminum plate to obtain a coating film, and then the coating film is cured by irradiation with light or heating, and thus, a thermally conductive insulating film is formed on a surface of the metal substrate.

As another method of preparing the thermally conductive substrate for forming an electronic circuit of the present invention, the step 1 may be allowed to proceed by the action of water derived from moisture in the atmosphere after the first resin composition of the embodiment of the present invention is applied onto the metal substrate.

Examples of a method for applying the curable resin composition of the embodiment the present invention onto a metal substrate include a method in which the curable resin composition of the embodiment the present invention prepared to have a suitable viscosity by the addition of an organic solvent is applied onto a metal substrate by a dip coating method, a flow coating method, a roll coating method, a bar coater method, a screen printing method, a curtain coating method, a spin coating method, or other methods.

A tack-free coating film can be formed by heating (prebaking) the coating film applied on the metal substrate to a temperature of about 60° C. to 150° C., and volatilizing and drying an organic solvent contained in the composition.

The thermally conductive insulating film can be formed by irradiating the obtained coating film with light (active energy rays) at the wavelength for such a time that the irradiation amount (cumulative exposure amount) or more is achieved, or by heating at the temperature for the time. In addition, in a case where a thermally conductive insulating film having a predetermined circuit pattern is formed, irradiation with light (active energy rays) may be performed through a suitable pattern mask, and then a development treatment may be performed using the developer or the like. That is, a thermally conductive insulating film can be obtained by allowing the step 2 in the light- or heat-curing method of the embodiment of the present invention to proceed on the coating film.

Since the thermally conductive substrate for forming an electronic circuit of the present invention obtained by the above method has high thermal conduction and electrical insulating properties, it is useful as a substrate for heat radiation of a high-brightness LED or a power semiconductor or as an electrically insulating substrate.

EXAMPLES

Hereinbelow, the present invention will be specifically described based on Examples and Comparative Examples, but the present invention is not limited thereto.

Example 1: Preparation of Cured Film Using Resin Composition by Irradiation with Light (Active Energy Rays) and Evaluation of Physical Properties of Cured Film Obtained A sol solution was prepared by adding a solution formed by incorporating ion exchange water [(D) water] and carbitol acetate [organic solvent] into a solution of 1,2-diisopropyl-4,4,5,5-tetramethylbiguanidinium 2-(3-benzoylphenyl) propionate [(A) compound], aluminum tri-sec-butoxide [(B) aluminum alkoxide], and (3-mercaptopropyl)trimethoxysilane [(C) silane coupling agent], and the mixture was stirred for 30 minutes. Subsequently, the sol solution prepared above was added into a mixture of triallyl cyanurate [(H) compound], aluminum nitride [(I) filler], CF-180 [dispersant], and carbitol acetate [organic solvent], and the mixture was kneaded at a rotation speed of 2,000 rpm for 3 minutes using a planetary stirrer ("AWATORI RENTARO AR-250", Thinky Corporation) to prepare a resin composition. The obtained resin composition was applied onto an aluminum plate to prepare a coating film, and the coating film was prebaked at 150° C., then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation, and heated at 150° C. for 5 minutes to obtain a cured film having a film thickness of 10 to 20 μm. All the physical properties of the obtained cured film were evaluated by the following evaluation method. The amounts (molar amounts) of the respective components to be used and the evaluation results are shown in Table 4. It should be noted that the names and sources of acquisition of the respective components used in Example 1 are shown below.

(A) Compound which is Formed of Salt of Carboxylic Acid and Amine and has Carbonyl Group Generating Radical and Carboxylate Group Generating Base Through Decarboxylation by Irradiation with Light or Heating 1,2-Diisopropyl-4,4,5,5-tetramethylbiguanidinium 2-(3-benzoylphenyl)propionate; a compound represented by the formula [1-2] (the compound synthesized in accordance with WO 2014/208632 was used)

Formulae [1-2]:

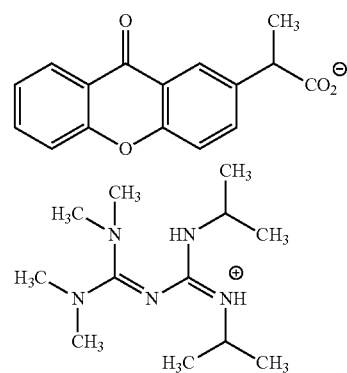

[1-2]

(B) Aluminum Alkoxide.

Aluminum tri-sec-butoxide (manufactured by FUJIFILM Wako Pure Chemical Corporation)

(C) Silane Coupling Agent Having Mercapto Group (3-Mercaptopropyl)trimethoxysilane (manufactured by Momentive Performance Materials Inc.; SILQUEST A-189 SILANE)

(H) Compound Having Two or More Polymerizable Unsaturated Groups

Triallyl cyanurate (manufactured by FUJIFILM Wako Pure Chemical Corporation)

(I) Filler

Aluminum nitride (AlN) (manufactured by Toyo Aluminium K. K.); Toyalnite JC (registered trademark); average particle diameter of 1.2 μm).

Dispersant

CF-180 (manufactured by FUJIFILM Wako Pure Chemical Corporation; carboxylic acid containing acrylate polymer PGMEA solution (solid content of 30%))

Method for Evaluating Various Physical Properties of Cured Film

Alkali Developability

During the immersion of the cured film in a 3% aqueous potassium hydroxide solution, a difference in the dissolution rate of the cured film between the exposed area and the unexposed area of the cured film could be seen, and a period of time required until an image appeared only by the immersion without special washing operation such as shower was measured. In a case where an image appeared within one minute, the alkali developability was evaluated as "Alkali developability: ○", and in a case where an image did not appear even after passage of one minute, the alkali developability was evaluated as "Alkali developability: X".

Organic Solvent Resistance

The curing film was immersed in each of three kinds of solvents, acetone, methanol, and methyl ethyl ketone for 30 seconds to confirm dissolution and peeling. In the immersion of the cured film in the three kinds of solvents, acetone, methanol, and methyl ethyl ketone, in a case where any of the cured film was not dissolved or peeled, the organic solvent resistance was evaluated as "Organic solvent resistance: ○", and in a case where the cured film was dissolved or peeled in a few solvents due to insufficient curing, the organic solvent resistance was evaluated as "Organic solvent resistance: X".

Adhesiveness (Cross-Cut Test)

The cured film was scored with a cutter knife such that the cutter knife reached the base, thereby making cuts in the form of grids at an interval of 1 mm (100 meshes). Subsequently, a pressure-sensitive adhesive tape with a length of about 50 mm was stuck to the cured film cut in the form of grids, and the top of the pressure-sensitive adhesive tape was rubbed with an eraser such that the tape was attached to the cured film. After 1 to 2 minutes from the attachment of the tape, an end of the tape was held, the tape was instantaneously peeled in a state where the angle between the tape and the surface of the cured film was being kept at 90°, and the peeling of the cured film was evaluated. In a case where the cured film was not peeled at all, the adhesiveness was evaluated as "Adhesiveness: ○", and in a case where the adhesiveness was partially peeled, the adhesiveness was evaluated as "Adhesiveness: X".

Pencil Hardness

Pencils with a hardness of B to 9H were sharpened such that the pencil lead became flat, and each of the pencils was loaded on a scratch hardness tester "KT-VF2380", the lead of the pencil was pressed on the cured film at an angle of about 45° with respect to the film, and the hardness of the pencil in a case where the cured film was not peeled was recorded (in accordance with JIS K5600, a load of 750 g).

Thermal Conductivity

A circular cured film in a width of 5 mmφ×a thickness of 1 mm was prepared from the resin composition under the same conditions as those in Examples using a cylindrical silicon mold, a surface thereof was treated with graphite, and then, a specific gravity thereof was calculated by subjecting the surface to a graphite treatment, and then accurately measuring the thickness (to 3 places of decimals), the diameter (to 3 places of decimals), and the weight (to 4 places of decimals). A thermal diffusivity was determined using a thermophysical property measuring device "LFA-502" (manufactured by Tokyo Electronics Manufacturing Co., Ltd.) adopting a xenon laser flash method (based on a testing method for thermal diffusivity-specific heat capacity in JIS R1611-2010 "Method for measuring thermal diffusivity-specific heat capacity and thermal conductivity for fine ceramics by flash method" and JIS 7810-2005 "Measurement of thermal diffusivity using metal laser flash method"). The thermal conductivity was calculated by multiplying the obtained thermal diffusivity, specific gravity, and specific heat together.

Heat Resistance (Mass Reduction Rate)

The cured film was warmed to room temperature through 500° C. at a temperature raising rate of 10° C./min in an argon atmosphere, using a differential scanning calorimeter TG-DTA "2000SA" (manufactured by BRUKER AXS, Inc.), and a reduction rate in mass at 250° C. was measured. It should be noted that "-" in the table indicates that the measurement has not been made.

Comparative Examples 1 to 3: Preparation of Cured Film Using Resin Composition by Irradiation with Light (Active Energy Rays) and Evaluation of Physical Properties of Cured Film Obtained A curing film was prepared in accordance with the same method as in Example 1, except that 1,2-diisopropyl-4,4,5,5-tetramethylbiguanidinium 2-(3-benzoylphenyl)propionate and aluminum tri-sec-butoxide used in Example 1 were changed to be under the conditions shown in Table 4, and all the physical properties thereof were evaluated. The amounts (molar amounts) of the respective components to be used and the evaluation results are shown in Table 4. It should be noted that the names and sources of acquisition of the components that were not used in Example 1 among the respective components used in Comparative Examples 1 to 3 are shown below.

Compound (carboxylic acid) having carbonyl group generating radical by irradiation with light or heating Ketoprofen (manufactured by FUJIFILM Wako Pure Chemical Corporation)

Aluminum compound (Ethyl acetoacetate)aluminum diisopropoxide (manufactured by FUJIFILM Wako Pure Chemical Corporation)

TABLE 4

|  |  | Example 1 | Comparative Example 1 | Comparative Example 2 | Comparative Example 3 |
|---|---|---|---|---|---|
| (A) Compound | Compound represented by formula [1-2] | 0.15 g (0.3 mmol) | 0.15 g (0.3 mmol) | 0.15 g (0.3 mmol) | — |
| Compound generating radical by irradiation with light or heating | Ketopropene | — | — | 0.05 g (0.2 mmol) | 0.05 g (0.2 mmol) |

TABLE 4-continued

|  |  | Example 1 | Comparative Example 1 | Comparative Example 2 | Comparative Example 3 |
|---|---|---|---|---|---|
| (B) Aluminum alkoxide | Aluminum tri-sec-butoxide | 0.98 g (4 mmol) | — | — | — |
| Aluminum compound | (Ethylacetoacetate)aluminum diisopropoxide | — | 1.09 g (4 mmol) | — | — |
| (C) Silane coupling agent | (3-Mercaptopropyl)trimethoxysilane | 1.17 g (6 mmol) | 1.17 g (6 mmol) | 1.98 g (10 mmol) | 1.98 g (10 mmol) |
| (D) Water | Ion exchange water | 0.27 g (15 mmol) | 0.27 g (15 mmol) | 0.27 g (15 mmol) | 0.27 g (15 mmol) |
| (H) Compound | Triallyl cyanurate | 0.49 g (2 mmol) | 0.49 g (2 mmol) | 0.83 g (3.3 mmol) | 0.83 g (3.3 mmol) |
| (I) Filler | AlN: Toyalnite JC | 12 g (293 mmol) | 12 g (293 mmol) | 12 g (293 mmol) | 12 g (293 mmol) |
| Organic solvent | Carbitol acetate | 3 g | 3 g | 3 g | 3 g |
| Dispersant | CF-180 | 0.20 g | 0.20 g | 0.20 g | 0.20 g |
| Alkali developability | 3% KOH | ○ | Not evaluated due to uncured composition | X | Not evaluated due to uncured composition |
| Organic solvent resistance | Solvent deposition | ○ |  | ○ |  |
| Adhesiveness | Cross-cut test | ○ |  | ○ |  |
| Pencil hardness | Load of 750 g | 4H |  | 2H |  |
| Thermal conductivity | W/m · K | 1.80 |  | 1.08 |  |

As evident from the results of Table 4, it could be seen that a cured product having a high hardness and a good thermal conductivity is obtained in a case of using the resin composition of Example 1, containing an aluminum alkoxide. Generally, an aluminum alkoxide is easily gelated since it has high reactivity to water, but it is found that an organosol is obtained without gelation in a case where hydrolysis is performed while (A) a compound according to the present invention is added together with a silane coupling agent having a mercapto group. In particular, an aluminum tri-sec-butoxide is liquid and has high compatibility with a silane coupling agent which has a mercapto group, and (A) a compound according to the present invention could be dissolved even without using an organic solvent.

In addition, it could be confirmed that an aluminosiloxane bond (Al—Si—O) is generated at room temperature with FT-IR (at around 600 cm$^{-1}$) in a case where water is added to a composition containing three kinds of components, (A) a compound, an aluminum alkoxide, and a silane coupling agent having a mercapto group according to the present invention. From this viewpoint, it could be seen that solation-gelation can be performed under a mind condition by the light- or heat-curing method of the embodiment of the present invention. In addition, since the (A) compound according to the present invention can generate a radical efficiently by irradiation with light (active energy rays) even in the coexistence of filler that hardly transmits light, such as aluminum nitride, it can promote a thiol-ene reaction. Accordingly, the solation-gelation and the thiol-ene reaction can be efficiently performed even in a case where the filler is contained in a large amount, and therefore, it could be seen that the light- or heat-curing method of the embodiment of the present invention is a curing method by which a cured product having high values of physical properties, such as a hardness, adhesiveness to a base material, and a thermal conductivity can be obtained in a simple method.

On the other hand, in the case of a curing system in which an aluminum compound partially chelated was used instead of the aluminum alkoxide (Comparative Example 1) or a curing system in which an aluminum alkoxide was not used (Comparative Example 2), a cured product was not obtained, or even in a case where the cured product was obtained, only the cured product having insufficient alkali developability or hardness was obtained. That is, it could be seen that the aluminum alkoxide is essential in the present curing system.

In addition, in a case of a curing system where a carboxylic acid generating a radical but not generating a base with irradiation with light (active energy rays) instead of (A) a compound according to the present invention (Comparative Example 3), a cured product was not obtained. From this viewpoint, it could be seen that a compound capable of generating both of a base and a radical is also essential in the present curing system.

Examples 2 to 5: Preparation of Cured Film Using Resin Composition to which Compound Having Two or More Epoxy Groups has been Added and Evaluation of Physical Properties of Cured Film Obtained A curing film was prepared in accordance with the same method as in Example 1, except that a compound having two or more epoxy groups was added to the reaction system of Example 1 and the type of the aluminum nitride used in Example 1 was replaced, and all the physical properties thereof were evaluated. The amounts (molar amounts) of the respective components to be used and the evaluation results are shown in Table 5. It should be noted that the names and sources of acquisition of the components that were not used in Example 1 and Comparative Examples 1 to 3 among the respective components used in Examples 2 to 5 are shown below.

(I) Filler

Aluminum nitride (AlN) (manufactured by Toyo Aluminium K. K.; TFZ-A02P; average particle diameter of 1.5 μm)

Aluminum nitride (AlN) (manufactured by Toyo Aluminium K. K.; TFZ-A15P; average particle diameter of 15.0 μm)

(J) Compound Having Two or More Epoxy Groups

Bisphenol A liquid epoxy resin (manufactured by Mitsubishi Chemical Corporation; jER828 (registered trademark))

Triglycidyl cyanurate (2,4,6-tri(glycidyloxy)-1,3,5-triazine) (manufactured by Nippon Carbide Industries Co., Ltd.; TGC)

Triglycidyl isocyanurate (manufactured in Nissan Chemical Corporation; TEPIC-S (registered trademark))

TABLE 5

|  |  | Example 2 | Example 3 | Example 4 | Example 5 |
|---|---|---|---|---|---|
| (A) Compound | Compound represented by formula [1-2] | 0.15 g (0.3 mmol) | 0.15 g (0.3 mmol) | 0.15 g (0.3 mmol) | 0.10 g (0.2 mmol) |
| (B) Aluminum alkoxide | Aluminum tri-sec-butoxide | 0.98 g (4 mmol) | 0.98 g (4 mmol) | 0.98 g (4 mmol) | 0.98 g (4 mmol) |
| (C) Silane coupling agent | (3-Mercaptopropyl)trimethoxysilane | 1.17 g (6 mmol) | 1.17 g (6 mmol) | 1.17 g (6 mmol) | 1.17 g (6 mmol) |
| (D) Water | Ion change water | 0.27 g (15 mmol) | 0.27 g (15 mmol) | 0.27 g (15 mmol) | 0.27 g (15 mmol) |
| (H) Compound | Triallyl cyanurate | 0.27 g (1 mmol) | 0.27 g (1 mmol) | 0.27 g (1 mmol) | 0.27 g (1 mmol) |
| (I) Filler | AlN: Toyalnite JC | 12 g (293 mmol) | 12 g (293 mmol) | 12 g (293 mmol) | — |
|  | AlN: TFZ-A02P | — | — | — | 8.6 g (210 mmol) |
|  | AlN: TFZ-A15P | — | — | — | 3.4 g (83 mmol) |
| (J) Compound | jER828 | 0.56 g (1.5 mmol) | — | — | — |
|  | TGC | — | 0.29 g (1 mmol) | — | — |
|  | TEPIC-S | — | — | 0.29 g (1 mmol) | 0.29 g (1 mmol) |
| Organic solvent resistance | Organic deposition | 3 g | 3 g | 3 g | 3 g |
| Dispersant | CF-180 | 0.20 g | 0.20 g | 0.20 g | 0.20 g |
| Alkali developability | 3% KOH | ○ | ○ | ○ | ○ |
| Organic solvent resistance | Organic deposition | ○ | ○ | ○ | ○ |
| Adhesiveness | Cross-cut test | ○ | ○ | ○ | ○ |
| Pencil hardness | Load of 750 g | 6H | 8H | 8H | 8H |
| Thermal conductivity | W/m · K | 1.11 | 1.53 | 1.65 | 2.21 |
| Heat resistance (mass reduction rate) | % | — | — | — | 0.93 |

As evident from the results of Table 5, it could be seen that a cured product having a high hardness is obtained by the addition of a compound having two or more epoxy groups in the curing system. In addition, it could be seen that even in a case where two or more kinds of filler having different particle diameters are used in combination, a cured product can be obtained in a simple method. In particular, in a case where filler (TFZ-A02P and TFZ-A15P) that had been subjected to a surface treatment for suppressing hydrolysis was used, it was found that the thermal conductivity of the obtained cured product tended to be improved.

Examples 6 and 7: Preparation of Cured Film Using Composition to which Chelating Agent has been Added and Evaluation of Physical Properties of Cured Film Obtained Methyl acetoacetate [chelate agent (F)] was added to aluminum tri-sec-butoxide [(B) aluminum alkoxide] and the mixture was stirred until heat generation was suppressed. Subsequently, a sol solution was prepared by adding 1,2-diisopropyl-4,4,5,5-tetramethylbiguanidinium 2-(3-benzoylphenyl)propionate [(A) compound] and (3-mercaptopropyl)trimethoxysilane [(C) silane coupling agent] were added, and a solution obtained incorporating an ion exchange water [(D) water] and a carbitol acetate [organic solvent] was obtained thereto, and the mixture was stirred for 30 minutes. Subsequently, the prepared sol solution was added into a mixture of triallyl cyanurate [(H) compound], aluminum nitride [(I) filler], and carbitol acetate [organic solvent], and kneaded at a rotation speed of 2,000 rpm for 3 minutes using a planetary stirrer ("AWATORI RENTARO AR-250", Thinky Corporation) to prepare a resin composition. The obtained resin composition was applied onto an aluminum plate to prepare a coating film, and the coating film was prebaked at 150° C., then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation, and heated at 150° C. for 5 minutes to obtain a cured film having a film thickness of 10 to 20 μm. All the physical properties of the obtained cured film were evaluated by the following evaluation method. The amounts (molar amounts) of the respective components to be used and the evaluation results are shown in Table 6. It should be noted that the names and sources of acquisition of the components that were not used in Examples 1 to 5 and Comparative Examples 1 to 3 among the respective components used in Examples 6 and 7 are shown below.

(F) Chelating Agent

Methyl acetoacetate (manufactured by FUJIFILM Wako Pure Chemical Corporation)

Comparison Example 4: Preparation of Cured Film Using Resin Composition to which Chelating Agent has not been Added A solution formed by incorporating ion exchange water [(D) water] and carbitol acetate [organic solvent] was added into a mixture of 1,2-diisopropyl-4,4,5,5-tetramethylbiguanidinium 2-(3-benzoylphenyl)propionate [(A) compound], aluminum tri-sec-butoxide [(B) aluminum alkoxide], and (3-mercaptopropyl)trimethoxysilane [(C) silane coupling agent], the mixture was stirred, thereby precipitating a solid gel, thus, a uniform sol solution could not be prepared, and correspondingly, a resin composition could not be prepared. The amounts (molar amounts) of the respective components to be used are shown in Table 6.

TABLE 6

|  |  | Example 6 | Example 7 | Comparative Example 4 |
|---|---|---|---|---|
| (A) Compound | Compound represented by formula [1-2] | 0.15 g (0.3 mmol) | 0.15 g (0.3 mmol) | 0.15 g (0.3 mmol) |
| (B) Aluminum alkoxide | Aluminum tri-sec-butoxide | 1.23 g (5 mmol) | 1.47 g (6 mmol) | 1.23 g (5 mmol) |
| (C) Silane coupling agent | (3-Mercaptopropyl)trimethoxysilane | 0.98 g (5 mmol) | 0.78 g (4 mmol) | 0.98 g (5 mmol) |
| (D) Water | Ion exchange water | 0.27 g (15 mmol) | 0.27 g (15 mmol) | 0.27 g (15 mmol) |
| (H) Compound | Triallyl cyanurate | 0.41 g (1.6 mmol) | 0.32 g (1.3 mmol) | 0.41 g (1.6 mmol) |
| (I) Filler | AlN: Toyalnite JC | 12 g (293 mmol) | 12 g (293 mmol) | 12 g (293 mmol) |
| (F) Chelating agent | Methyl acetoacetate | 0.58 g (5 mmol) | 0.70 g (6 mmol) | — |
| Organic solvent | Carbitol acetate | 3 g | 3 g | 3 g |
| Alkali developability | 3% KOH | ○ | ○ | Not evaluated due to precipitated solid gel at the time of preparing sol |
| Organic solvent resistance | Solvent deposition | ○ | ○ | |
| Adhesiveness | Cross-cut test | ○ | ○ | |
| Pencil hardness | Load of 750 g | 7H | 7H | |
| Thermal conductivity | W/m · K | 1.43 | 1.27 | |

As evident from the results of Table 6, in a case where the content of the aluminum alkoxide was increased to adjust a molar ratio of the aluminum alkoxide and the silane coupling agent to 5:5 or more in the present curing system, it was found as a result that a sol solution was hardly prepared (Comparative Example 4). However, in a case where a chelating agent such as methyl acetoacetate was added to the present curing system, a solid gel was not precipitated, thus, a cured product was obtained even with an increase in the content of the aluminum alkoxide, and the physical properties were also good.

Examples 8 and 9: Preparation of Cured Film by Post-Addition of Water and Evaluation of Physical Properties of Cured Film Obtained Triallyl cyanurate [(H) compound], aluminum nitride [(I) filler], and carbitol acetate [organic solvent] were added into a mixture of 1,2-diisopropyl-4,4,5,5-tetramethylbiguanidinium 2-(3-benzoylphenyl)propionate [(A) compound], aluminum tri-sec-butoxide [(B) aluminum alkoxide], and (3-mercaptopropyl)trimethoxysilane [(C) silane coupling agent] (Example (8)) or a mixture of 1,2-diisopropyl-4,4,5,5-tetramethylbiguanidinium 2-(3-benzoylphenyl)propionate [(A) compound], aluminum tri-sec-butoxide [(B) aluminum alkoxide], (3-mercaptopropyl)trimethoxysilane [(C) silane coupling agent], and 2-(2-thioxanthenyl)diethyl malonic acid[(F) chelating agent] (Example (9)), and a solution formed by incorporating ion exchange water [(D) water] and carbitol acetate [organic solvent] were added dropwise thereto. The mixture was kneaded at a rotation speed of 2,000 rpm for 3 minutes using a planetary stirrer ("AWATORI RENTARO AR-250", Thinky Corporation) to prepare a resin composition. The obtained resin composition was applied onto an aluminum plate to prepare a coating film, and the coating film was prebaked at 150° C., and then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation to obtain a cured film having a film thickness of 10 to 20 μm. All the physical properties of the obtained cured film were evaluated by the following evaluation method. The amounts (molar amounts) of the respective components to be used and the evaluation results are shown in Table 7. It should be noted that the names and sources of acquisition of the components that were not used in Examples 1 to 7 and Comparative Examples 1 to 4 among the respective components used in Examples 8 and 9 are shown below.

(F) Chelating Agent 2-(2-Thioxanthenyl)diethyl malonic acid (manufactured by FUJIFILM Wako Pure Chemical Corporation)

TABLE 7

|  |  | Example 8 | Example 9 |
|---|---|---|---|
| (A) Compound | Compound represented by formula [1-2] | 0.15 g (0.3 mmol) | 0.05 g (0.1 mmol) |
| (B) Aluminum alkoxide | Aluminum tri-sec-butoxide | 1.23 g (5 mmol) | 1.23 g (5 mmol) |
| (C) Silane coupling agent | (3-Mercaptopropyl)trimethoxysilane | 0.98 g (5 mmol) | 0.98 g (5 mmol) |
| (D) Water | Ion exchange water | 0.27 g (15 mmol) | 0.27 g (15 mmol) |
| (H) Compound | Triallyl cyanurate | 0.41 g (1.6 mmol) | 0.41 g (1.6 mmol) |
| (I) Filler | AlN: Toyalnite 4C | 12 g (293 mmol) | 12 g (293 mmol) |
| (F) Chelating agent | 2-(2-Thioxanthenyl)diethyl malonic acid | — | 0.11 g (0.3 mmol) |
| Organic solvent | Carbitol acetate | 3 g | 3 g |

TABLE 7-continued

|  |  | Example 8 | Example 9 |
|---|---|---|---|
| Alkali developability | 3% KOH | ◯ | ◯ |
| Organic solvent resistance | Solvent deposition | ◯ | ◯ |
| Adhesiveness | Cross-cut test | ◯ | ◯ |
| Pencil hardness | Load of 750 g | 9H | 9H |
| Thermal conductivity | W/m · K | 1.46 | 1.32 |

As evident from the results of Table 7, it could be seen that the dispersibility of the filler is improved by adding water at last in the present curing system, a resin composition (sol solution) is obtained without addition of a dispersant, and a cured product is obtained by irradiating the composition with light (active energy rays). In addition, the obtained cured product had a high hardness. That is, it could be seen that a resin composition having high curing performance is obtained even without addition of a compound having two or more epoxy groups by adding water at last. Generally, although it is considered that aluminum nitride is easily hydrolyzed, it could be seen that a significant decrease in a thermal conductivity is not seen, and a cured product having sufficient performance, that is, a cured product having a high hardness or adhesiveness and having good alkali developability or organic solvent resistance is obtained even while not heating after irradiation with light (active energy rays) in the present curing system. In addition, in a case where a compound having chelating ability and absorbing light (active energy rays) at a long wavelength, such as 2-(2-thioxanthenyl)diethyl malonic acid, was added, photosensitivity could be imparted at a long wavelength from the viewpoint that a cured product was obtained even in case of irradiation with only light at a long wavelength (active energy rays: irradiated to a surface illuminance of 405 nm and a cumulative exposure amount of 1.0 J/cm$^2$, ultraviolet ray irradiating light source device (manufactured by Asahi Spectra Co., Ltd.: "REX-250" and a band-pass filter used).

Example 10: Preparation of Cured Film Using Polyfunctional (Meth)Acrylic Compound and Evaluation of Physical Properties of Cured Film Obtained Ethyl lactate [as (F) chelating agent as well as an organic solvent] was added into a mixture of aluminum tri-sec-butoxide [(B) aluminum alkoxide] and (3-mercaptopropyl)trimethoxysilane [(C) silane coupling agent], the mixture was left to stand at room temperature for 12 hours, and then 1,2-diisopropyl-4,4,5,5-tetramethylbiguanidinium 2-(3-benzoylphenyl)propionate [(A) compound] and ion exchange water [(D) water] were added thereto to prepare a sol solution. Subsequently, the sol solution prepared above was added to aluminum nitride [(I) filler], the mixture was kneaded at a rotation speed of 2,000 rpm for 1 minute using a planetary stirrer ("AWATORI RENTARO AR-250", Thinky Corporation), and then dipentaerythritolhexaacrylate [(H) compound] was added thereto, and the mixture was kneaded at a rotation speed of 500 rpm for 1 minute, thereby preparing a resin composition. The obtained resin composition was applied onto an aluminum plate to prepare a coating film, and the coating film was prebaked at 150° C., then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation, and heated at 150° C. for 1 hour to obtain a cured film. Among various physical properties of the obtained cured film, the alkali developability, the organic solvent resistance, the adhesiveness, and the pencil hardness were evaluated by the evaluation methods, and the thermal conductivity was evaluated by the following evaluation method. The amounts (molar amounts) of the respective components to be used and the evaluation results are shown in Table 8. It should be noted that the names and sources of acquisition of the components that were not used in Examples 1 to 9 and Comparative Examples 1 to 4 among the respective components used in Example 10 are shown below.

(H) Compound Having Two or More Polymerizable Unsaturated Groups

Dipentaerythritol hexaacrylate (manufactured by Nippon Kayaku Co., Ltd.; KAYARAD DPHA)

Method for Evaluating Thermal Conductivity of Cured Film

A cured film having a width of 2×2 mm×a thickness of about 100 μm was prepared from a resin composition under the same conditions as in Examples in a mold formed of 2×2 cm silicon release paper. After heating the obtained cured film at 150° C. for 1 hour, the cured film was cut out into 1×1 cm and a surface thereof was subjected to a graphite treatment to obtain a sample, and a specific gravity thereof was calculated by subjecting the surface to a graphite treatment, and then accurately measuring the thickness (to 3 places of decimals), the diameter (to 3 places of decimals), and the weight (to 4 places of decimals). For the obtained samples, a thermal diffusivity and a specific heat were determined using a laser flash thermal property measuring device "LFA447" (manufactured by NETZTCH).

Examples 11 to 13: Preparation of Cured Film Using Polyfunctional (Meth)Acrylic Compound and Evaluation of Physical Properties of Cured Film Obtained A cured film was prepared in accordance with the same method as in Example 10, except that the type of (I) filler used in Example 10 was replaced, and the physical properties were evaluated. The amounts (molar amounts) of the respective components to be used and the evaluation results are shown in Table 8. It should be noted that the names and sources of acquisition of the components that were not used in Examples 1 to 10 and Comparative Examples 1 to 4 among the respective components used in Examples 11 to 13 are shown below.

(I) Filler

Magnesium oxide (Magnesia) (manufactured by Ako Kasei Co., Ltd.; MgO6K; average particle diameter of 6 μm)

Aluminum oxide (alumina) (manufactured by Denka Co., Ltd.; DAW-03; average particle diameter of 3.7 μm)

Aluminum nitride (AlN) (manufactured by Toyo Aluminium K. K.; TFZ-A10P; average particle diameter of 9.9 μm)

TABLE 8

| | | Example 10 | Example 11 | Example 12 | Example 13 |
|---|---|---|---|---|---|
| (A) Compound | Compound represented by formula [1-2] | 0.13 g (0.25 mmol) | 0.13 g (0.25 mmol) | 0.13 g (0.25 mmol) | 0.13 g (0.25 mmol) |
| (B) Aluminum alkoxide | Aluminum tri-sec-butoxide | 0.82 g (3.3 mmol) | 0.82 g (3.3 mmol) | 0.82 g (3.3 mmol) | 1.03 g (4.2 mmol) |
| (C) Silane coupling agent | (3-Mercaptopropyl)trimethoxysilane | 0.98 g (5.0 mmol) | 0.98 g (5.0 mmol) | 0.98 g (5.0 mmol) | 0.82 g (4.2 mmol) |
| (D) Water | Ion exchange water | 0.22 g (12 mmol) | 0.22 g (12 mmol) | 0.22 g (12 mmol) | 0.22 g (12 mmol) |
| (H) Compound | KAYARAD DPHA | 0.47 g (0.82 mmol) | 0.47 g (0.82 mmol) | 0.47 g (0.82 mmol) | 0.40 g (0.7 mmol) |
| (I) Filer | AlN: TFZ-A02P | 3 g (73 mmol) | — | — | 14 g (34 mmol) |
| | AlN: TFZ-A15P | 7 g (171 mmol) | — | — | 8.4 g (205 mmol) |
| | Magnesia: Mg06K | — | 14 g (347 mmol) | — | — |
| | Alumina: DAW-03 | — | — | 14 g (137 mmol) | — |
| | AlN: TFZ-A10P | — | — | — | 42 g (102 mmol) |
| (F) Chelating agent/ Organic solvent | Ethyl lactate | 2.0 g (16.9 mmol) | 2.0 g (16.9 mmol) | 2.0 g (16.9 mmol) | 2.0 g (16.9 mmol) |
| Alkali developability | 3% KOH | ○ | ○ | ○ | ○ |
| Organic solvent resistance | Solvent deposition | ○ | ○ | ○ | ○ |
| Adhesiveness | Cross-cut test | ○ | ○ | ○ | ○ |
| Pencil hardness | Load of 750 g | 9H | 9H | 9H | 9H |
| Thermal conductivity | W/m · K | 4.6 | 4.6 | 3.1 | 65 |

As evident from the results of Table 8, it could be seen that a sol solution can be stably prepared by using ethyl lactate as a chelating agent as well as an organic solvent. In addition, it could be seen that a thiol-ene reaction by a radical and a Michael addition reaction by a base are allowed to proceed simultaneously by using the polyfunctional (meth)acrylic compound, and a cured product can be produced in high density. Furthermore, a filling rate of filler could be increased, and a thermal conductivity of a cured product was also improved. It could be seen that a cured film having a high thermal conductivity can be prepared even in a case where thermally conductive filler other than aluminum nitride, such as magnesia and alumina, is used, and a cured film having a high thermal conductivity is obtained by using three kinds of aluminum nitride having different particle diameters.

Comparison 5: Preparation of Cured Film Using Commercially Available Heat-Radiating Resin Composition and Evaluation of Physical Properties of Cured Film Obtained A heat-radiating solder resist (manufactured by Taiyo Ink Mfg. Co., Ltd.; PSR-4000HS2W/CA-4000HS2W=95:5) was applied onto an aluminum plate to prepare a coating film, and the coating film was prebaked at 150° C., then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation to obtain a cured film having a film thickness of 10 μm. The alkali developability, the adhesiveness, the pencil hardness, and the thermal conductivity of the obtained cured film were evaluated. The evaluation results are shown in Table 9. It should be noted that all the physical properties of the cured film were evaluated in accordance with the same evaluation method as in Example 1, except that in the evaluation method, with regard to the alkali developability, a 5% aqueous potassium hydroxide solution was used instead of the 3% aqueous potassium hydroxide solution of Example 1, and with regard to the pencil hardness, evaluation was performed under a load of 1,000±10 g instead of a load of 750 g of Example 1.

TABLE 9

| | | Comparative Example 5 |
|---|---|---|
| Alkali developability | 5% KOH | X |
| Adhesiveness | Cross-cut test | X (45/100 peel) |
| Pencil hardness | Load of 1,000 ± 10 g | 6H |
| Thermal conductivity | W/m · K | 1.24 |
| Heat resistance (mass reduction rate) | % | 0.91 |

As evident from the results of Table 9, it was found as a result that a cured product obtained from a commercially available heat-radiating resin composition has poor developability even with a use of a 5% aqueous potassium hydroxide solution, and alkali development is slower than a cured product obtained from a resin composition in the present curing system. In addition, from the viewpoint that a cured product obtained from a commercially available heat-radiating resin composition has a half degree of the peeling in the cross-cut test, it was found as a result that adhesiveness to a base material is lower than that of a cured product obtained from a resin composition in the present curing system.

Comparison Example 6: Preparation of Cured Film Using Thiol-Ene Reaction Using Resin Composition not Containing Silane Coupling Agent Having Mercapto Group A mixture containing 1,2-diisopropyl-4,4,5,5-tetramethylbiguanidinium 2-(3-benzoylphenyl)propionate [(A) compound], triallyl cyanurate [(H) compound], aluminum nitride [(I) filler], pentaerythritol tetrakis(3-mercaptopropionate), polyvinylpyrrolidone [dispersant], and ethyl lactate

[serving as (F) chelating agent as well as an organic solvent] was kneaded using a planetary ball mill P-6 (manufactured by Fritsch Japan Co., Ltd.) at a rotation speed of 2,000 rpm for 3 minutes to prepare a resin composition. The obtained resin composition was applied onto an aluminum plate to prepare a coating film, and the coating film was prebaked at 150° C. and then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation in a nitrogen stream, but a cured film was not obtained. The amounts (molar amounts) of the respective components to be used are shown in Table 10. It should be noted that the names and sources of acquisition of the components not used in Examples 1 to 13 and Comparative Examples 1 to 5 among the respective components used in Comparative Example 6 are shown below.

Compound Having Mercapto Group but not Having Silanol Group

Pentaerythritol tetrakis(3-mercaptopropionate) (manufactured by FUJIFILM Wako Pure Chemical Corporation; PEMP)

Dispersant

Polyvinylpyrrolidone (manufactured by FUJIFILM Wako Pure Chemical Corporation; PVP-K25)

Comparison Example 7: Preparation of Cured Film Using Radical Polymerization Reaction of Acrylate Using Resin Composition not Containing Silane Coupling Agent Having Mercapto Group A mixture containing 1,2-diisopropyl-4,4,5,5-tetramethylbiguanidinium 2-(3-benzoylphenyl)propionate [(A) compound], dipentaerythritolhexaacrylate, aluminum nitride [(I) filler], polyvinylpyrrolidone [dispersant], and ethyl lactate [serving as (F) chelating agent as well as an organic solvent] was kneaded using a planetary ball mill P-6 (manufactured by Fritsch Japan Co., Ltd.) at a rotation speed of 2,000 rpm for 3 minutes to prepare a resin composition. The obtained resin composition was applied onto an aluminum plate to prepare a coating film, and the coating film was prebaked at 150° C. and then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation in a nitrogen stream, but a cured film was not obtained. The amounts (molar amounts) of the respective components to be used are shown in Table 10.

Comparative Example 8: Preparation of Cured Film Using Sol-Gel Reaction and Radical Polymerization Reaction of Acrylate Using Resin Composition Containing Silane Coupling Agent Having (Meth)Acryl Group Ion exchange water [(D) water] was added into a mixture of 1,2-diisopropyl-4,4,5,5-tetramethylbiguanidinium 2-(3-benzoylphenyl)propionate [(A) compound], 3-(methacryloyloxy)propyltrimethoxysilane, and ketoprofen, and the mixture was stirred for 30 minutes to prepare a sol solution. Subsequently, the prepared sol solution was added to a mixture of aluminum nitride [(I) filler], polyvinylpyrrolidone [dispersant], and ethyl lactate [serving as (F) chelating agent as well as an organic solvent], and the mixture was kneaded using a planetary ball mill P-6 (manufactured by Fritsch Japan Co., Ltd.) at a rotation speed of 300 rpm for 120 minutes to prepare a resin composition. The obtained resin composition was applied onto an aluminum plate to prepare a coating film, and the coating film was prebaked at 150° C., then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation in a nitrogen stream, and heated at 150° C. for 5 minutes, but a cured film was not obtained. The amounts (molar amounts) of the respective components to be used are shown in Table 10. In addition, the names and sources of acquisition of the components not used in Examples 1 to 13 and Comparative Examples 1 to 7 among the respective components used in Comparative Example 8 are shown below.

Silane Coupling Agent Having (Meth)Acryl Group 3-(Methacryloyloxy)propyltrimethoxysilane (manufactured by Shin-Etsu Chemical Co., Ltd.)

TABLE 10

| | | Comparative Example 6 | Comparative Example 7 | Comparative Example 8 |
|---|---|---|---|---|
| (A) Compound | Compound represented by formula [1-2] | 0.15 g (0.3 mmol) | 0.15 g (0.3 mmol) | 0.15 g (0.3 mmol) |
| Compound generating radical by irradiation with light or heating | Ketoprofen | — | — | 0.05 g (0.2 mmol) |
| (D) Water | Ion exchange water | — | — | 0.18 g (10 mmol) |
| (H) Compound | Triallyl cyanurate | 0.83 g (3.3 mmol) | — | — |
| (I) Filler | AlN: Toyalnite JC | 12 g (293 mmol) | 12 g (293 mmol) | 12 g (293 mmol) |
| Mercapto group-containing compound (not containing silanol group) | PEMP | 1.22 g (10 mmol) | — | — |
| Polyfunctional (meth)acryl compound | KAYARAD DPHA | — | 5.78 g (10 mmol) | — |
| (Meth)acryl group-containing silane coupling agent | 3-(Methacryloyloxy)propyltrimethoxysilane | — | — | 2.48 g (10 mmol) |
| (F) Chelating agent/ Organic solvent | Ethyl lactate | 4 g | 3 g | 3 g |
| Dispersant | PVP-25K | 0.12 g | 0.12 g | 0.12 g |
| Light curing (in nitrogen stream) | 254 nm = 9 mJ/cm$^2$ 365 nm = 11 mJ/cm$^2$ | Not cured | Not cured | Not cured |

As evident from Table 10, in a case where a compound having a mercapto group but not having a silanol group was used instead of a silane coupling agent having a mercapto group (Comparative Example 6), a thiol-ene reaction proceeded, but a solation-gelation did not proceed. Therefore, it could be seen that in a case where a filling rate of filler is set to 80% or more, a light curing does not proceed properly and a cured product is not obtained. In addition, it could be seen that in a case where a polyfunctional (meth)acrylic compound is used instead of a silane coupling agent having a mercapto group (Comparative Example 7), radical polymerization between the polyfunctional (meth)acrylic groups proceeds, but in a case where a filling rate of filler is set to 80% or more, a light curing does not proceed properly and a cured product is not obtained. From the viewpoint that in Comparative Example 8, both the radical polymerization between the (meth)acrylic groups and the sol-gelation proceeded, but a cured product was not obtained, it is suggested that in the radical polymerization between the (meth)acrylic groups, a desired cured product is not obtained. In the curing systems of Comparative Example 6 and Comparative Example 7, it was found as a result that in a case where a filling rate of filler is lowered to about 70%, a cured product itself is obtained, but peeling of the cured product occurs in the cross-cut test, the adhesiveness of the cured product is insufficient, and the cured product is brittle. From the above results, it could be seen that both of the sol-gelation and the thiol-ene reaction are important reaction systems for establishing the present curing system.

From the viewpoint that a compound having a mercapto group generally has high affinity with various metals and is easily bonded to a metal substrate such as aluminum and copper, it is considered as one of factors for improving adhesiveness of a cured product. In addition, in a system containing a large amount of filler, it could be seen that a cured product having a high hardness or adhesiveness is obtained for the first time in a curing system having a high filling rate of the filler by combining an aluminum alkoxide with a silane coupling agent having a mercapto group.

Comparison Example 9: Preparation of Cured Film Using Resin Composition to which Metal Hydroxide has been Directly Added and Evaluation of Physical Properties of Cured Film Obtained Triallyl cyanurate [(H) compound], aluminum nitride [(I) filler], CF-180 [dispersant], and carbitol acetate [organic solvent] were added into a mixture of 1,2-diisopropyl-4,4,5,5-tetramethylbiguanidinium 2-(3-benzoylphenyl)propionate [(A) compound], aluminum hydroxide, and (3-mercaptopropyl)trimethoxysilane [(C) silane coupling agent], and a solution formed by incorporating ion exchange water [(D) water] and carbitol acetate [organic solvent] was added dropwise thereto. The mixture was kneaded at a rotation speed of 2,000 rpm for 3 minutes using a planetary stirrer ("AWATORI RENTARO AR-250", Thinky Corporation) to prepare a resin composition. The obtained resin composition was applied onto an aluminum plate to prepare a coating film, and the coating film was prebaked at 150° C., then irradiated with light (active energy rays: a surface illuminance of 254 nm=9 mJ/cm$^2$ and a surface illuminance of 365 nm=11 mJ/cm$^2$) for 1 minute using "HLR-100-2" manufactured by SEN LIGHTS Corporation, and heated at 150° C. for 5 minutes, but a cured film was not obtained. The amounts (molar amounts) of the respective components to be used are shown in Table 11. It should be noted that the names and sources of acquisition of the components not used in Examples 1 to 13 and Comparative Examples 1 to 8 among the respective components used in Comparative Example 9 are shown below.

Aluminum Compound

Aluminum hydroxide (manufactured by FUJIFILM Wako Pure Chemical Corporation)

TABLE 11

| | | Comparative Example 9 |
|---|---|---|
| (A) Compound | Compound represented by formula [1-2] | 0.15 g (0.3 mmol) |
| Aluminum compound | Aluminum hydroxide | 0.78 g (10 mmol) |
| (C) Silane coupling agent | (3-Mercaptopropyl)trimethoxysilane | 1.96 g (10 mmol) |
| (H) Compound | Triallyl cyanurate | 0.83 g (3.3 mmol) |
| (I) Filler | AlN: Toyalnite JC | 12 g (293 mmol) |
| Organic solvent | Carbitol acetate | 3 g |
| Dispersant | CF-180 | 0.08 g |
| Light curing (in nitrogen stream) | 254 nm = 9 mJ/cm$^2$ 365 nm = 11 mJ/cm$^2$ | Not cured |

In a Comparative Example 9, a curing system not requiring an addition of water was tried directly using a metal hydroxide. As evident from the results of Table 11, it could be seen that in a case where aluminum hydroxide in a hydrolyzed state is used, the aluminum hydroxide and a silane coupling agent cannot be efficiently reacted with each other due to poor compatibility with the silane coupling agent, and a cured product is not obtained. Therefore, it could be seen that a method directly using metal hydroxide without an addition of water is not suitable in the present curing system.

As evident from the above results, it could be seen that a sol-gelation and a thiol-ene reaction or a sol-gelation and a thiol-yne reaction are important in the light- or heat-curing method of the embodiment of the present invention. The light- or heat-curing method of the embodiment of the present invention is a method in which the reactions of both the solation-gelation and the thiol-ene reaction or the solation-gelation and the thiol-yne reaction can be efficiently performed in a reaction system containing (I) filler, and a cured product (crosslinked product or resin) having desired physical properties is obtained in a simple method. From the results of Examples and Comparative Examples, it could be seen that it is important to perform a reaction by generating both of a base and a radical from (A) a compound by irradiation with light or heating, using a combination of (A) a compound that is formed of a salt of a carboxylic acid and an amine and has a carbonyl group generating a radical and a carboxylate group generating a base through decarboxylation by irradiation with light or heating, (B) an aluminum alkoxide, (C) a silane coupling agent having a mercapto group, (D) water, (H) a compound having two or more polymerizable unsaturated groups, and (I) filler to perform a reaction in order to obtain a cured product (crosslinked product or resin) having desired physical properties in a simple method.

INDUSTRIAL APPLICABILITY

The light- or heat-curing method of the embodiment of the present invention is a method in which partial condensation (solation) between (B) an aluminum alkoxide and (C) a silane coupling agent or between (C) silane coupling agents is performed by the addition of water, then both of a base and a radical are generated from (A) a compound by irradiation with light (active energy rays) or heating, and thus, polycondensation (gelation) between (E) condensates having constitutional units of Si—O—Al and/or Si—O—Si obtained by a solation and a thiol-ene reaction or a thiol-yne reaction between the mercapto group of (E) a condensate and the polymerizable unsaturated group in (H) a compound are performed in the same system, and is also a method by which it is possible not only to effectively perform the solation-gelation and the thiol-ene reaction or the solation-gelation and the thiol-yne reaction, but also to obtain a cured product (crosslinked product or resin) in a simple method even in a case where filler is contained in a large amount. Therefore, the light- or heat-curing method of the embodiment of the present invention is useful as a method for rapidly and efficiently preparing a cured product (crosslinked product or resin) having high thermal conduction.

As compared with curable resin compositions in the related art, the curable resin composition of the embodiment the present invention is a useful composition in which a large amount of filler can be filled and from which a cured product (crosslinked product or resin) having excellent alkali developability, organic solvent resistance, hardness, and adhesiveness can be prepared. In addition, the curable resin composition of the embodiment the present invention can make it possible to prepare a cured product (crosslinked product or resin) having desired performance in a simple method by irradiation with light (active energy rays) or heating, and therefore, is a useful composition which is capable of remarkably improving the productivity of a cured product. Therefore, the curable resin composition of the embodiment the present invention is useful as a resin raw material in an optical member or electronic member such as a paint, an ink material, a coating material, an adhesive material, a dental material, a resist, a color filter, an interlayer insulating film, a thermally conductive film, a thermally conductive insulating film, and a wiring coated film.

Since the thermally conductive substrate for forming an electronic circuit of the present invention has high thermal conduction and electrical insulating properties, it is useful as, for example, a heat-radiating substrate or an electrically insulating substrate for a high-brightness LED or a power semiconductor.

The invention claimed is:

1. A light- or heat-curing method comprising:
   a step 1 of obtaining (E) a condensate having constitutional units of Si—O—Al and optionally Si—O—Si, obtained from aluminum derived from an aluminum alkoxide and a silane derived from a silane coupling agent having a mercapto group, from (A) a compound that is formed of a salt of a carboxylic acid and an amine and has a carbonyl group generating a radical and a carboxylate group generating a base through decarboxylation by irradiation with light or heating, the (B) aluminum alkoxide, the (C) silane coupling agent having a mercapto group, and (D) water; and
   a step 2 of performing a reaction among the (E) condensate, (H) a compound having two or more polymerizable unsaturated groups, and (I) filler under the conditions of irradiation with light or heating in the presence of the (A) compound.

2. A light- or heat-curing method comprising:
   a step 1 of obtaining (E) a sol by performing a reaction among (A) a compound that is formed of a salt of a carboxylic acid and an amine and has a carbonyl group generating a radical and a carboxylate group generating a base through decarboxylation by irradiation with light or heating, (B) an aluminum alkoxide, (C) a silane coupling agent having a mercapto group, and (D) water; and
   a step 2 of obtaining a cured product from the (E) sol, (H) a compound having two or more polymerizable unsaturated groups, and (I) filler by irradiation with light or heating in the presence of the (A) compound.

3. The curing method according to claim 1, wherein the step 1 is a step of obtaining (E) a condensate having constitutional units of Si—O—Al and optionally Si—O—Si, obtaining (E) a condensate having constitutional units of Si—O—Al and/or Si—O—Si, obtained from aluminum derived from an aluminum alkoxide and a silane derived from a silane coupling agent having a mercapto group, from the (A) compound, the (B) aluminum alkoxide, the (C) silane coupling agent, (D) water, and (F) a chelating agent.

4. The curing method according to claim 2, wherein the step 1 is a step of obtaining (E) a sol by performing a reaction among the (A) compound, the (B) aluminum alkoxide, the (C) silane coupling agent, (D) water, and (F) a chelating agent.

5. The curing method according to claim 1, wherein the step 2 is a step of performing a reaction among the (E) condensate, the (H) compound having two or more polymerizable unsaturated groups, (I) filler, and (J) a compound having two or more epoxy groups under the conditions of irradiation with light or heating in the presence of the (A) compound.

6. The curing method according to claim 2, wherein the step 2 is a step of obtaining a cured product from the (E) sol, the (H) compound having two or more polymerizable unsaturated groups, (I) filler, and (J) a compound having two or more epoxy groups by irradiation with light or heating in the presence of the (A) compound.

7. The curing method according to claim 1, wherein the (A) compound is represented by the general formula [1],

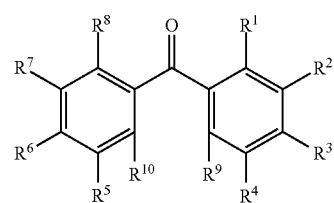

in the formula [1], $R^1$ to $R^8$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, a nitro group, or a group represented by the general formula [2], $R^9$ and $R^{10}$ each independently represent a hydrogen atom, an alkyl group having 1 to 12 carbon atoms, an aryl group having 6 to 14 carbon atoms, an arylalkyl group having 7 to 15 carbon atoms, an alkoxy group having 1 to 12 carbon atoms, a halogen atom, or a nitro group, or $R^9$ and $R^{10}$ are bonded to each other through an oxygen atom, a sulfur atom, or a carbonyl group, provided that at least one of groups represented by $R^1$ to $R^8$ represents a group represented by the general formula [2], general formula [2]:

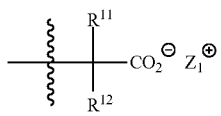
[2]

in the formula [2], $R^{11}$ and $R^{12}$ each independently represent a hydrogen atom, an alkyl group having 1 to 6 carbon atoms, or a hydroxyalkyl group having 1 to 6 carbon atoms and $Z_1^+$ represents an amidinium cation, a guanidinium cation, or a biguanidinium cation.

8. The curing method according to claim 1, wherein the (B) aluminum alkoxide is represented by the general formula [6], $$Al(OR^{32})_3 \quad [6]$$

in the formula [6], three $R^{32}$'s each independently represent a hydrogen atom or an alkyl group having 1 to 4 carbon atoms, provided that at least one of groups represented by $R^{32}$ represents an alkyl group having 1 to 4 carbon atoms.

9. The curing method according to claim 1, wherein the (B) aluminum alkoxide is aluminum tri-sec-butoxide.

10. The curing method according to claim 1 or 2, wherein the (C) silane coupling agent is represented by the general formula [7], $$(R^{33})_3Si-R^{34} \quad [7]$$

in the formula [7], three $R^{33}$'s each independently represent an alkyl group having 1 to 4 carbon atoms or an alkoxy group having 1 to 4 carbon atoms, $R^{34}$ represents an alkyl group having 1 to 8 carbon atoms, which has at least one mercapto group, provided that at least one of groups represented by $R^{33}$ represents an alkoxy group having 1 to 4 carbon atoms.

11. The curing method according to claim 1, wherein the (C) silane coupling agent is selected from (3-mercaptopropyl)trimethoxysilane, (3-mercaptopropyl)triethoxysilane, and 3-mercaptopropyl(dimethoxy)methylsilane.

12. The curing method according to claim 1, wherein a ratio of the molar ratios of the (B) aluminum alkoxide and the (C) silane coupling agent is 1:10 to 9:1.

13. The curing method according to claim 3, wherein the (F) chelating agent is selected from methyl acetoacetate, ethyl acetoacetate, dimethyl malonate, diethyl malonate, 2-(2-thioxanthenyl)diethyl malonic acid, acetylacetone, diacetone alcohol, and ethyl lactate.

14. The curing method according to claim 1, wherein (I) filler is thermally conductive filler.

15. The curing method according to claim 14, wherein the thermally conductive filler is aluminum nitride.

16. A curable resin composition comprising:
(A) a compound that is formed of a salt of a carboxylic acid and an amine and has a carbonyl group generating a radical and a carboxylate group generating a base through decarboxylation by irradiation with light or heating;
(B) an aluminum alkoxide;
(C) a silane coupling agent having a mercapto group;
(H) a compound having two or more polymerizable unsaturated groups; and
(I) filler.

17. A curable resin composition comprising:
(A) a compound that is formed of a salt of a carboxylic acid and an amine and has a carbonyl group generating a radical and a carboxylate group generating a base through decarboxylation by irradiation with light or heating;
(E) a condensate having constitutional units of Si—O—Al and optionally Si—O—Si, obtained from aluminum derived from an aluminum alkoxide and a silane derived from a silane coupling agent having a mercapto group;
(H) a compound having two or more polymerizable unsaturated groups; and
(I) filler.

18. The resin composition according to claim 16, further comprising: (J) a compound having two or more epoxy groups.

19. A thermally conductive substrate for forming an electronic circuit, comprising:
a cured product obtained from the curable resin composition according to claim 16.

20. A method for preparing a thermally conductive substrate for forming an electronic circuit, comprising:
applying the curable resin composition according to claim 16 onto a metal substrate to obtain a coating film; and then subjecting the coating film to irradiation with light or heating to cure the coating film, thereby forming a thermally conductive insulating film on the surface of the metal substrate.

* * * * *